(12) United States Patent
Shimizu et al.

(10) Patent No.: US 8,021,823 B2
(45) Date of Patent: Sep. 20, 2011

(54) POSITIVE RESIST COMPOSITION, METHOD OF FORMING RESIST PATTERN, AND POLYMERIC COMPOUND

(75) Inventors: Hiroaki Shimizu, Kawasaki (JP); Tsuyoshi Nakamura, Kawasaki (JP); Takahiro Dazai, Kawasaki (JP); Daiju Shiono, Kawasaki (JP); Tomoyuki Hirano, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 226 days.

(21) Appl. No.: 12/372,964

(22) Filed: Feb. 18, 2009

(65) Prior Publication Data

US 2009/0214982 A1 Aug. 27, 2009

(30) Foreign Application Priority Data

Feb. 22, 2008 (JP) ................. 2008-041092

(51) Int. Cl.
*G03F 7/039* (2006.01)
*G03F 7/20* (2006.01)
*G03F 7/30* (2006.01)

(52) U.S. Cl. ............... 430/270.1; 430/326; 430/910; 430/921; 430/922; 430/923; 430/924; 430/925

(58) Field of Classification Search .................. None
See application file for complete search history.

(56) References Cited

U.S. PATENT DOCUMENTS

| | | | |
|---|---|---|---|
| 5,945,517 | A | 8/1999 | Nitta et al. |
| 6,153,733 | A | 11/2000 | Yukawa et al. |
| 6,242,153 | B1 | 6/2001 | Sato et al. |
| 7,074,543 | B2 | 7/2006 | Iwai et al. |
| 7,323,287 | B2 | 1/2008 | Iwai et al. |
| 2005/0130058 | A1 | 6/2005 | Rahman |
| 2005/0260525 | A1 | 11/2005 | Takemoto et al. |
| 2005/0266351 | A1 | 12/2005 | Takemoto et al. |
| 2008/0248421 | A1 | 10/2008 | Fukuhara et al. |

FOREIGN PATENT DOCUMENTS

| | | |
|---|---|---|
| JP | H09-208554 | 8/1997 |
| JP | H11-035551 | 2/1999 |
| JP | H11-035552 | 2/1999 |
| JP | H11-035573 | 2/1999 |
| JP | 11 218924 A | 8/1999 |
| JP | H11-322707 | 11/1999 |
| JP | 2003-241385 | 8/2003 |
| JP | A-2009-062414 | 3/2009 |
| KR | 10-1998-080792 | 11/1998 |
| WO | WO 2004-074242 | 9/2004 |

OTHER PUBLICATIONS

Takemoto et al., "Tailoring thermal property of ArF resists resins through monomer structure modification for sub-70 nm contact hole application by reflow process". Proceedings of SPIE, vol. 5753, Sep. 14, 2005, pp. 584-591.
The Extended European Search Report issued in corresponding European Patent Application No. 09153291.1, dated Jun. 15, 2009.
Office Action cited in related U.S. Appl. No. 12/425,706 dated May 23, 2011.
Decision for Grant of Patent cited in corresponding KR Application No. 10-2009-0013006 dated Jun. 28,2011.

*Primary Examiner* — Sin J. Lee
(74) *Attorney, Agent, or Firm* — Knobbe Martens Olson & Bear LLP

(57) ABSTRACT

There is provided a positive resist composition, including a base component (A) which exhibits increased solubility in an alkali developing solution under action of an acid, and an acid generator component (B) which generates an acid upon exposure, wherein the base component (A) includes a polymeric compound (A1) containing a structural unit (a0) represented by the general formula (a0-1) shown below:

[Chemical Formula 1]

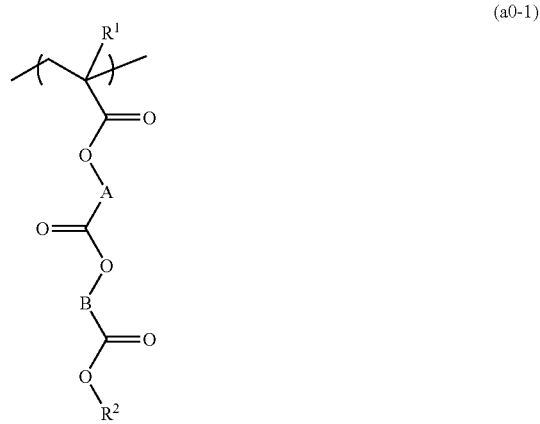

(a0-1)

(wherein, $R^1$ represents a hydrogen atom, a lower alkyl group or a halogenated lower alkyl group; A represents a bivalent linking group; B represents a bivalent linking group; and $R^2$ represents an acid dissociable, dissolution inhibiting group).

6 Claims, No Drawings

POSITIVE RESIST COMPOSITION, METHOD OF FORMING RESIST PATTERN, AND POLYMERIC COMPOUND

TECHNICAL FIELD

The present invention relates to a novel polymeric compound which can be used as a base component of a positive resist composition, a positive resist composition containing the polymeric compound, and a method of forming a resist pattern using the positive resist composition.

The application claims priority from Japanese Patent Application No. 2008-041092 filed on Feb. 22, 2008, the disclosure of which is incorporated by reference herein.

BACKGROUND ART

Lithography techniques include processes in which, for example, a resist film formed from a resist material is formed on top of a substrate, the resist film is selectively exposed with irradiation such as light, an electron beam or the like through a mask in which a predetermined pattern has been formed, and then a developing treatment is conducted, thereby forming a resist pattern of a prescribed shape in the resist film.

Resist materials in which the exposed portions change to become soluble in a developing liquid are termed positive materials, whereas resist materials in which the exposed portions change to become insoluble in the developing liquid are termed negative materials.

In recent years, in the production of semiconductor elements and liquid crystal display elements, advances in lithography techniques have led to rapid progress in the field of miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are starting to be introduced in mass production of semiconductor elements. Furthermore, research is also being conducted into lithography techniques that use $F_2$ excimer lasers, electron beams (EB), extreme ultraviolet radiation (EUV) and X-rays.

Resist materials are required to have lithography properties such as high sensitivity to the aforementioned light source and enough resolution to reproduce patterns with very fine dimensions.

As resist materials which fulfill the aforementioned requirements, there is used a chemically-amplified resist containing a base resin that displays changed solubility in an alkali developing solution under action of an acid, and an acid generator that generates an acid upon exposure.

For example, as the chemically-amplified positive resist composition, a composition containing a resin component (a base resin) that exhibits increased solubility in an alkali developing solution under action of an acid and an acid generator component is commonly used. If the resist film formed from the resist composition is selectively exposed during formation of a resist pattern, then within the exposed portions, an acid is generated from the acid generator, and the action of this acid causes an increase in the solubility of the resin component in an alkali developing solution, making the exposed portions soluble in the alkali developing solution.

Resins (acrylic resins) that contain structural units derived from (meth)acrylate esters within the main chain are now widely used as base resins for resists that use ArF excimer laser lithography, as they exhibit excellent transparency in the vicinity of 193 nm (for example, see Patent Document 1).

Here, the term "(meth)acrylic acid" is a generic term that includes either or both of the acrylic acid having a hydrogen atom bonded to the α-position and the methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

[Patent Document 1] Japanese Unexamined Patent Application, First Publication No. 2003-241385.

DISCLOSURE OF THE INVENTION

Problems to be Solved by the Invention

The demand for a novel material which can be used for lithography has been increased, since it is expected that lithography technology will further make progress and the field of application will be broadened.

The present invention takes the above circumstances into consideration, with an object of providing a novel polymeric compound which can be used as a base component of a positive resist composition, a positive resist composition containing the polymeric compound, and a method of forming a resist pattern using the positive resist composition.

Means for Solving the Problems

To achieve the above object, the present invention employs the following constitutions.

A first aspect of the present invention is a positive resist composition including a base component (A) which exhibits increased solubility in an alkali developing solution under action of an acid, and an acid generator component (B) which generates an acid upon exposure, wherein the base component (A) includes a polymeric compound (A1) containing a structural unit (a0) represented by the general formula (a0-1) shown below.

[Chemical Formula 1]

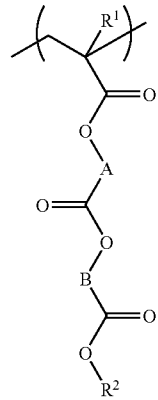

(a0-1)

(In the formula, $R^1$ represents a hydrogen atom, a lower alkyl group or a halogenated lower alkyl group; A represents a bivalent linking group; B represents a bivalent linking group; and $R^2$ represents an acid dissociable, dissolution inhibiting group.)

A second aspect of the present invention is a method of forming a resist pattern which includes: forming a resist film on a substrate using a positive resist composition described in the first aspect of the present invention; conducting exposure of the resist film; and developing the resist film with an alkali to form a resist pattern.

A third aspect of the present invention is a polymeric compound containing a structural unit (a0) represented by the general formula (0-1) shown below.

[Chemical Formula 2]

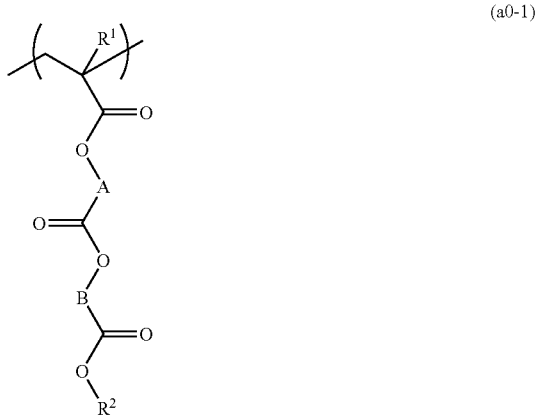

(a0-1)

(In the formula, $R^1$ represents a hydrogen atom, a lower alkyl group or a halogenated lower alkyl group; A represents a bivalent linking group; B represents a bivalent linking group; and $R^2$ represents an acid dissociable, dissolution inhibiting group.)

In the present specification and claims, the term "alkyl group" is a concept containing a linear, branched, and cyclic monovalent saturated hydrocarbon group, unless another specific definition is provided. Also, the term "alkylene group" is a concept containing a linear, branched, and cyclic bivalent saturated hydrocarbon group, unless another specific definition is provided.

The term "lower alkyl group" means an alkyl group of 1 to 5 carbon atoms.

The term "halogenated alkyl group" means a group in which a part or all of the hydrogen atoms in the alkyl group are substituted with halogen atoms, and examples of the halogen atom include a fluorine atom, a chlorine atom, a bromine atom, and an iodine atom.

The term "structural unit" means a monomer unit that contributes to the formation of a polymeric compound (polymer, copolymer).

The term "exposure" is used as a general concept involving irradiation with any form of radiation.

EFFECTS OF THE INVENTION

According to the present invention, there can be provided a novel polymeric compound which can be used as a base component of a positive resist composition, a positive resist composition containing the polymeric compound, and a method of forming a resist pattern using the positive resist composition.

BEST MODE FOR CARRYING OUT THE INVENTION

<<Positive Resist Composition>>

The positive resist composition of the present invention includes a base component (A) (hereinafter, referred to as component (A)) which exhibits increased solubility in an alkali developing solution under action of an acid, and an acid generator component (B) (hereinafter, referred to as component (B)) which generates an acid upon exposure. Here, the term "base component" means an organic compound which has film-forming performance.

In the positive resist composition, an acid is generated from the component (B) when exposure is conducted and, under action of the acid thus generated from the component (B), the component (A) exhibits increased solubility in an alkali developing solution. Therefore, in a resist pattern formation, when selective exposure is conducted on a resist film formed by using the positive resist composition, the exposed portions of the resist film increase solubility in an alkali developing solution, whereas the unexposed portions do not change solubility in an alkali developing solution. As a result, a resist pattern can be formed by a developing treatment with alkali.

<Component (A)>

The component (A) includes the polymeric compound (A1) containing the structural unit (a0) represented by the aforementioned general formula (a0-1).

In the formula (a0-1), $R^1$ represents a hydrogen atom, a lower alkyl group, or a halogenated lower alkyl group.

The lower alkyl group for $R^1$ is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group and a neopentyl group.

The halogenated lower alkyl group for $R^1$ is a group in which a part or all of the hydrogen atoms in the aforementioned lower alkyl group are substituted with halogen atoms. Examples of the halogen atom include a fluorine atom, a chlorine atom, an iodine atom, and a bromine atom. Of these, a fluorine atom is preferable.

$R^1$ is preferably a hydrogen atom, a lower alkyl group, or a fluorinated lower alkyl group, and most preferably a hydrogen atom or a methyl group in terms of industrial availability.

As the bivalent linking group for A, a bivalent hydrocarbon group which may contain a substituent group, and a bivalent group which contains a hetero atom can be used.

The expression that a hydrocarbon group "contains a substituent group" means that a part or all of the hydrogen atoms in the hydrocarbon group are substituted with groups or atoms other than hydrogen atoms.

The hydrocarbon group may be an aliphatic hydrocarbon group, or an aromatic hydrocarbon group.

The term "aliphatic" in the present claims and specification is a relative concept used in relation to the term "aromatic", and is defined as a group or compound that contains no aromaticity. The aliphatic hydrocarbon group means a hydrocarbon group which contains no aromaticity.

The aliphatic hydrocarbon group in A may be saturated or unsaturated, and is preferably saturated.

Specific examples of the aliphatic hydrocarbon group include a linear or branched aliphatic hydrocarbon group, and an aliphatic hydrocarbon group including a ring in the structure.

The linear or branched aliphatic hydrocarbon group preferably has 1 to 10 carbon atoms, more preferably 1 to 8 carbon atoms, still more preferably 1 to 5 carbon atoms, and most preferably 1 or 2 carbon atoms.

As the linear aliphatic hydrocarbon group, a linear alkylene group is preferable, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

As the branched aliphatic hydrocarbon group, a branched alkylene group is preferable, and specific examples thereof include alkylalkylene groups such as alkylmethylene groups (for example, —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, or —$C(CH_2CH_3)_2$—); alkylethylene groups (for example, —$CH(CH_3)CH_2$—, —$CH(CH_3)CH(CH_3)$—, —$C(CH_3)_2CH_2$—, —$CH(CH_2CH_3)CH_2$—, or —$CH(CH_2CH_3)CH_2$—); alkyltrimethylene groups (for example, —$CH(CH_3)CH_2CH_2$— or —$CH_2CH(CH_3)CH_2$—); and alkyltetramethylene groups (for example, —$CH(CH_3)CH_2CH_2CH_2$— or —$CH_2CH(CH_3)CH_2CH_2$—). The alkyl group in the alkylalkylene group is preferably a linear alkyl group of 1 to 5 carbon atoms.

The chain-like aliphatic hydrocarbon group may or may not contain a substituent group. Examples of the substituent group include a fluorine atom, a fluorinated lower alkyl group of 1 to 5 carbon atoms, and an oxygen atom (═O).

Examples of the aliphatic hydrocarbon group including a ring include a cyclic aliphatic hydrocarbon group (a group in which two hydrogen atoms have been removed from an aliphatic hydrocarbon ring); and a group in which the cyclic aliphatic hydrocarbon group is bonded at the terminal of the aforementioned chain-like aliphatic hydrocarbon group or allocated in the middle of the aforementioned chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be a polycyclic group or a monocyclic group. The monocyclic group is preferably a group in which two hydrogen atoms have been removed from a monocycloalkane of 3 to 6 carbon atoms, and examples of the monocycloalkane include cyclopentane and cyclohexane.

The polycyclic group is preferably a group in which two hydrogen atoms have been removed from a polycycloalkane of 7 to 12 carbon atoms, and examples of the polycycloalkane include adamantane, norbornane, isobornane, tricyclodecane, and tetracyclododecane.

The cyclic aliphatic hydrocarbon group may or may not contain a substituent group. Examples of substituent groups include a lower alkyl group of 1 to 5 carbon atoms, a fluorine atom, a fluorinated lower alkyl group of 1 to 5 carbon atoms, and an oxygen atom (═O).

The term "hetero atom" in the bivalent group which contains a hetero atom means an atom other than a carbon atom and a hydrogen atom, and examples thereof include an oxygen atom, a nitrogen atom, a sulfur atom, and a halogen atom.

Examples of the bivalent group which contains a hetero atom include the groups —O—, —C(═O)—, —C(═O)—O—, —NH—, —$NR^{04}$— (wherein, $R^{04}$ represents an alkyl group), —NH—C(═O)—, and ═N—; and a combined group of at least one of these groups with the aforementioned bivalent hydrocarbon group.

A is preferably a bivalent hydrocarbon group which may contain a substituent group, more preferably a linear aliphatic hydrocarbon group, and still more preferably a linear alkylene group. Of these, A is particularly preferably a linear alkylene group of 1 to 5 carbon atoms, and most preferably a methylene group or an ethylene group.

Examples of the bivalent linking group for B include the same bivalent linking groups as those described above for A.

B is preferably a bivalent hydrocarbon group which may contain a substituent group, more preferably a linear aliphatic hydrocarbon group, and still more preferably a linear alkylene group. Of these, B is particularly preferably a linear alkylene group of 1 to 5 carbon atoms, and most preferably a methylene group or an ethylene group.

$R^2$ represents an acid dissociable, dissolution inhibiting group. The acid dissociable, dissolution inhibiting group is a group which, when the polymeric compound (A1) is blended to a positive resist composition together with the acid generator component (B), exhibits acid dissociability and dissociates under action of the acid generated from the acid generator component (B) upon exposure but, prior to this dissociation, makes the entire polymer compound (A1) substantially insoluble in alkali developing solutions.

As the acid dissociable, dissolution inhibiting group for $R^2$, any of the groups that have been proposed as acid dissociable, dissolution inhibiting groups for the base resins of chemically amplified resists can be used. Generally, groups that form either a cyclic or chain-like tertiary alkyl ester with the carboxyl group of the (meth)acrylic acid; and acetal-type acid dissociable, dissolution inhibiting groups such as alkoxyalkyl groups are widely known. Here, the term "(meth)acrylate ester" is a generic term that includes either or both of the acrylate ester having a hydrogen atom bonded to the α-position and the methacrylate ester having a methyl group bonded to the α-position.

Here, the term "tertiary alkyl ester" means a structure in which an ester is formed by substituting the hydrogen atom of a carboxyl group with a chain-like or cyclic alkyl group, and a tertiary carbon atom within the chain-like or cyclic alkyl group is bonded to the oxygen atom at the terminal of the carbonyloxy group (—C(O)—O—). In the tertiary alkyl ester, the bond of the oxygen atom with the tertiary carbon atom is cleaved by the action of an acid.

Here, the aforementioned chain-like or cyclic alkyl group may contain a substituent group.

Hereinafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of the tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

The term "aliphatic branched" means a branched structure having no aromaticity.

The "aliphatic branched, acid dissociable, dissolution inhibiting group" is not limited to groups (hydrocarbon groups) composed of carbon atoms and hydrogen atoms, and is preferably a hydrocarbon group. Also, the hydrocarbon group may be saturated or unsaturated, and is typically preferably saturated.

As the aliphatic branched, acid dissociable, dissolution inhibiting group, a group represented by the formula "—$C(R^{71})(R^{72})(R^{73})$", can be used. In the formula, $R^{71}$ to $R^{73}$ each independently represents a linear alkyl group of 1 to 5 carbon atoms. The group represented by the formula "—$C(R^{71})(R^{72})(R^{73})$", preferably has 4 to 8 carbon atoms, and examples thereof include a tert-butyl group, a tert-pentyl group, and a tert-heptyl group.

The term "aliphatic cyclic group (alicyclic group)" means a monocyclic or polycyclic group which has no aromaticity.

The aliphatic cyclic group may or may not contain a substituent group. Examples of substituent groups include a lower alkyl group of 1 to 5 carbon atoms, a fluorine atom, a fluorinated lower alkyl group of 1 to 5 carbon atoms, and an oxygen atom (=O).

The structure of the basic ring excluding the substituent group in the aliphatic cyclic group is not limited to groups (hydrocarbon groups) composed of carbon atoms and hydrogen atoms, and is preferably a hydrocarbon group. Further, the "hydrocarbon group" may be either saturated or unsaturated, and is typically preferably saturated.

The aliphatic cyclic group is preferably a polycylic group.

Examples of the aliphatic cyclic group include groups in which one or more hydrogen atoms have been removed from a monocycloalkane or a polycycloalkane such as a bicycloalkane, tricycloalkane or tetracycloalkane in which a lower alkyl group, a fluorine atom or a fluorinated lower alkyl group may or may not be included as a substituent group. Specific examples include groups in which at least one hydrogen atom has been removed from a monocycloalkane such as cyclopentane and cyclohexane; and groups in which at least one hydrogen atom has been removed from a polycycloalkane such as adamantane, norbornane, isobornane, dicyclodecane, tricyclodecane or tetracyclododecane.

Examples of the aliphatic cyclic group-containing acid dissociable, dissolution inhibiting groups include "(i) groups having a tertiary carbon atom within the ring structure of a monovalent aliphatic cyclic group"; and "(ii) groups having a monovalent aliphatic cyclic group, and a branched alkylene group containing a tertiary carbon atom bonded to the monovalent aliphatic cyclic group".

Specific examples of the "(i) groups having a tertiary carbon atom within the ring structure of a monovalent aliphatic cyclic group" include groups represented by the general formulae (1-1) to (1-9) shown below.

Specific examples of the "(ii) groups having a monovalent aliphatic cyclic group, and a branched alkylene group containing a tertiary carbon atom bonded to the monovalent aliphatic cyclic group" include groups represented by the general formulae (2-1) to (2-6) shown below.

[Chemical Formula 3]

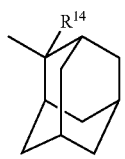

(1-1)

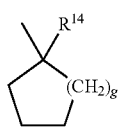

(1-2)

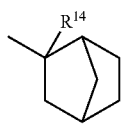

(1-3)

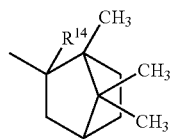

(1-4)

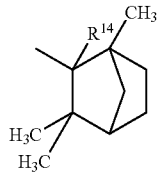

(1-5)

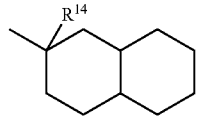

(1-6)

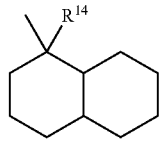

(1-7)

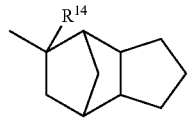

(1-8)

(1-9)

(In the formulae, $R^{14}$ represents a lower alkyl group, and g represents an integer of 0 to 8.)

[Chemical Formula 4]

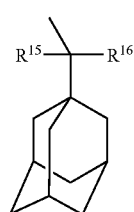

(2-1)

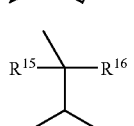

(2-2)

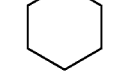

(2-3)

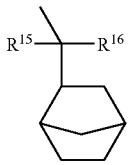

(2-4)

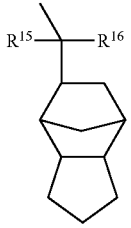

(2-5)

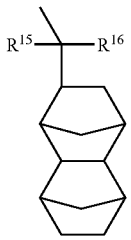

(2-6)

(In the formulae, $R^{15}$ and $R^{16}$ each independently represents an alkyl group.)

The alkyl group for $R^{14}$ to $R^{16}$ is preferably a lower alkyl group, and more preferably a linear or branched alkyl group. Specific examples thereof include a methyl group, an ethyl group, a propyl group, an isopropyl group, an n-butyl group, an isobutyl group, a tert-butyl group, a pentyl group, an isopentyl group, and a neopentyl group. Of these, a methyl group, an ethyl group or an n-butyl group is preferable, and a methyl group or an ethyl group is more preferable.

g is preferably an integer of 0 to 3, more preferably an integer of 1 to 3, and still more preferably 1 or 2.

The "acetal-type acid dissociable, dissolution inhibiting group" is generally substituted for a hydrogen atom at the terminal of an alkali-soluble group such as a carboxy group or a hydroxyl group, so as to be bonded with the oxygen atom. When an acid is generated upon exposure, the generated acid acts to break the bond between the acetal-type acid dissociable, dissolution inhibiting group and the oxygen atom with which the acetal-type, acid dissociable, dissolution inhibiting group is bonded.

Examples of the acetal-type acid dissociable, dissolution inhibiting group include groups represented by the general formula (p1) shown below.

[Chemical Formula 5]

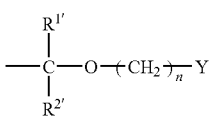

(p1)

(In the formula, $R^{1\prime}$ and $R^{2\prime}$ each independently represents a hydrogen atom or a lower alkyl group; n represents an integer of 0 to 3; and Y represents a lower alkyl group or an aliphatic cyclic group.)

In the above formula, n is preferably an integer of 0 to 2, more preferably 0 or 1, and most preferably 0.

As the lower alkyl group for $R^{1\prime}$ and $R^{2\prime}$, the same lower alkyl groups as those described above for R can be used. As the lower alkyl group for $R^{1\prime}$ or $R^{2\prime}$, a methyl group or an ethyl group is preferable, and a methyl group is most preferable.

In the present invention, at least one of $R^{1\prime}$ and $R^{2\prime}$ is preferably a hydrogen atom. That is, it is preferable that the acid dissociable, dissolution inhibiting group (p1) be a group represented by the general formula (p1-1) shown below.

[Chemical Formula 6]

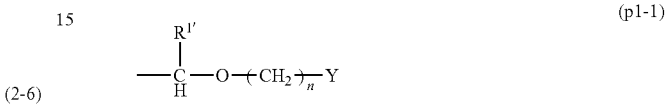

(p1-1)

(In the formula, $R^{1\prime}$, N, and Y are as defined above.)

As the lower alkyl group for Y, the same lower alkyl groups as those described above for R can be used.

As the aliphatic cyclic group for Y, any of the aliphatic monocyclic or polycyclic groups which have been proposed for conventional ArF resists and the like can be used by being appropriately selected. For example, the same groups as those described above in the "aliphatic cyclic group" can be used.

Further, as the acetal-type, acid dissociable, dissolution inhibiting group, groups represented by the general formula (p2) shown below can also be used.

[Chemical Formula 7]

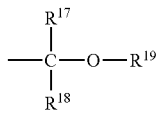

(p2)

(In the formula, $R^{17}$ and $R^{18}$ each independently represents a linear or branched alkyl group or a hydrogen atom; and $R^{19}$ represents a linear, branched or cyclic alkyl group. Alternately, $R^{17}$ and $R^{19}$ may each represent independently a linear or branched alkylene group, wherein the terminal of $R^{17}$ is bonded with the terminal of $R^{19}$ to form a ring.)

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly preferable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, $R^{19}$ is preferably an alkyl group of 1 to 5 carbon atoms, more preferably an ethyl group or methyl group, and most preferably an ethyl group.

When $R^{19}$ represents a cyclic alkyl group, $R^{19}$ preferably has 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane or a polycycloalkane such as a bicycloalkane, tricycloalkane or tetracycloalkane, wherein a fluorine atom or a fluorinated alkyl group may or may not be included as a substituent group. Specific examples thereof include groups in which one or more hydrogen atoms have been removed from a monocycloalkane such as cyclopentane and cyclohexane, and a polycycloalkane such as adamantane, norbornane, isobornane, tricyclodecane, and tetracyclododecane. Of these, a group in which one or more hydrogen atoms have been removed from adamantane is preferable.

Also, in the general formula (p2), $R^{17}$ and $R^{19}$ may each represent independently a linear or branched alkylene group (and preferably an alkylene group of 1 to 5 carbon atoms), wherein the terminal of $R^{19}$ is bonded with the terminal of $R^{17}$.

In this case, a cyclic group is formed by $R^{17}$, $R^{19}$, the oxygen atom with which $R^{19}$ is bonded, and the carbon atom with which the oxygen atom and $R^{17}$ are bonded. Such a cyclic group is preferably a 4- to 7-membered ring, and more preferably a 4- to 6-membered ring. Specific examples of the cyclic group include a tetrahydropyranyl group and a tetrahydrofuranyl group.

Specific examples of the acetal-type acid dissociable, dissolution inhibiting group include groups represented by the formulae (3-1) to (3-12) shown below.

[Chemical Formula 8]

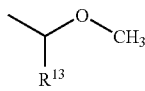
(3-1)

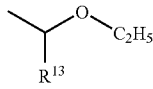
(3-2)

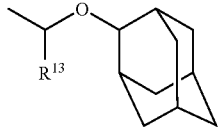
(3-3)

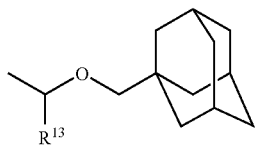
(3-4)

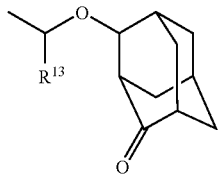
(3-5)

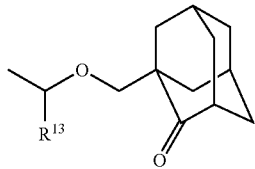
(3-6)

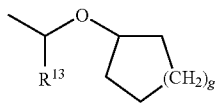
(3-7)

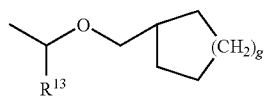
(3-8)

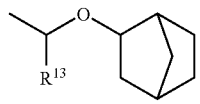
(3-9)

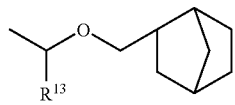
(3-10)

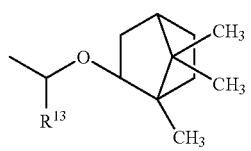
(3-11)

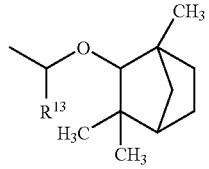
(3-12)

(In the formulae, $R^{13}$ represents a hydrogen atom or a methyl group; and g is as defined above.)

In the present invention, $R^2$ is preferably a tertiary alkyl ester-type acid dissociable, dissolution inhibiting group, more preferably the aforementioned "(i) group having a tertiary carbon atom within the ring structure of a monovalent aliphatic cyclic group", and still more preferably a group represented by the general formula (1-1).

The structural unit (a0-1) is particularly preferably a structural unit represented by the general formula (a0-1-1) or (a0-1-1-2) shown below.

[Chemical Formula 9]

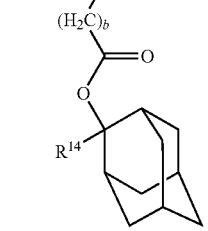
(a0-1-1)

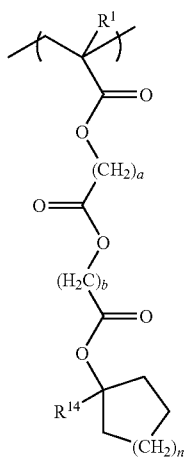

(a0-1-2)

(In the formulae, $R^1$ and $R^{14}$ are as defined above; a represents an integer of 1 to 10; b represents an integer of 1 to 10; and n represents an integer of 0 to 3.)

a is preferably an integer of 1 to 5, and most preferably 1 or 2.

b is preferably an integer of 1 to 5, and most preferably 1 or 2.

n is preferably 1 or 2.

The structural unit (a0) included in the polymeric compound (A1) may be one type, or two or more types.

The polymeric compound (A1) may be a polymer consisting of the structural unit (a0), or a copolymer containing other structural units as well as the structural unit (a0).

The proportion of the structural unit (a0) within the polymeric compound (A1) is preferably within the range where the total proportion of the structural unit (a0) and the structural unit (a1) described below (if the polymeric compound (A1) does not include the structural unit (a1), the proportion of the structural unit (a0)) is 10 to 80 mol %, more preferably 20 to 70 mol %, and most preferably 25 to 50 mol %, based on the combined total of all the structural units that constitute the polymeric compound (A1). When this proportion is not less than the lower limit within the above range, then a pattern can be easily formed using a positive resist composition which includes the structural unit (a0), whereas when the proportion is not more than the upper limit within the above range, a good quantitative balance with the other structural units can be attained.

Particularly, the proportion of the structural unit (a0) is preferably 10 mol % or more, and more preferably 20 mol % or more, based on the combined total of all the structural units that constitute the polymeric compound (A1), because the positive resist composition including the polymeric compound (A1) can improve dissolution contrast and lithography properties such as resolution, pattern shape, and line edge roughness.

If the polymeric compound (A1) of the present invention is a copolymer containing structural units other than the structural unit (a0), there is no particular limitation on the structural units other than the structural unit (a0), and any of the structural units used in a base resin for a chemically-amplified resist may be arbitrarily used.

Suitable examples of the structural unit include a structural unit derived from an acrylate ester such as the following structural units (a1) to (a3).

Of these, the polymeric compound (A1) preferably further contains the structural unit (a2) in addition to the structural unit (a0).

Also, the polymer compound (A1) preferably further contains the structural unit (a3), in addition to the structural unit (a0) or the structural units (a0) and (a2).

Here, the term "structural unit derived from an acrylate ester" in the present specification and claims means a structural unit formed by cleavage of the ethylenic double bond of an acrylate ester.

The term "acrylate ester" is a concept containing an acrylate ester in which a hydrogen atom is bonded to the carbon atom at the α-position, and an α-substituted acrylate ester in which a hydrogen atom bonded to the carbon atom at the α-position is substituted with another substituent group (an atom or group other than a hydrogen atom). Examples of the substituent group include a lower alkyl group and a halogenated lower alkyl group. The term "α-position (carbon atom at the α-position)" in a structural unit derived from an acrylate ester means the carbon atom to which a carbonyl group is bonded, if not otherwise specified.

In the acrylate ester, examples of the lower alkyl group and halogenated lower alkyl group for the substituent group bonded to the α-position include the same as the lower alkyl group and halogenated lower alkyl group described above for $R^1$.

The atom or group bonded to the α-position of the acrylate ester is preferably a hydrogen atom, a lower alkyl group, or a halogenated lower alkyl group, more preferably a hydrogen atom, a lower alkyl group, or a fluorinated lower alkyl group, and most preferably a hydrogen atom or a methyl group in terms of industrial availability.

<Structural Unit (a2)>

Structural unit (a2) is a structural unit derived from an acrylate ester which has a lactone-containing cyclic group.

Here, the term "lactone-containing cyclic group" means a cyclic group containing a single ring (lactone ring) which has a "—O—C(O)—" structure. This lactone ring is counted as the first ring, and groups that contain only the lactone ring are referred to as monocyclic groups, whereas groups that also contain other ring structures are described as polycyclic groups regardless of the structure of the other rings.

When the component (A1) is used to form a resist film, the lactone-containing cyclic group of the structural unit (a2) is effective at improving the adhesion between the resist film and a substrate, and improving compatibility with the aqueous developing solution.

The structural unit (a2) can be used arbitrarily without any particular restriction.

Specific examples of the lactone-containing monocyclic group include a group in which one hydrogen atom is eliminated from γ-butyrolactone. Furthermore, specific examples of the lactone-containing polycyclic group include a group in which one hydrogen atom is eliminated from a bicycloalkane, a tricycloalkane, or a tetracycloalkane which contains a lactone ring.

Specific examples of the structural unit (a2) include structural units represented by the general formulae (a2-1) to (a2-5) shown below.

[Chemical Formula 10]

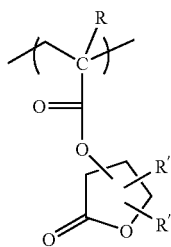
(a2-1)

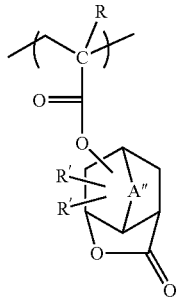
(a2-2)

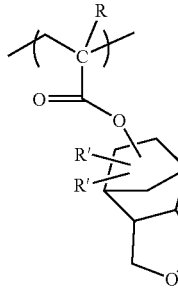
(a2-3)

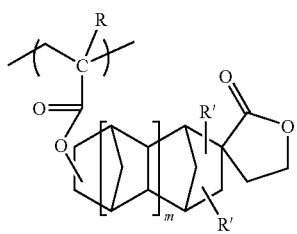
(a2-4)

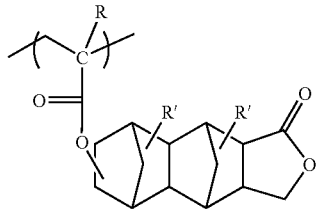
(a2-5)

(In the formulae, R represents a hydrogen atom, a lower alkyl group, or a halogenated lower alkyl group; R' represents a hydrogen atom, a lower alkyl group, an alkoxy group of 1 to 5 carbon atoms, or a group of —COOR", wherein R" represents a hydrogen atom, or a linear, branched, or cyclic alkyl group of 1 to 15 carbon atoms; m represents an integer of 0 or 1; and A" represents an alkylene group of 1 to 5 carbon atoms or an oxygen atom.)

R in the general formulae (a2-1) to (a2-5) is the same as $R^1$ described above in the structural unit (a0).

The lower alkyl group for R' is the same as the lower alkyl group for $R^1$.

In the case that R" is a linear or branched alkyl group, the number of carbon atoms is preferably 1 to 10, and more preferably 1 to 5.

In the case that R" is a cyclic alkyl group, the number of carbon atoms is preferably 3 to 15, more preferably 4 to 12, and most preferably 5 to 10. Examples of the cyclic alkyl group include groups in which one or more hydrogen atoms have been removed from a monocycloalkane or a polycycloalkane such as a bicycloalkane, tricycloalkane or tetracycloalkane, in which a fluorine atom or a fluorinated alkyl group may or may not be included as a substituent group. Specific examples thereof include groups in which one or more hydrogen atoms have been removed from a monocycloalkane such as cyclopentane and cyclohexane, and a polycycloalkane such as adamantane, norbornane, isobornane, tricyclodecane, and tetracyclododecane.

Specific examples of the alkylene group of 1 to 5 carbon atoms for A" include a methylene group, an ethylene group, an n-propylene group, and an isopropylene group.

In the general formulae (a2-1) to (a2-5), R' is preferably a hydrogen atom in terms of industrial availability.

In the formula (a2-1), there is no particular limitation on the bonding position of the oxygen atom (—O—) to the γ-butyrolactone ring, and the α-position or β-position is preferable.

Specific examples of the structural units represented by the general formulae (a2-1) to (a2-5) include the following.

[Chemical Formula 11]

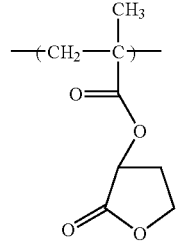
(a2-1-1)

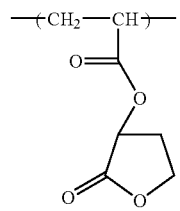
(a2-1-2)

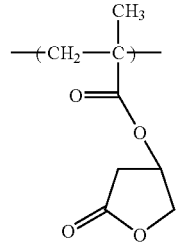
(a2-1-3)

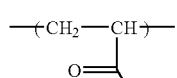 (a2-1-4)
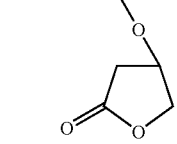 (a2-1-5)
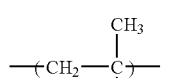 (a2-1-6)
[Chemical Formula 12]
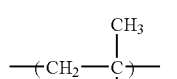 (a2-2-1)
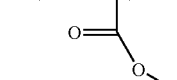 (a2-2-2)
 (a2-2-3)
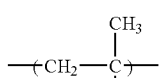 (a2-2-4)
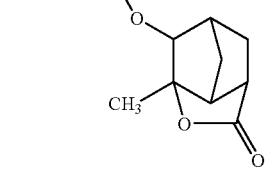
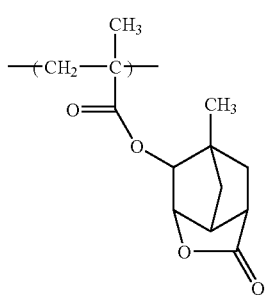 (a2-2-5)
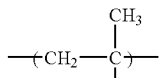 (a2-2-6)
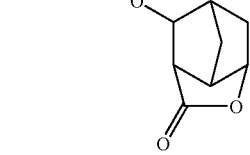
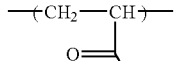 (a2-2-7)
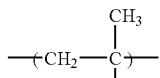 (a2-2-8)
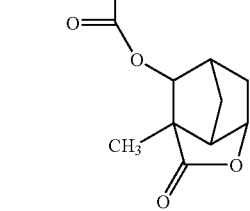

(a2-2-9)
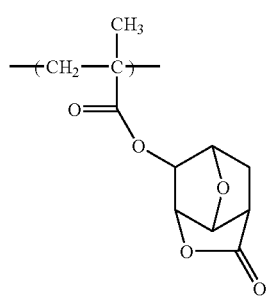
(a2-2-10)
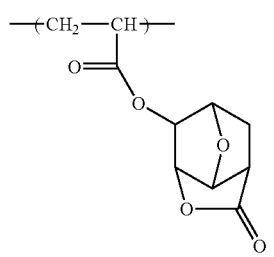
(a2-2-11)
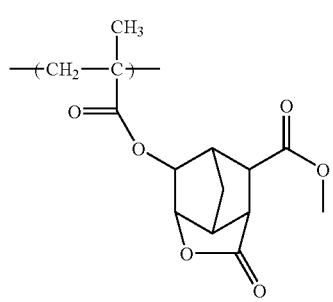
(a2-2-12)
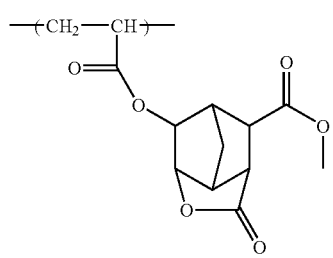
(a2-2-13)
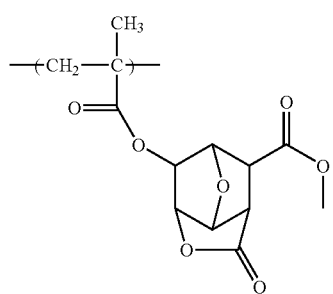
(a2-2-14)
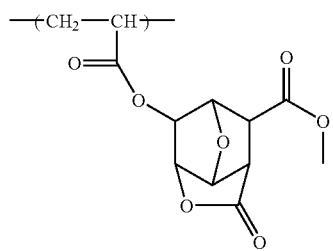
[Chemical Formula 13]
(a2-3-1)
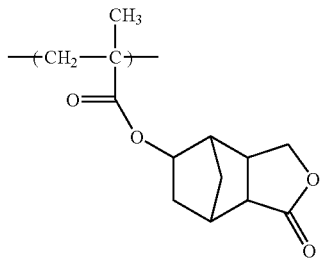
(a2-3-2)
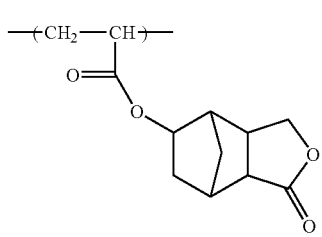
(a2-3-3)
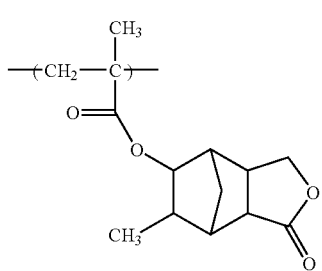
(a2-3-4)
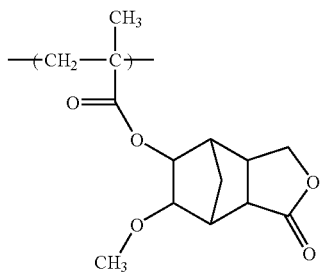
(a2-3-5)
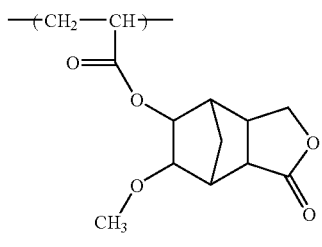
(a2-3-6)
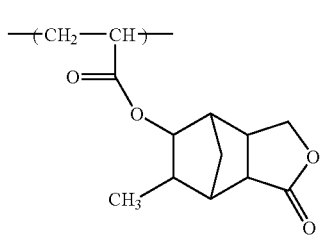

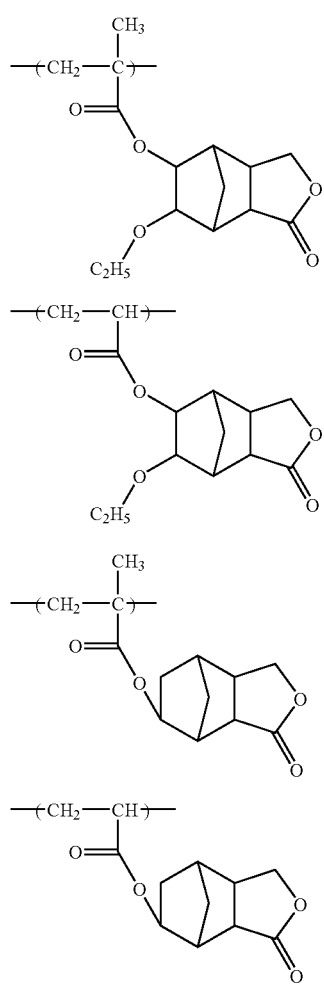
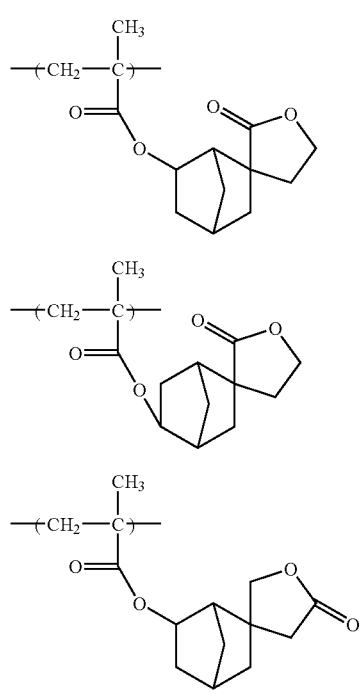
[Chemical Formula 14]
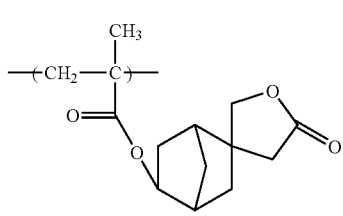
(a2-3-7)
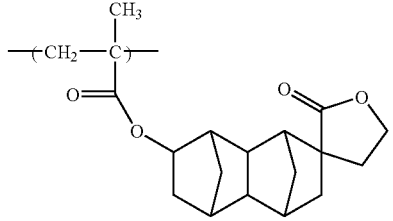
(a2-3-8)
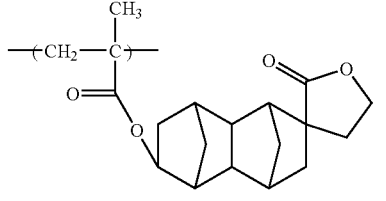
(a2-3-9)
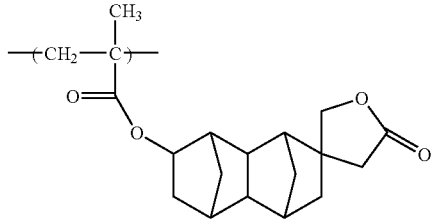
(a2-3-10)
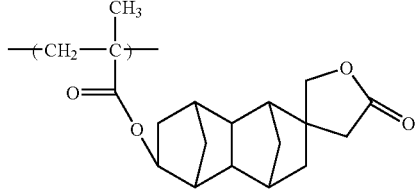
(a2-4-1)
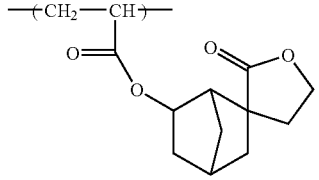
(a2-4-2)
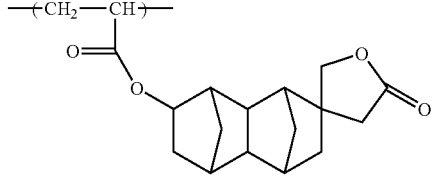
(a2-4-3)

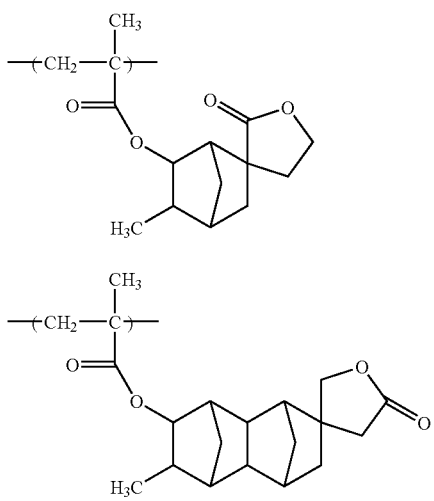

(a2-4-11)

(a2-4-12)

[Chemical Formula 15]

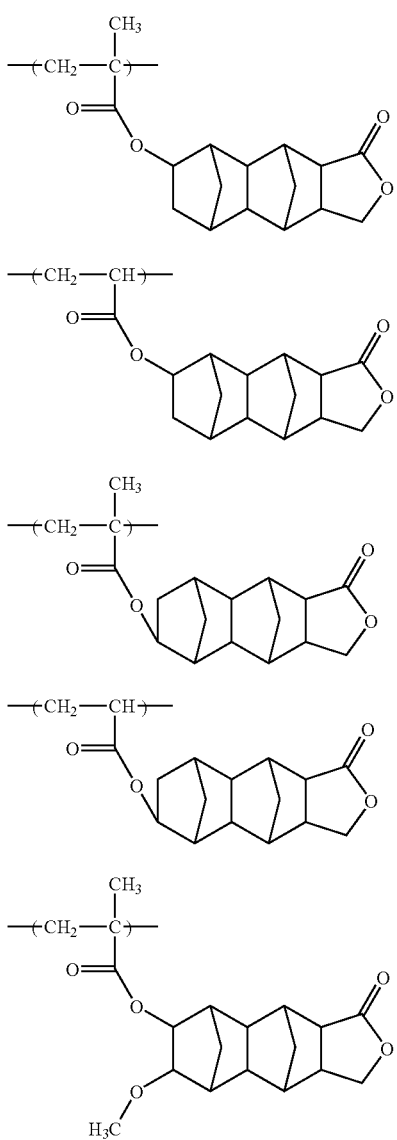

(a2-5-1)

(a2-5-2)

(a2-5-3)

(a2-5-4)

(a2-5-5)

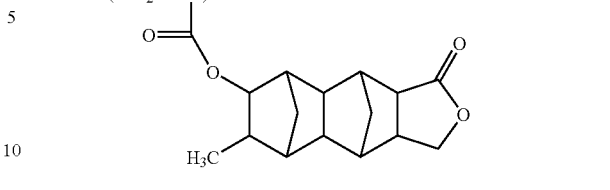

(a2-5-6)

The structural unit (a2) is preferably at least one kind selected from the group consisting of the structural units represented by the general formulae (a2-1) to (a2-5), and more preferably at least one kind selected from the group consisting of the structural units represented by the general formulae (a2-1) to (a2-3). Of these, at least one kind selected from the group consisting of the structural units represented by (a2-1-1), (a2-1-2), (a2-1-3), (a2-1-4), (a2-2-1), (a2-2-2), (a2-3-1), (a2-3-2), (a2-3-9) and (a2-3-10) is particularly preferable.

As the structural unit (a2), one type of structural unit may be used, or two or more types may be used in combination.

In the polymeric compound (A1), the proportion of the structural unit (a2) based on the combined total of all the structural units constituting the component (A1) is preferably 5 to 60 mol %, more preferably 10 to 55 mol %, and still more preferably 20 to 55 mol %. When this proportion is not less than the lower limit within the above range, then the effect made by containing the structural unit (a2) can be sufficiently obtained. When the proportion is not more than the upper limit within the above range, a good quantitative balance with the other structural units can be attained.

<Structural Unit (a3)>

Structural unit (a3) is a structural unit derived from an acrylate ester which has a polar group-containing aliphatic hydrocarbon group.

When the component (A1) includes the structural unit (a3), the hydrophilicity of the component (A1) is improved, and hence, the compatibility of the component (A1) with the developing solution is improved. As a result, the alkali solubility of the exposed portions improves, which contributes to favorable improvements in the resolution.

Examples of the polar group include a hydroxyl group, a cyano group, a carboxyl group, and a hydroxyalkyl group in which a part of the hydrogen atoms in an alkyl group is substituted with fluorine atoms. Of these, a hydroxyl group is particularly preferable.

Examples of the aliphatic hydrocarbon group include a linear or branched hydrocarbon group of 1 to 10 carbon atoms (preferably an alkylene group), and a polycyclic aliphatic hydrocarbon group (polycyclic group). The polycyclic group can be appropriately selected from the multitude of structural units proposed for the resins of resist compositions for ArF excimer lasers and the like. The polycyclic group preferably has 7 to 30 carbon atoms.

Of these, a structural unit derived from an acrylate ester having the polycyclic aliphatic group which contains a hydroxyl group, a cyano group, a carboxyl group, or a hydroxyalkyl group in which a part of the hydrogen atoms within an alkyl group has been substituted with fluorine atoms is more preferable. Examples of the polycyclic group include groups in which two or more hydrogen atoms have been removed from a bicycloalkane, a tricycloalkane, a tetracycloalkane, or the like. Specific examples include a group in which two or more hydrogen atoms have been removed from a polycycloalkane such as adamantane, norbornane, isobornane, tricyclodecane, or tetracyclododecane. Of these polycyclic groups, a group in which two or more hydrogen atoms have been removed from adamantane, norbornane, or tetracyclododecane is industrially preferable.

As the structural unit (a3), for example, a structural unit derived from a hydroxyethyl ester of acrylic acid is preferable, when the hydrocarbon group within the polar group-containing aliphatic hydrocarbon group is a linear or branched hydrocarbon group of 1 to 10 carbon atoms. On the other hand, a structural unit represented by a general formula (a3-1), (a3-2), or (a3-3) shown below is preferable, when the hydrocarbon group is a polycyclic group.

[Chemical Formula 16]

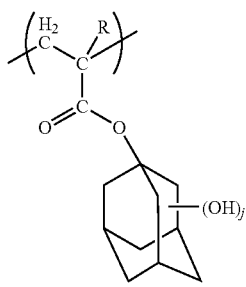
(a3-1)

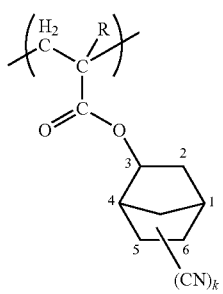
(a3-2)

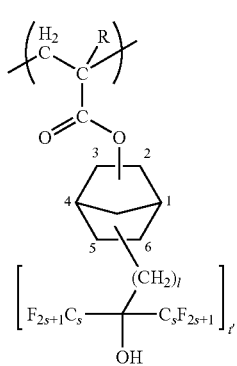
(a3-3)

(In the formulae, R is as defined above; j represents an integer of 1 to 3; k represents an integer of 1 to 3; t' represents an integer of 1 to 3; l represents an integer of 1 to 5; and s represents an integer of 1 to 3.)

In the general formula (a3-1), j is preferably 1 or 2, and more preferably 1. In the case that j is 2, a structural unit in which a hydroxyl group is bonded to the 3-position and 5-position of the adamantyl group is preferable. In the case that j is 1, a structural unit in which a hydroxyl group is bonded to the 3-position of the adamantyl group is preferable.

Of these, it is preferable that j be 1, and the hydroxyl group be bonded to the 3-position of the adamantyl group.

In the general formula (a3-2), k is preferably 1. In the general formula (a3-2), a cyano group is preferably bonded to the 5-position or 6-position of the norbornyl group.

In the general formula (a3-3), t' is preferably 1. l is preferably 1. s is preferably 1. Further, in the general formula (a3-3), it is preferable that a 2-norbonyl group or 3-norbonyl group be bonded at the terminal of the carboxy group of the acrylic acid. It is preferable that a fluorinated alkyl alcohol within the brackets [ ] in the formula (a3-3) be bonded to the 5-position or 6-position of the norbornyl group.

As the structural unit (a3), one type can be used alone, or two or more types can be used in combination.

In the polymeric compound (A1), the proportion of the structural unit (a3) is preferably 5 to 50 mol %, more preferably 5 to 40 mol %, and still more preferably 5 to 35 mol %, based on the combined total of all the structural units that constitute the polymeric compound (A1). When this proportion is not less than the lower limit within the above range, then the effect made by containing the structural unit (a3) can be sufficiently obtained, whereas when the proportion is not more than the upper limit within the above range, a good quantitative balance with the other components can be attained.

<Structural Unit (a1)>

The polymeric compound (A1) may contain a structural unit (a1) derived from an acrylate ester which has an acid dissociable, dissolution inhibiting group, which is different from the aforementioned structural unit (a0), as long as the effects of the present invention are not impaired.

As the acid dissociable, dissolution inhibiting group in the structural unit (a1), the same acid dissociable, dissolution inhibiting groups as those described above for $R^2$ can be used.

As the structural unit (a1), it is preferable to use at least one type selected from the group consisting of structural units represented by the general formula (a1-0-1) shown below and structural units represented by the general formula (a1-0-2) shown below.

[Chemical Formula 17]

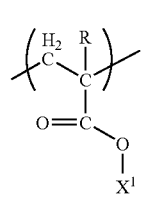
(a1-0-1)

(In the formula, R represents a hydrogen atom, a lower alkyl group or a halogenated lower alkyl group; and $X^1$ represents an acid dissociable, dissolution inhibiting group.)

[Chemical Formula 18]

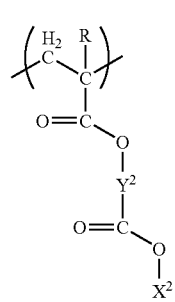
(a1-0-2)

(In the formula, R represents a hydrogen atom, a lower alkyl group or a halogenated lower alkyl group; $X^2$ represents an acid dissociable, dissolution inhibiting group; and $Y^2$ represents an alkylene group or an aliphatic cyclic group.)

In the general formula (a1-0-1), the lower alkyl group or halogenated lower alkyl group for R are the same as the lower alkyl group or halogenated lower alkyl group which can be bonded to the α-position of the acrylate ester described above.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In the general formula (a1-0-2), R is as defined above.

$X^2$ is the same as $X^1$ described above in the general formula (a1-0-1).

$Y^2$ is preferably an alkylene group of 1 to 10 carbon atoms or a bivalent aliphatic cyclic group. As the aliphatic cyclic group, the same aliphatic cyclic groups as those described above in the explanation of "aliphatic cyclic group" can be used, with the exception that two or more hydrogen atoms are removed.

When $Y^2$ represents an alkylene group of 1 to 10 carbon atoms, the alkylene group preferably has 1 to 6 carbon atoms, still more preferably 1 to 4 carbon atoms, and most preferably 1 to 3 carbon atoms.

When $Y^2$ represents a bivalent aliphatic cyclic group, it is particularly preferable that the bivalent aliphatic cyclic group be a group in which two or more hydrogen atoms have been removed from cyclopentane, cyclohexane, norbornane, isobornane, adamantane, tricyclodecane or tetracyclododecane.

Specific examples of the structural unit (a1) include structural units represented by the general formulae (a1-1) to (a1-4) shown below.

[Chemical Formula 19]

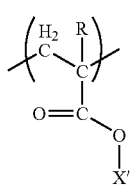
(a1-1)

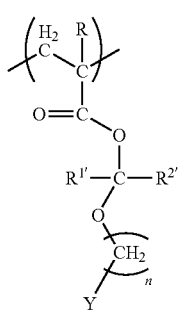
(a1-2)

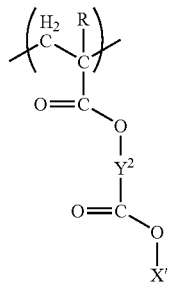
(a1-3)

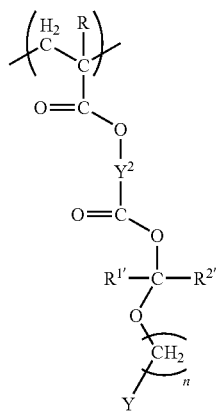
(a1-4)

(In the formulae, $X^1$ represents a tertiary alkyl ester-type acid dissociable, dissolution inhibiting group; Y represents a lower alkyl group of 1 to 5 carbon atoms or an aliphatic cyclic group; n represents an integer of 0 to 3; $Y^2$ is as defined above; R is as defined above; and $R^{1'}$ and $R^{2'}$ each independently represents a hydrogen atom or a lower alkyl group of 1 to 5 carbon atoms.)

In the above formulae, as X', the same tertiary alkyl ester-type acid dissociable, dissolution inhibiting group as those described above in $X^1$ can be used.

$R^{1'}$, $R^{2'}$, n, and Y are the same as $R^{1'}$, $R^{2'}$, n, and Y in the general formula (p1) described above in the explanation of "acetal-type acid dissociable, dissolution inhibiting group".

$Y^2$ is the same as $Y^2$ in the general formula (a1-0-2).

Specific examples of structural units represented by the general formulae (a1-1) to (a1-4) include the following.

[Chemical Formula 20]

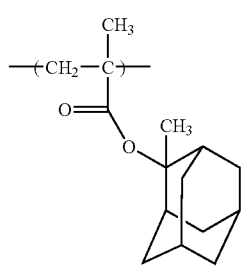
(a1-1-1)

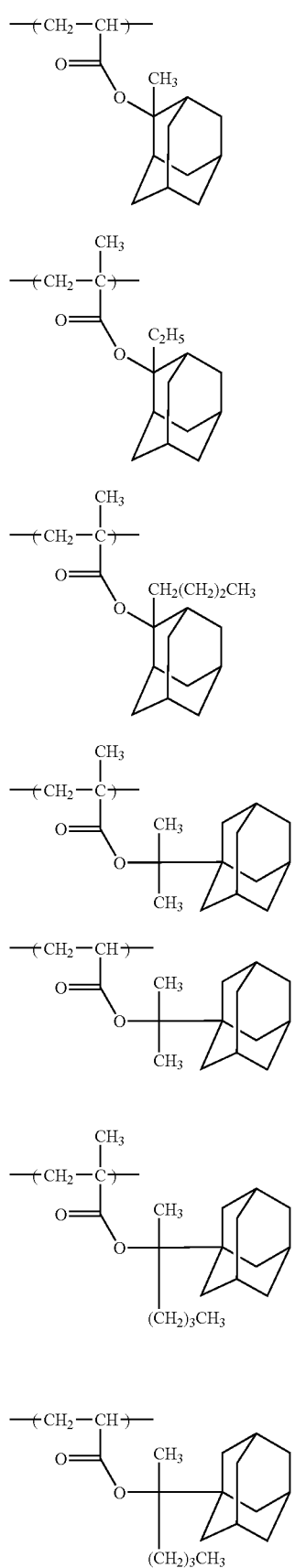
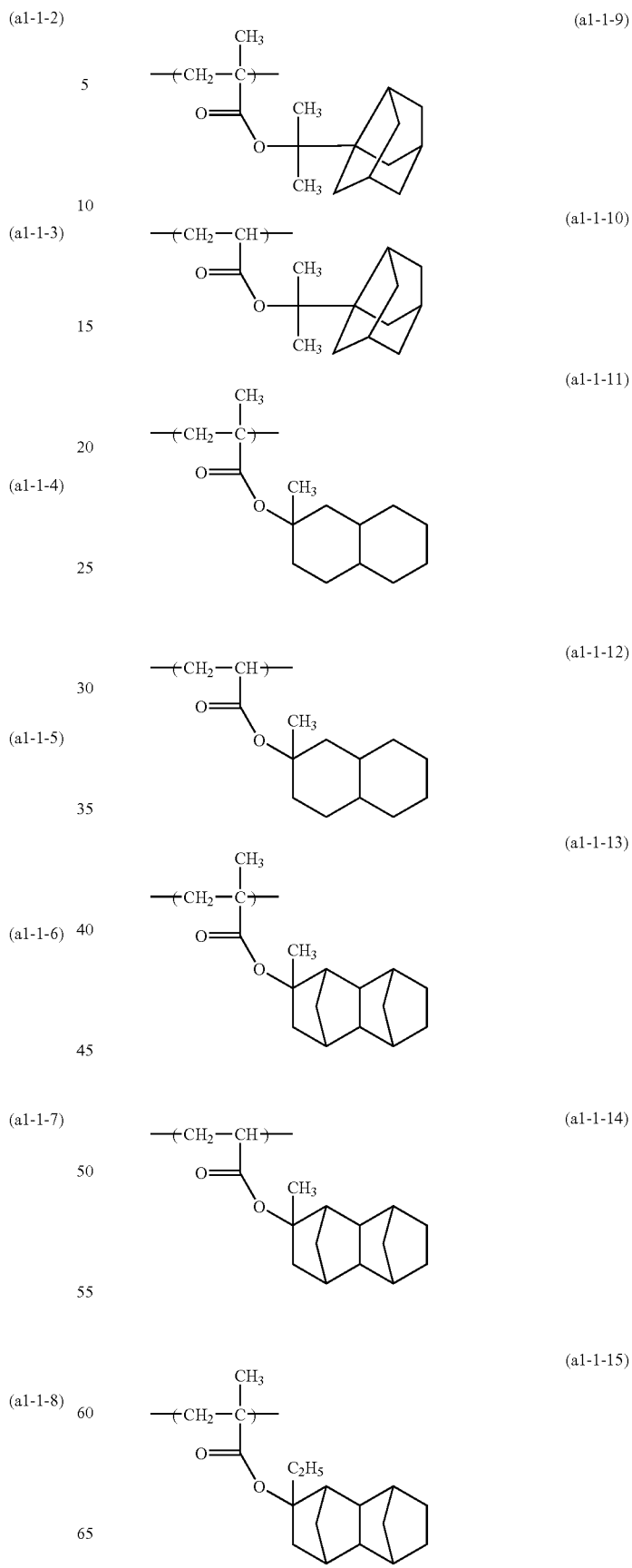

[Chemical Formula 21]
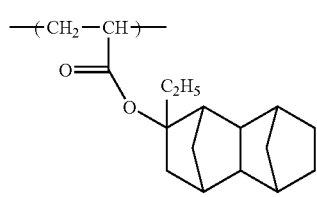 (a1-1-16)
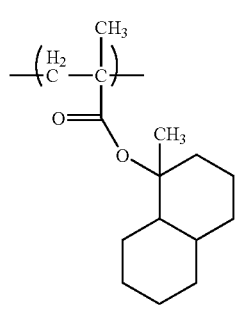 (a1-1-17)
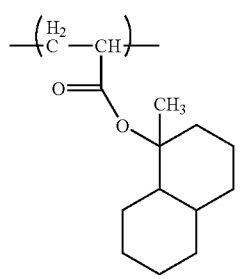 (a1-1-18)
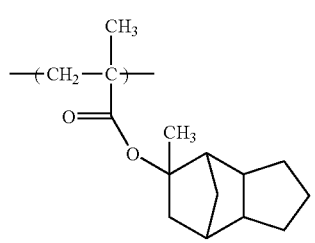 (a1-1-19)
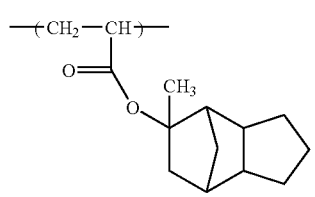 (a1-1-20)
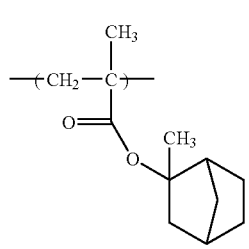 (a1-1-21)
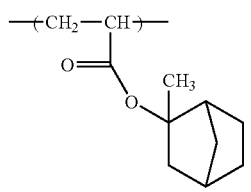 (a1-1-22)
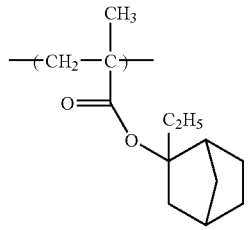 (a1-1-23)
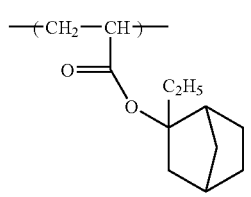 (a1-1-24)
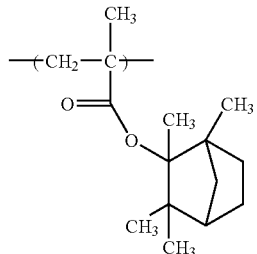 (a1-1-25)
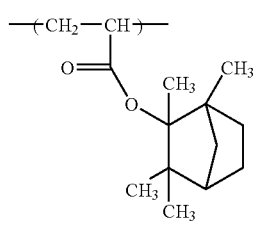 (a1-1-26)
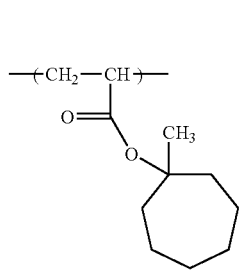 (a1-1-27)
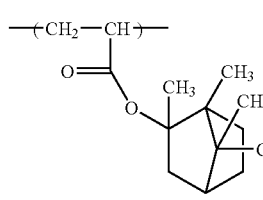 (a1-1-28)

(a1-1-29) 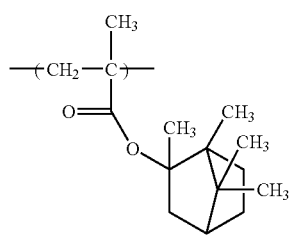
(a1-1-30) 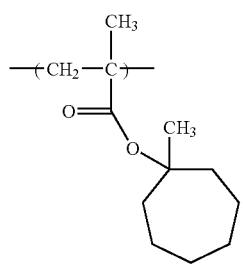
(a1-1-31) 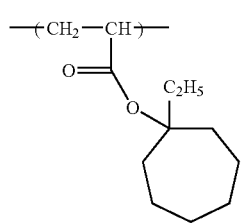
(a1-1-32) 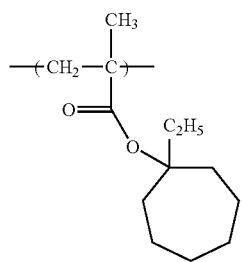
[Chemical Formula 22]
(a1-1-33) 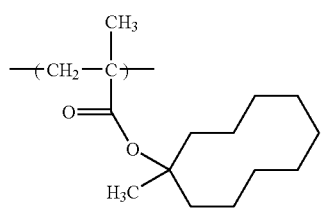
(a1-1-34) 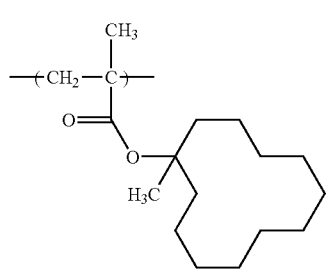
(a1-1-35) 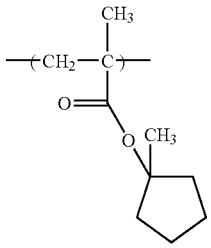
(a1-1-36) 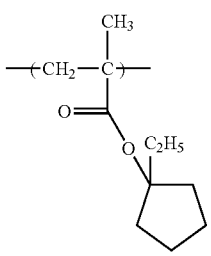
(a1-1-37) 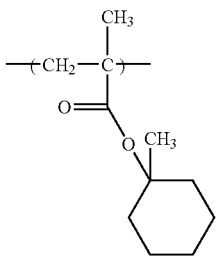
(a1-1-38) 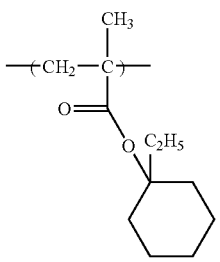
(a1-1-39) 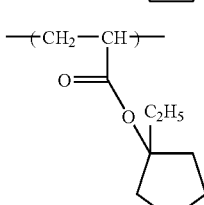
(a1-1-40) 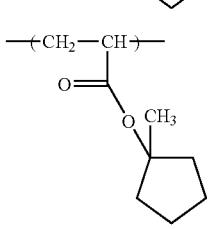
(a1-1-41)

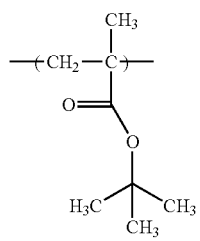 (a1-1-42)
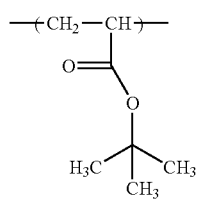 (a1-1-43)
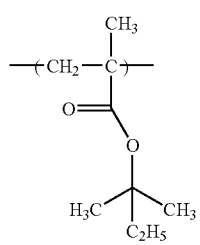 (a1-1-44)
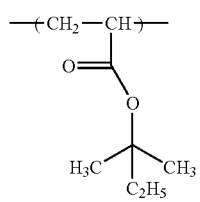 (a1-1-45)
[Chemical Formula 23]
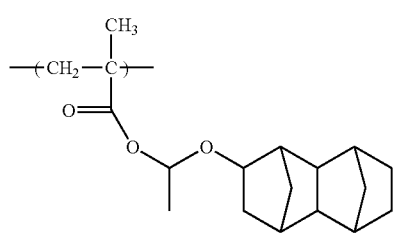 (a1-2-1)
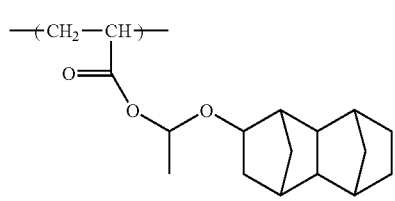 (a1-2-2)
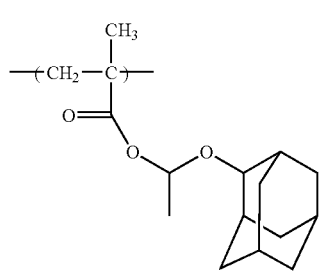 (a1-2-3)
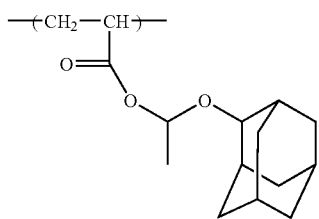 (a1-2-4)
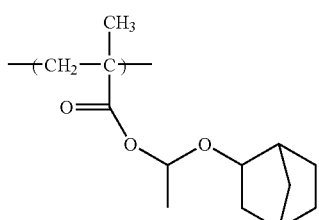 (a1-2-5)
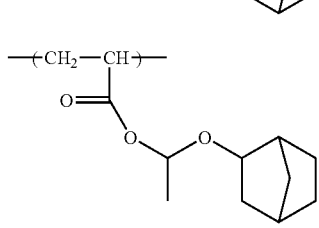 (a1-2-6)
[Chemical Formula 24]
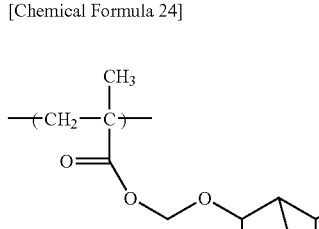 (a1-2-7)
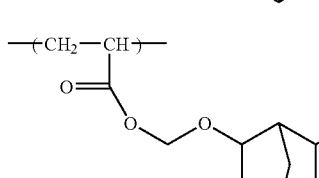 (a1-2-8)
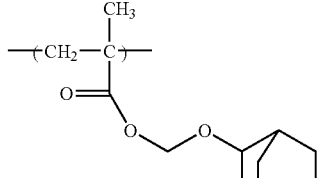 (a1-2-9)
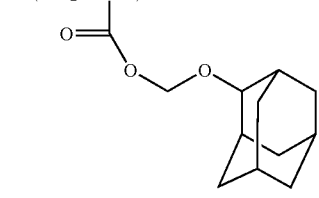 (a1-2-10)

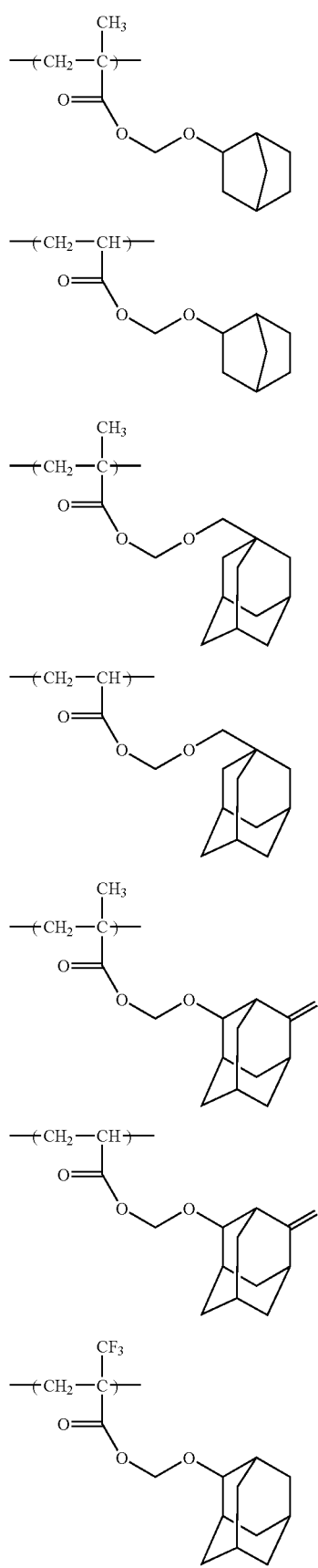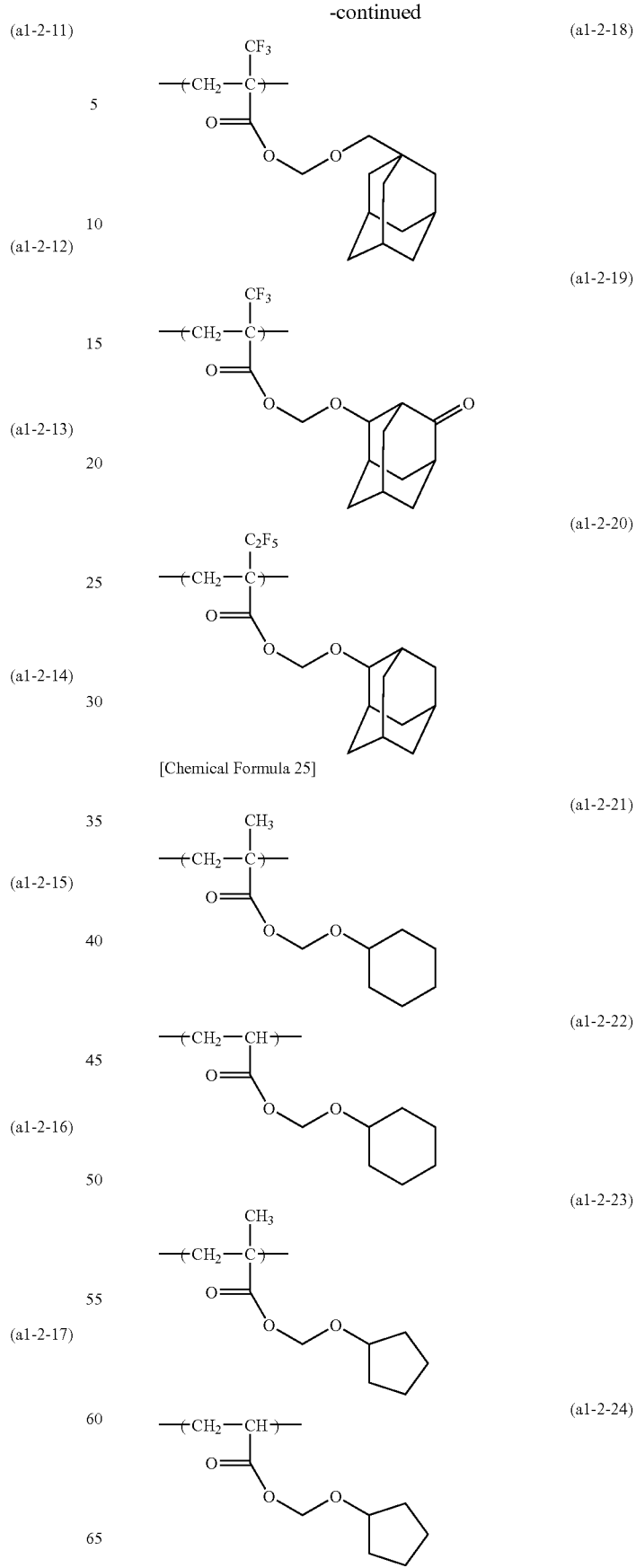

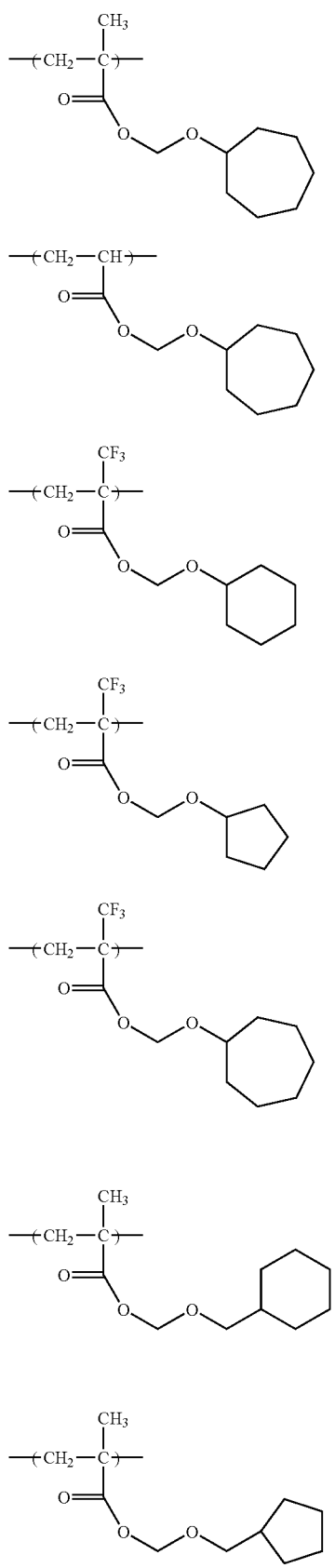
(a1-2-25)
(a1-2-26)
(a1-2-27)
(a1-2-28)
(a1-2-29)
(a1-2-30)
(a1-2-31)
[Chemical Formula 26]
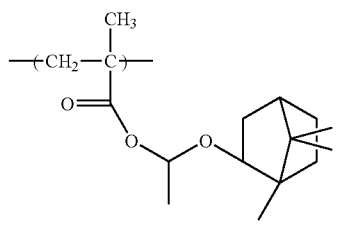
(a1-2-32)
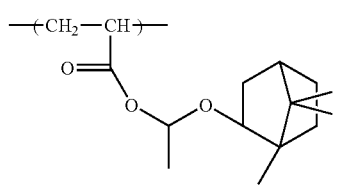
(a1-2-33)
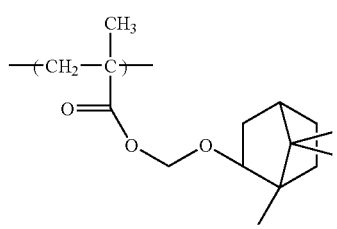
(a1-2-34)
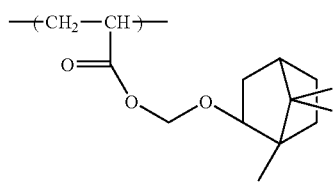
(a1-2-35)
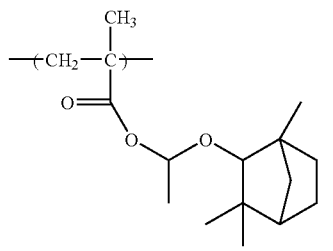
(a1-2-36)
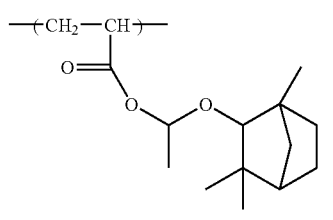
(a1-2-37)
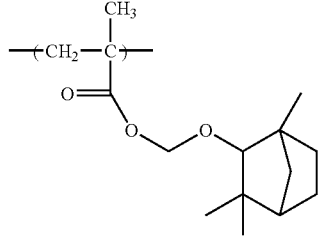
(a1-2-38)

41
-continued
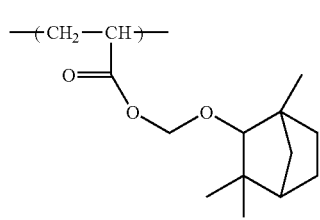
(a1-2-39)
[Chemical Formula 27]
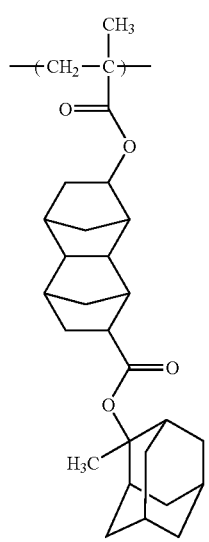
(a1-3-1)
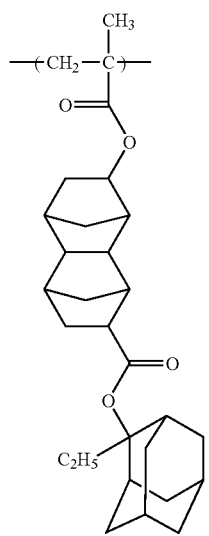
(a1-3-2)
42
-continued
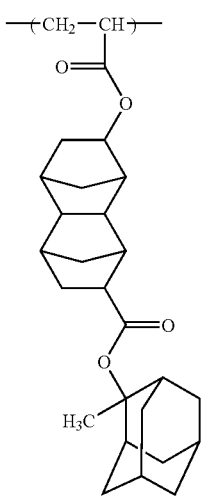
(a1-3-3)
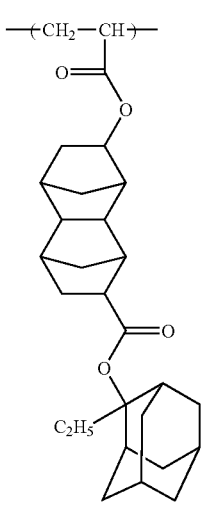
(a1-3-4)
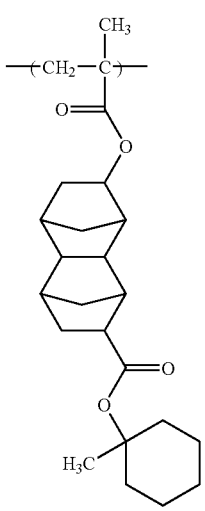
(a1-3-5)

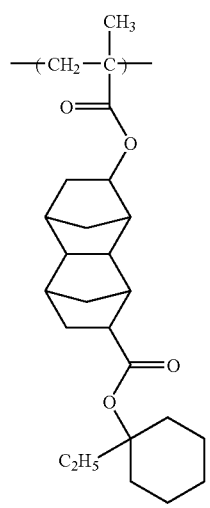
(a1-3-6)
(a1-3-7)
(a1-3-8)
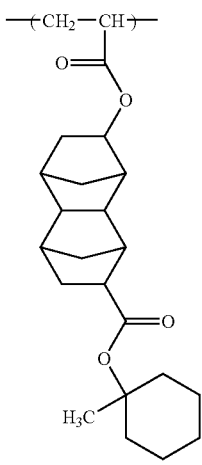
(a1-3-9)
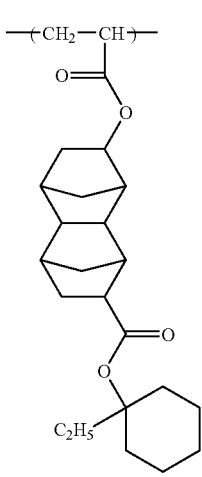
(a1-3-10)
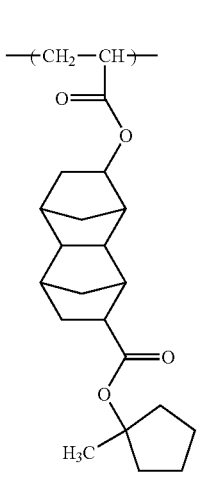
(a1-3-11)

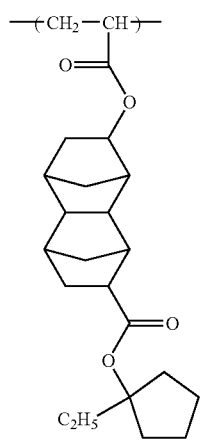 (a1-3-12)
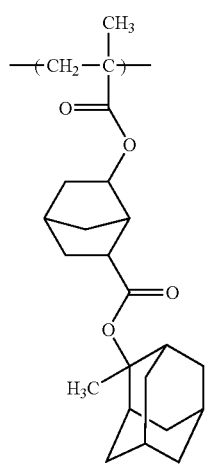 (a1-3-13)
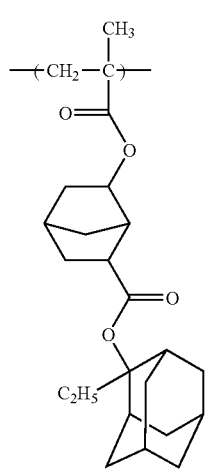 (a1-3-14)
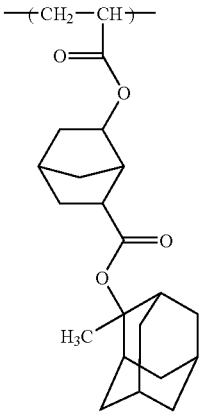 (a1-3-15)
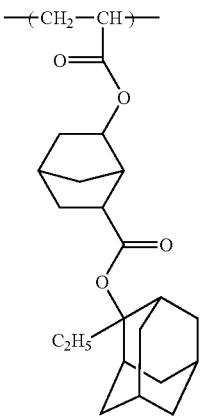 (a1-3-16)
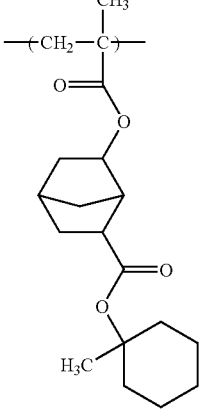 (a1-3-17)
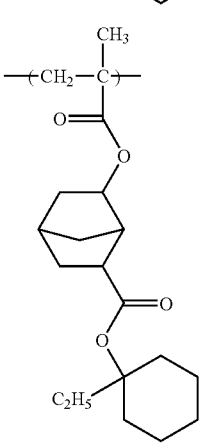 (a1-3-18)

[Chemical Formula 28]
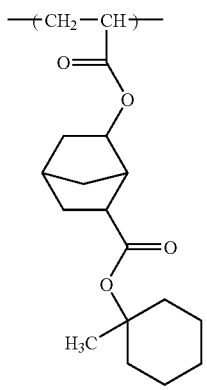 (a1-3-19)
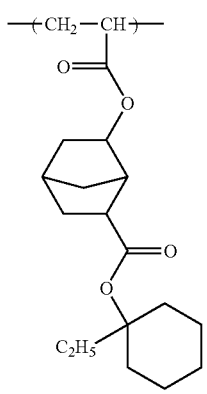 (a1-3-20)
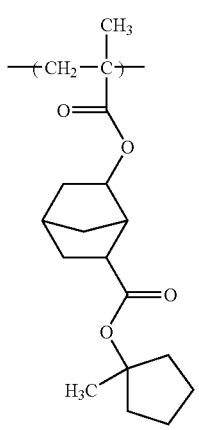 (a1-3-21)
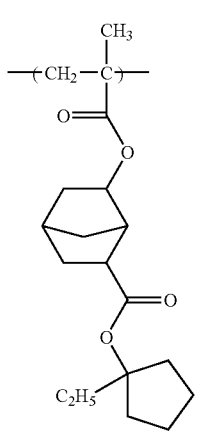 (a1-3-22)
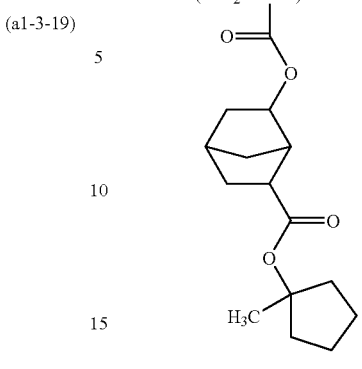 (a1-3-23)
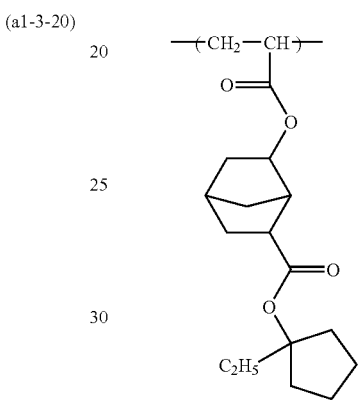 (a1-3-24)
[Chemical Formula 29]
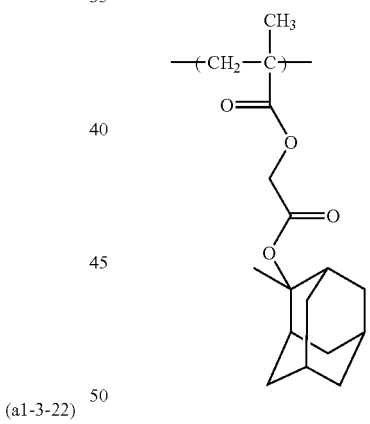 (a1-3-25)
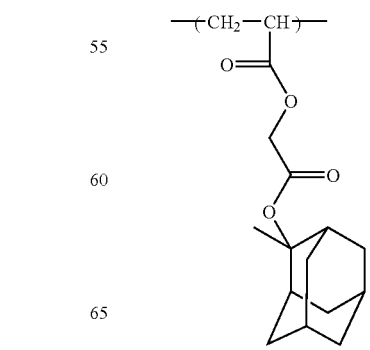 (a1-3-26)

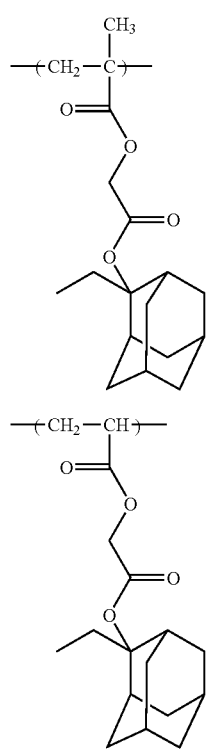 (a1-3-27)
(a1-3-28)
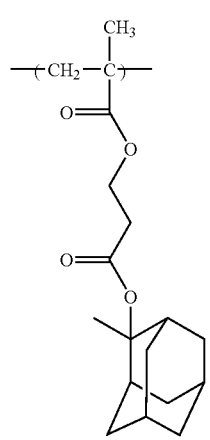 (a1-3-29)
(a1-3-30)
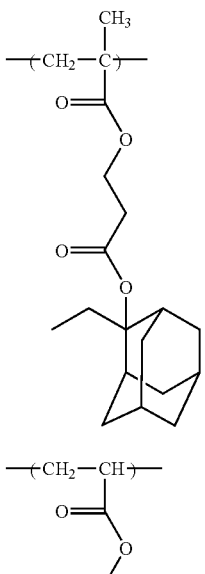 (a1-3-31)
(a1-3-32)
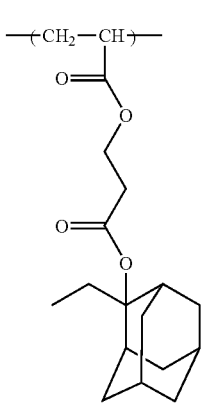 (a1-3-33)
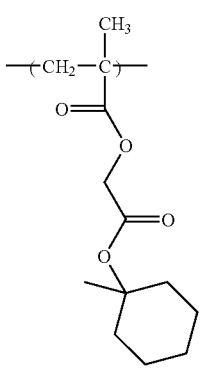 (a1-3-34)
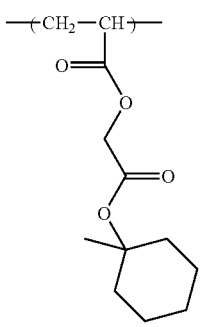

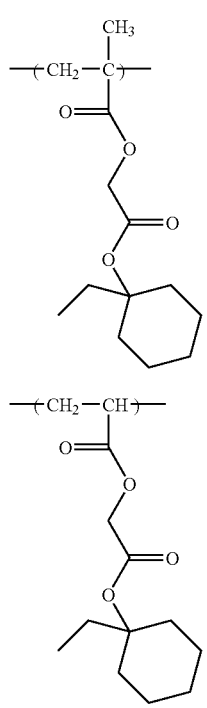 (a1-3-35)
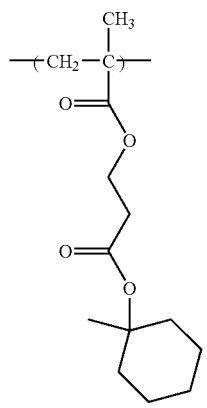 (a1-3-36)
[Chemical Formula 30]
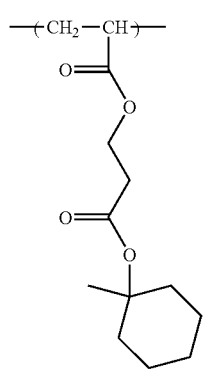 (a1-3-37)
(a1-3-38)
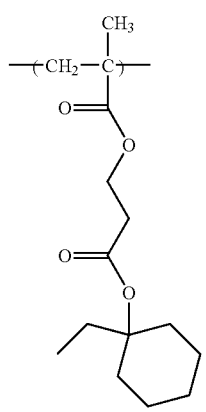 (a1-3-39)
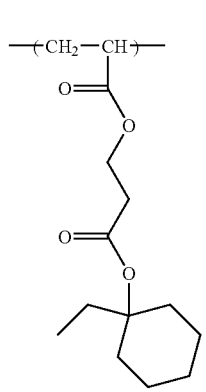 (a1-3-40)
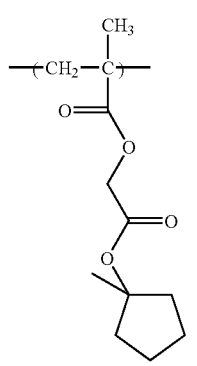 (a1-3-41)
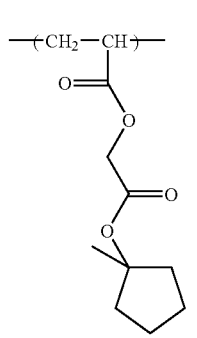 (a1-3-42)

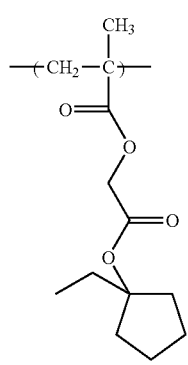 (a1-3-43)
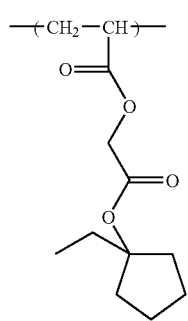 (a1-3-44)
(a1-3-45)
(a1-3-46)
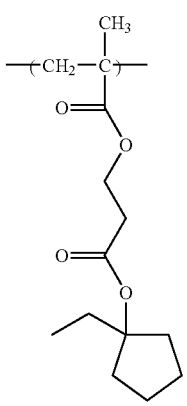 (a1-3-47)
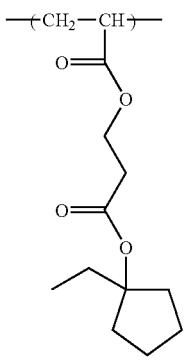 (a1-3-48)
[Chemical Formula 31]
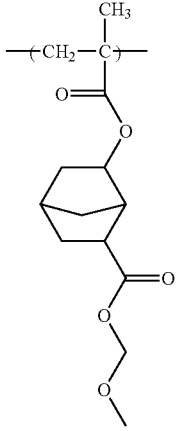 (a1-4-1)
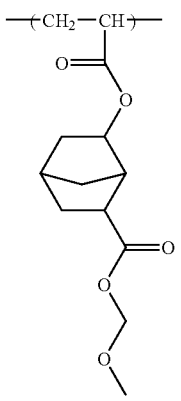 (a1-4-2)

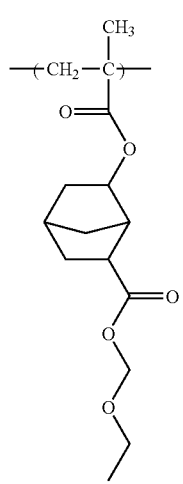
(a1-4-3)
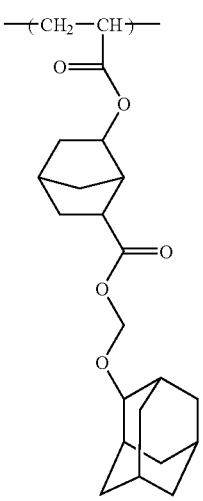
(a1-4-6)
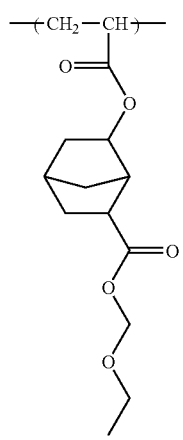
(a1-4-4)
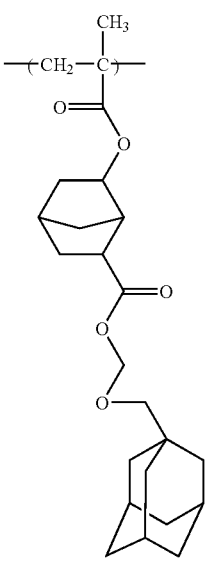
(a1-4-7)
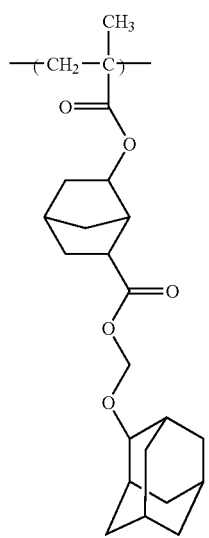
(a1-4-5)
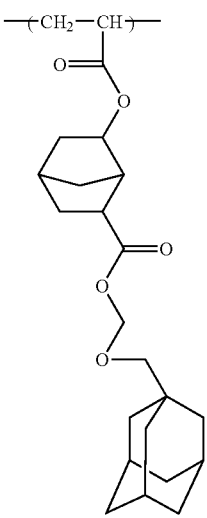
(a1-4-8)

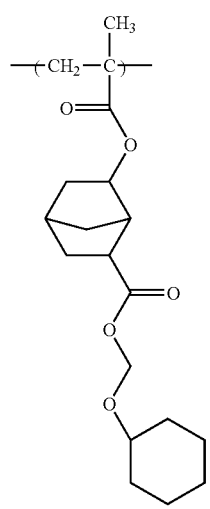 (a1-4-9)
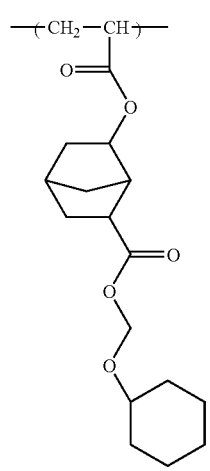 (a1-4-10)
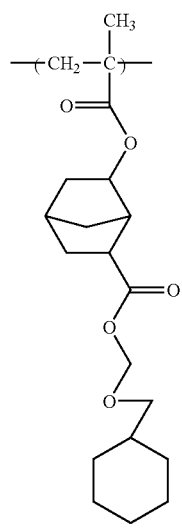 (a1-4-11)
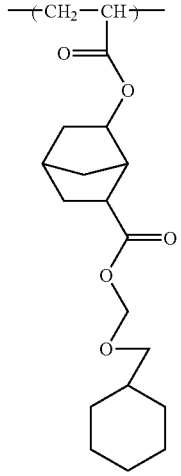 (a1-4-12)
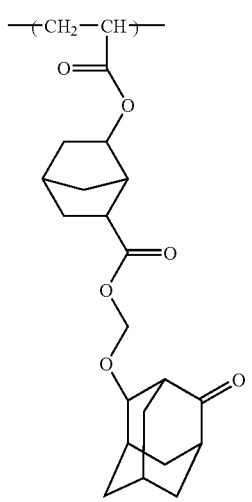 (a1-4-13)
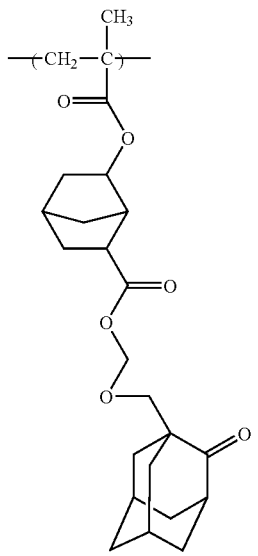 (a1-4-14)

[Chemical Formula 32]
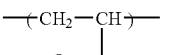 (a1-4-15)
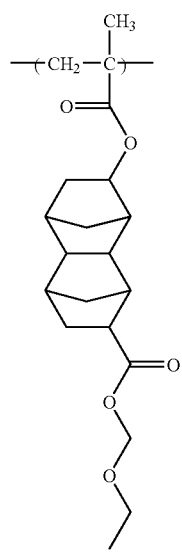
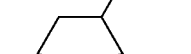 (a1-4-16)
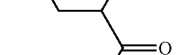 (a1-4-17)
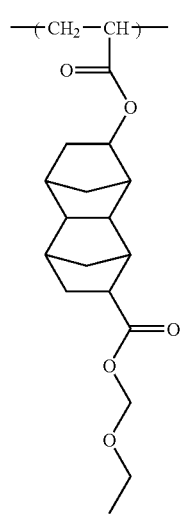
 (a1-4-18)
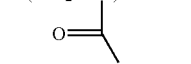 (a1-4-19)
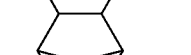
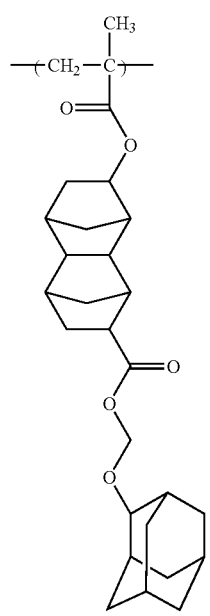
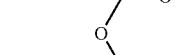 (a1-4-20)
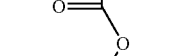
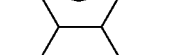
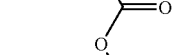

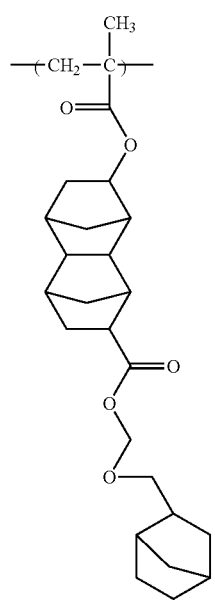 (a1-4-21)
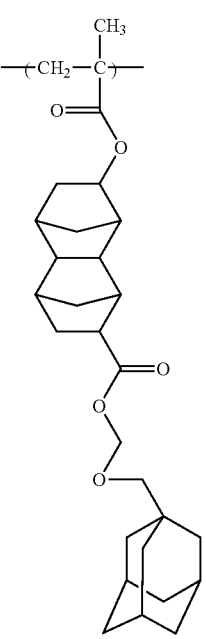 (a1-4-23)
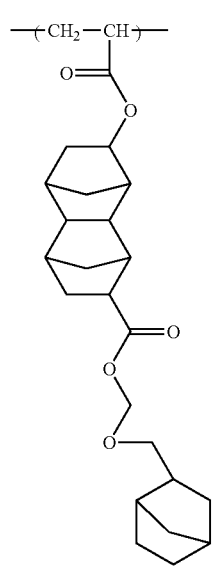 (a1-4-22)
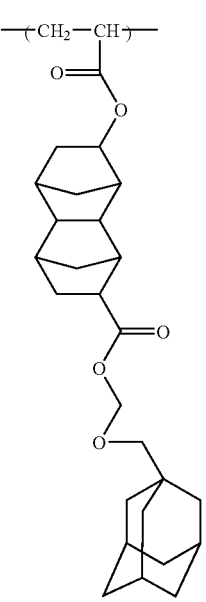 (a1-4-24)

(a1-4-25)
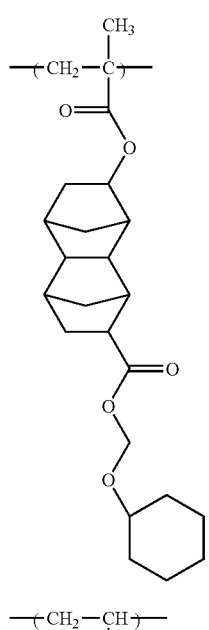
(a1-4-26)
(a1-4-27)
(a1-4-28)
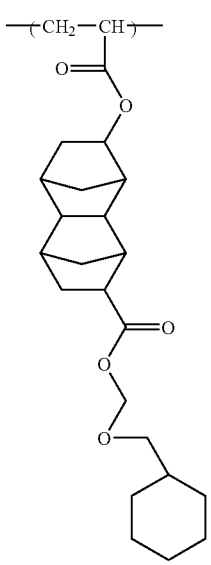
(a1-4-29)
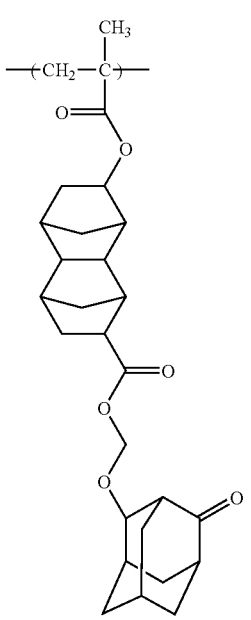

-continued

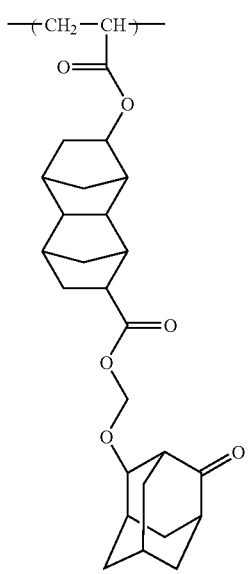

(a1-4-30)

Of these, a structural unit represented by the general formula (a1-1) or (a1-3) is preferable. More specifically, as a structural unit represented by the general formula (a1-1), at least one structural unit selected from the group consisting of structural units represented by formulas (a1-1-1) to (a-1-1-6) and (a1-1-35) to (a1-1-41) is more preferable.

As a structural unit represented by the general formula (a1-3), at least one structural unit selected from the group consisting of structural units represented by formulas (a1-0-25) to (a1-3-32) is more preferable.

Further, as the structural unit (a1), a structural unit represented by the general formula (a1-0-01) shown below which includes the structural units represented by the formulas (a1-1-1) to (a1-1-4), a structural unit represented by the general formula (a1-0-02) shown below which includes the structural units represented by the formulas (a1-0-35) to (a1-1-41), and a structural unit represented by the general formula (a1-0-01) shown below which includes the structural units represented by the formulas (a1-0-25) to (a1-3-32) are also preferable.

[Chemical Formula 33]

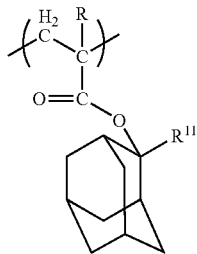

(a1-1-01)

(In the formula, R represents a hydrogen atom, a lower alkyl group or a halogenated lower alkyl group; and $R^{11}$ represents a lower alkyl group.)

[Chemical Formula 34]

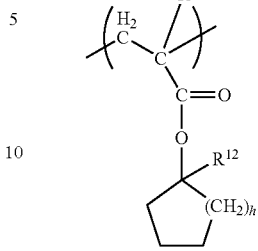

(a1-1-02)

(In the formula, R represents a hydrogen atom, a lower alkyl group or a halogenated lower alkyl group; $R^{12}$ represents a lower alkyl group; and h represents an integer of 1 to 3.)

[Chemical Formula 35]

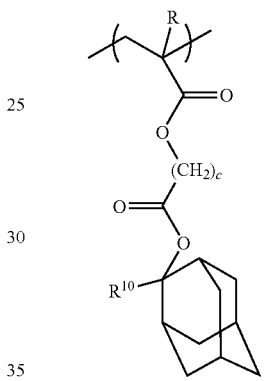

(a1-3-01)

(In the formula, R represents a hydrogen atom, a lower alkyl group or a halogenated lower alkyl group; $R^{10}$ represents a lower alkyl group; and c represents an integer of 1 to 5.)

In the general formula (a1-0-01), R is as defined above.
The lower alkyl group for $R^{11}$ is the same as the lower alkyl group described above for R, and is preferably a methyl group or an ethyl group.

In the general formula (a1-0-02), R is as defined above.
The lower alkyl group for $R^{12}$ is the same as the lower alkyl group described above for R. $R^{12}$ is preferably a methyl group or an ethyl group, and most preferably an ethyl group.

h is preferably 1 or 2, and most preferably 2.
In the general formula (a1-0-01), R is as defined above.
The lower alkyl group for $R^{10}$ is the same as the lower alkyl group described above for R, and is preferably a methyl group or an ethyl group.

c is preferably 1 or 2.
In the polymeric compound (A1), as the structural unit (a1), one type can be used alone, or two or more types can be used in combination.

As described above, the proportion of the structural unit (a1) in the polymeric compound (A1) is preferably within the range where the total proportion of the structural units (a0) and (a1) is 10 to 80 mol %, more preferably 20 to 70 mol %, and most preferably 25 to 50 mol %, based on the combined total of all the structural units that constitute the polymer compound (A1). When the total proportion is not less than the lower limit within the above range, then a pattern can be easily formed using a positive resist composition which includes the structural unit (a1), whereas when the total proportion is not more than the upper limit within the above range, a good quantitative balance with the other structural units can be attained.

In the case that the polymeric compound (A1) includes both of the structural units (a0) and (a1), the proportion (molar ratio) of each structural unit in the polymeric compound (A1) is preferably within the range of "structural unit (a0): structural unit (a1)=99:1 to 1:99", more preferably within the range of "80:20 to 20:80", still more preferably within the range of "70:30 to 30:70", and most preferably within the range of "60:40 to 40:60".

The polymeric compound (A1) may also include a structural unit (a4) other than the structural units (a1) to (a3), within the range that the effect of the present invention is not impaired.

As the structural unit (a4), any other structural unit which cannot be classified as one of the above structural units (a1) to (a3) can be used without any particular limitation, and any of the multitude of conventional structural units used within resist resins for ArF excimer lasers or KrF excimer lasers (and particularly for ArF excimer lasers) can be used.

The structural unit (a4) is preferably, for example, a structural unit derived from an acrylate ester containing a non-acid-dissociable aliphatic polycyclic group. Examples of the polycyclic group include the same polycyclic groups as those described above in the structural unit (a1), and any of the multitude of conventional polycyclic groups used within the resin component of resist compositions for ArF excimer lasers or KrF excimer lasers (and preferably for ArF excimer lasers) can be used.

In particular, at least one group selected from amongst a tricyclodecanyl group, an adamantyl group, a tetracyclododecanyl group, an isobornyl group, and a norbornyl group are preferable in terms of industrial availability and the like. These polycyclic groups may contain a linear or branched alkyl group of 1 to 5 carbon atoms as a substituent group.

Specific examples of the structural unit (a4) include a structural unit represented by general formulae (a4-1) to (a4-5) shown below.

[Chemical Formula 36]

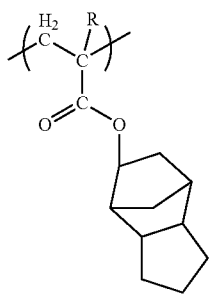
(a4-1)

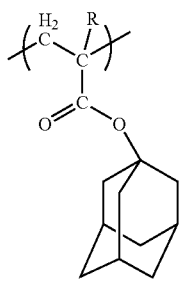
(a4-2)

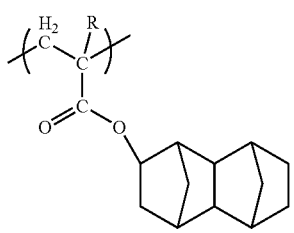
(a4-3)

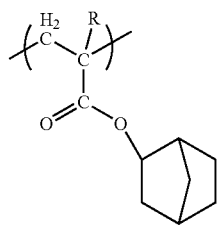
(a4-4)

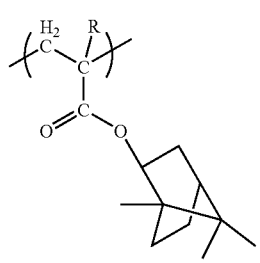
(a4-5)

(In the formulae, R is as defined above.)

If the structural unit (a4) is included in the polymeric compound (A1), the proportion of the structural unit (a4) in the polymeric compound (A1) is preferably 1 to 30 mol %, and more preferably 10 to 20 mol %, based on the combined total of all the structural units that constitute the polymeric compound (A1).

In the present invention, the polymeric compound (A1) is preferably a copolymer which contains the structural units (a0), (a2) and (a3). Examples of the copolymer include a copolymer consisting of the structural units (a0), (a2) and (a3); a copolymer consisting of the structural units (a0), (a2), (a3) and (a4); and a copolymer consisting of the structural units (a0), (a2), (a3) and (a1).

The polymeric compound (A1) is particularly preferably a copolymer containing four structural units represented by the general formula (A1-11) or (A1-12) shown below.

[Chemical Formula 37]

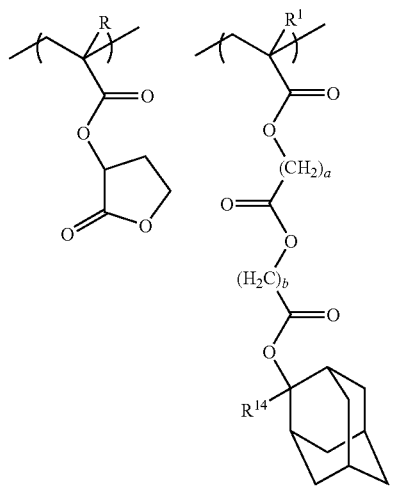
(A1-11)

-continued

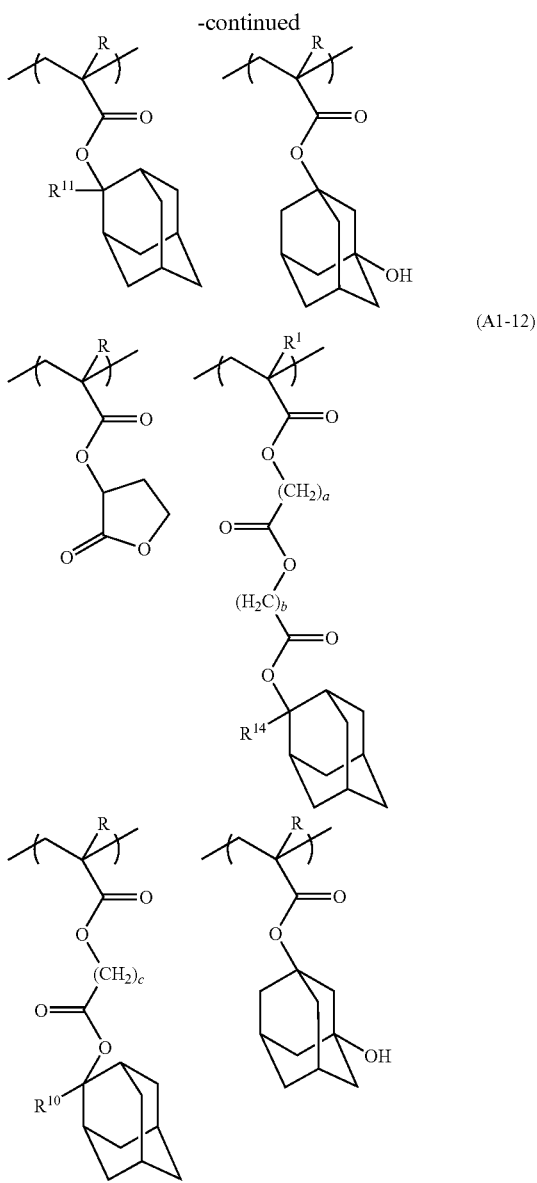

(A1-12)

(In the formulae, R, $R^1$, a, b, c, $R^{10}$, $R^{11}$, and $R^{14}$ are as defined above.)

In the formulae (A1-11) and (A1-12), the plurality of R may each be independently the same or different.

The polymeric compound (A1) can be obtained, for example, by a conventional radical polymerization or the like of the monomers corresponding with each of the intended structural units (for example, the compound (1) described below and, if desired, a monomer corresponding with another structural unit), using a radical polymerization initiator such as azobisisobutyronitrile (AIBN) and dimethyl-2,2'-azobis(2-methyl propionate) (product name: V-601, manufactured by Wako Pure Chemical Industries, Ltd.)

Also, in the polymeric compound (A1), by simultaneously using a chain transfer agent such as HS—$CH_2$—$CH_2$—$CH_2$—$C(CF_3)_2$—OH during the above polymerization, a —$C(CF_3)_2$—OH group can be introduced at the terminals of the polymer main chain. When a hydroxyalkyl group in which a part of the hydrogen atoms of the alkyl group has been substituted with fluorine atoms is introduced at the terminals of the polymer main chain in this manner, the copolymer thus obtained can have an advantageous effect of reducing the levels of developing defects and LER (line edge roughness: non-uniform irregularities within the line side walls).

There is no particular restriction on the weight average molecular weight (Mw) (the polystyrene equivalent value determined by gel permeation chromatography (GPC), hereinafter defined as the same) of the polymeric compound (A1), and the weight average molecular weight of the polymeric compound (A1) is preferably 2,000 to 50,000, more preferably 3,000 to 30,000, and most preferably 5,000 to 20,000. By ensuring that the weight average molecular weight of the polymeric compound (A1) is not more than the upper limit, solubility sufficient for a resist relative to a resist solvent can be obtained. By ensuring that it is not less than the lower limit, excellent dry-etching resistance and excellent cross-sectional shape of the resist pattern can be obtained.

Furthermore, the dispersion degree (Mw/Mn) is preferably within the range of 1.0 to 5.0, more preferably 1.0 to 3.0, and most preferably 1.2 to 2.5. Herein, Mn represents the number average molecular weight.

In the component (A), as the polymeric compound (A1), one type can be used alone, or two or more can be used in combination.

The proportion of the polymeric compound (A1) in the component (A) is preferably 50 to 100% by weight, more preferably 80 to 100% by weight, and may be 100% by weight, based on the total weight of the component (A).

The component (A) may contain "a base component which exhibits increased solubility in an alkali developing solution under action of an acid" (hereinafter, referred to as component (A2)) other than the aforementioned polymeric compound (A1).

There is no particular restriction on the component (A2), and any of the multitude of conventional base components used for chemically-amplified positive resist compositions (for example, base resins for ArF excimer lasers or KrF excimer lasers (and preferably for ArF excimer lasers)), arbitrarily selected, can be used. Examples of the base resin for ArF excimer lasers include those which contain the aforementioned structural unit (a1) as an indispensable structural unit, and arbitrarily contains the aforementioned structural units (a2) to (a4).

As the component (A2), one type may be used alone, or two or more types may be used in combination.

In the resist composition of the present invention, the content of the component (A) may be adjusted according to the thickness of the resist film to be formed.

<Component (B)>

There is no particular restriction on the component (B), and those proposed as acid generators for conventional chemically-amplified resists can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzyl sulfonate-based acid generators; iminosulfonate-based acid generators; and disulfone-based acid generators.

As an onium salt-based acid generator, for example, an acid generator represented by a general formula (b-1) or (b-2) shown below can be used.

[Chemical Formula 38]

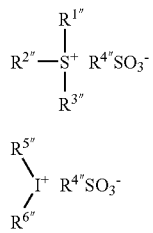

(b-1)

(b-2)

(In the formulae, $R^{1\prime\prime}$ to $R^{3\prime\prime}$, $R^{5\prime\prime}$ and $R^{6\prime\prime}$ each independently represents an aryl group or an alkyl group; two of $R^{1\prime\prime}$ to $R^{3\prime\prime}$ in the formula (b-1) may mutually be bonded to form a ring together with the sulfur atom; $R^{4\prime\prime}$ represents an alkyl group which may contain a substituent group, a halogenated alkyl group which may contain a substituent group, an aryl group which may contain a substituent group, or an alkenyl group which may contain a substituent group; at least one of $R^{1\prime\prime}$ to $R^{3\prime\prime}$ represents an aryl group; and at least one of $R^{5\prime\prime}$ and $R^{6\prime\prime}$ represents an aryl group.)

In the general formula (b-1), $R^{1\prime\prime}$ to $R^{3\prime\prime}$ each independently represents an aryl group or an alkyl group. Here, two of $R^{1\prime\prime}$ to $R^{3\prime\prime}$ in the formula (b-1) may mutually be bonded to form a ring together with the sulfur atom.

Also, at least one of $R^{1\prime\prime}$ to $R^{3\prime\prime}$ represents an aryl group. Two or more of $R^{1\prime\prime}$ to $R^{3\prime\prime}$ are preferably aryl groups, and all of $R^{1\prime\prime}$ to $R^{3\prime\prime}$ are most preferably aryl groups.

There is no particular restriction on the aryl group for $R^{1\prime\prime}$ to $R^{3\prime\prime}$. For example, the aryl group may be an aryl group of 6 to 20 carbon atoms, wherein a part of or all of the hydrogen atoms in the aryl group may or may not be substituted with an alkyl group, an alkoxy group, a halogen atom, a hydroxyl group or the like.

The aryl group is preferably an aryl group of 6 to 10 carbon atoms because it can be synthesized inexpensively. Specific examples thereof include a phenyl group and a naphthyl group.

In the aryl group, the alkyl group with which hydrogen atoms may be substituted is preferably an alkyl group of 1 to 5 carbon atoms, and most preferably a methyl group, an ethyl group, a propyl group, an n-butyl group, or a tert-butyl group.

In the aryl group, the alkoxy group with which hydrogen atoms may be substituted is preferably an alkoxy group of 1 to 5 carbon atoms, and more preferably a methoxy group, an ethoxy group, an n-propoxy group, an iso-propoxy group, an n-butoxy group, or a tert-butoxy group, and most preferably a methoxy group or an ethoxy group.

In the aryl group, the halogen atom with which hydrogen atoms may be substituted is preferably a fluorine atom.

There is no particular restriction on the alkyl groups for $R^{1\prime\prime}$ to $R^{3\prime\prime}$. Examples thereof include a linear, branched, or cyclic alkyl group of 1 to 10 carbon atoms. The number of carbon atoms is preferably 1 to 5, in terms of excellent resolution. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group. Of these, a methyl group is preferable, because it excels in resolution, and can be synthesized inexpensively.

If two of $R^{1\prime\prime}$ to $R^{3\prime\prime}$ in the general formula (b-1) are mutually bonded to form a ring together with the sulfur atom, the ring including the sulfur atom preferably forms a 3- to 10-membered ring, and more preferably forms a 5- to 7-membered ring.

Also, if two of $R^{1\prime\prime}$ to $R^{3\prime\prime}$ in the general formula (b-1) are mutually bonded to form a ring together with the sulfur atom, the other of $R^{1\prime\prime}$ to $R^{3\prime\prime}$ is preferably an aryl group. As the aryl group, the same aryl groups as those described above for $R^{1\prime\prime}$ to $R^{3\prime\prime}$ can be used.

$R^{4\prime\prime}$ represents an alkyl group which may contain a substituent group, a halogenated alkyl group which may contain a substituent group, an aryl group which may contain a substituent group, or an alkenyl group which may contain a substituent group.

The alkyl group for $R^{4\prime\prime}$ may be linear, branched or cyclic.

The number of carbon atoms in the linear or branched alkyl group for $R^{4\prime\prime}$ is preferably 1 to 10, more preferably 1 to 8, and most preferably 1 to 4.

The number of carbon atoms in the cyclic alkyl group for $R^{4\prime\prime}$ is preferably 4 to 15, more preferably from 4 to 10, and most preferably from 6 to 10.

As the halogenated alkyl group for $R^{4\prime\prime}$, groups in which a part or all of the hydrogen atoms in the linear, branched or cyclic alkyl group are substituted with halogen atoms can be used. Examples of the halogen atom include a fluorine atom, a chlorine atom, a bromine atom and an iodine atom. Of these, a fluorine atom is preferable.

In the halogenated alkyl group, the proportion (halogenated ratio (%)) of the number of halogen atoms relative to the total number of halogen atoms and hydrogen atoms included in the halogenated alkyl group is preferably within the range of 10 to 100%, more preferably 50 to 100%, and most preferably 100%. A higher halogenated ratio is preferable because the strength of the acid increases.

The aryl group for $R^{4\prime\prime}$ is preferably an aryl group of 6 to 20 carbon atoms.

The alkenyl group for $R^{4\prime\prime}$ is preferably an alkenyl group of 2 to 10 carbon atoms.

In the aforementioned $R^{4\prime\prime}$, the expression "may contain a substituent group" means that a part or all of the hydrogen atoms in the aforementioned linear, branched, or cyclic alkyl group, the halogenated alkyl group, the aryl group, or the alkenyl group may be substituted with substituent groups (atoms or groups other than hydrogen atoms).

The number of substituent groups in $R^{4\prime\prime}$ may be either one, or two or more.

Examples of the substituent group include a halogen atom, a hetero atom, an alkyl group, and a group represented by the formula $X-Q^1-Y^1-$ (wherein, $Q^1$ represents a bivalent linking group containing an oxygen atom; $Y^1$ represents an alkylene group of 1 to 4 carbon atoms which may contain a substituent group or a fluorinated alkylene group of 1 to 4 carbon atoms which may contain a substituent group; and X represents a hydrocarbon group of 3 to 30 carbon atoms which may contain a substituent group).

Examples of the halogen atom and alkyl group for the above substituent group in $R^{4\prime\prime}$ include the same as the halogen atom described above in the halogenated alkyl group for $R^{4\prime\prime}$ and the alkyl groups described above for $R^{4\prime\prime}$.

Examples of the hetero atom for the above substituent group in $R^{4\prime\prime}$ include an oxygen atom, a nitrogen atom, and a sulfur atom.

In the group represented by the formula "$X-Q^1-Y^1-$", $Q^1$ represents a bivalent linking group containing an oxygen atom.

$Q^1$ may contain an atom other than an oxygen atom. Examples of the atom other than an oxygen atom include a carbon atom, a hydrogen atom, a sulfur atom, and a nitrogen atom.

Examples of the bivalent linking group containing an oxygen atom include non-hydrocarbon-based oxygen atom-containing linking groups such as an oxygen atom (ether linkage; —O—), an ester linkage (—C(=O)—O—), an amide linkage (—C(=O)—NH—), a carbonyl group (—C(=O)—), and a carbonate linkage (—O—C(=O)—O—); and combined groups of the non-hydrocarbon-based oxygen-containing linking group with an alkylene group.

Examples of the above combined groups include a group of —$R^{91}$—O—, a group of —$R^{92}$—O—C(=O)—, and a group of —C(=O)—O—$R^{93}$—O—C(=O)— (wherein, $R^{91}$ to $R^{93}$ each independently represents an alkylene group).

The alkylene group for $R^{91}$ to $R^{93}$ is preferably a linear or branched alkylene group, and preferably has 1 to 12 carbon atoms, more preferably 1 to 5 carbon atoms, and still more preferably 1 to 3 carbon atoms.

Specific examples of the alkylene group include a methylene group [—$CH_2$—]; an alkylmethylene group such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; an ethylene group [—$CH_2CH_2$—]; an alkylethylene group such as —CH($CH_3$)$CH_2$—, —CH($CH_3$)CH($CH_3$)—, —C($CH_3$)$_2$$CH_2$—, —CH($CH_2CH_3$)$CH_2$—, and —CH($CH_2CH_2CH_3$)$CH_2$—; a trimethylene group (n-propylene group) [—$CH_2CH_2CH_2$—]; an alkyltrimethylene group such as —CH($CH_3$)$CH_2CH_2$— and —$CH_2$CH($CH_3$)$CH_2$—; a tetramethylene group [—$CH_2CH_2CH_2CH_2$—]; an alkyltetramethylene group such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—]. $Q^1$ is preferably a bivalent linking group containing an ester linkage or ether linkage, and more preferably a group of —$R^{91}$—O—, —$R^{92}$—O—C(=O)—, or —C(=O)—O—$R^{93}$—O—C(=O)—.

In the group represented by the formula X-$Q^1$-$Y^1$—, as the alkylene group for $Y^1$, the same alkylene group as those described above for $Q^1$ in which the number of carbon atoms is 1 to 4 can be used.

As the fluorinated alkylene group for $Y^1$, groups in which a part or all of the hydrogen atoms in the alkylene group are substituted with fluorine atoms can be used.

Specific examples of $Y^1$ include —$CF_2$—, —$CF_2CF_2$—, —$CF_2CF_2CF_2$—, —CF($CF_3$)$CF_2$—, —CF($CF_2CF_3$)—, —C($CF_3$)$_2$—, —$CF_2CF_2CF_2CF_2$—, —CF($CF_3$)$CF_2CF_2$—, —$CF_2$CF($CF_3$)$CF_2$—, —CF($CF_3$)CF($CF_3$)—, —C($CF_3$)$_2$$CF_2$—, —CF($CF_2CF_3$)$CF_2$—, and —C($CF_3$)($CF_2CF_3$)—; —CHF—, —$CH_2CF_2$—, —$CH_2CH_2CF_2$—, —$CH_2CF_2CF_2$—, —CH($CF_3$)$CH_2$—, —CH($CF_2CF_3$)—, —C($CH_3$)($CF_3$)—, —$CH_2CH_2CH_2CF_2$—, —$CH_2CH_2CF_2CF_2$—, —CH($CF_3$)$CH_2CH_2$—, —$CH_2$CH($CF_3$)$CH_2$—, —CH($CF_3$)CH($CF_3$)—, and —C($CF_3$)$_2$$CH_2$—; —$CH_2$—, —$CH_2CH_2$—, —$CH_2CH_2CH_2$—, —CH($CH_3$)$CH_2$—, —CH($CH_2CH_3$)—, —C($CH_3$)$_2$—, —$CH_2CH_2CH_2CH_2$—, —CH($CH_3$)$CH_2CH_2$—, —$CH_2$CH($CH_3$)$CH_2$—, —CH($CH_3$)CH($CH_3$)—, —C($CH_3$)$_2$$CH_2$—, —CH($CH_2CH_3$)$CH_2$—, —CH($CH_2CH_2CH_3$)—, and —C($CH_3$)($CH_2CH_3$)—.

$Y^1$ is preferably a fluorinated alkylene group, and particularly preferably a fluorinated alkylene group in which the carbon atom bonded to the adjacent sulfur atom is fluorinated. Examples of such fluorinated alkylene groups include —$CF_2$—, —$CF_2CF_2$—, —$CF_2CF_2CF_2$—, —CF($CF_3$)$CF_2$—, —$CF_2CF_2CF_2CF_2$—, —CF($CF_3$)$CF_2CF_2$—, —$CF_2$CF($CF_3$)$CF_2$—, —CF($CF_3$)CF($CF_3$)—, —C($CF_3$)$_2$$CF_2$—, and —CF($CF_2CF_3$)$CF_2$—; —$CH_2CF_2$—, —$CH_2CH_2CF_2$—, and —$CH_2CF_2CF_2$—; —$CH_2CH_2CH_2CF_2$—, —$CH_2CH_2CF_2CF_2$—, and —$CH_2CF_2CF_2CF_2$—.

Of these, —$CF_2$—, —$CF_2CF_2$—, —$CF_2CF_2CF_2$—, or —$CH_2CF_2CF_2$— is preferable, —$CF_2$—, —$CF_2CF_2$—, or —$CF_2CF_2CF_2$— is more preferable, and —$CF_2$— is still more preferable.

The alkylene group or fluorinated alkylene group for $Y^1$ may contain a substituent group. The expression that the alkylene group or fluorinated alkylene group "contain a substituent group" means that a part or all of the hydrogen atoms or fluorine atoms in the alkylene group or fluorinated alkylene group are substituted with groups other than hydrogen atoms and fluorine atoms.

Examples of the substituent group which may be included in the alkylene group or fluorinated alkylene group include an alkyl group of 1 to 4 carbon atoms, an alkoxy group of 1 to 4 carbon atoms, and a hydroxyl group.

In the group represented by the formula "X-$Q^1$-$Y^1$-", the hydrocarbon group for X may be an aromatic hydrocarbon group or an aliphatic hydrocarbon group.

The aromatic hydrocarbon group is a hydrocarbon group containing an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms described above does not include the number of carbon atoms in the substituent group.

Specific examples of the aromatic hydrocarbon group include aryl groups in which one hydrogen atom has been removed from an aromatic hydrocarbon ring such as a phenyl group, a biphenyl group, a fluorenyl group, a naphthyl group, an anthryl group, and a phenanthryl group; and arylalkyl groups such as a benzyl group, a phenethyl group, a 1-naphthylmethyl group, a 2-naphthylmethyl group, a 1-naphthylethyl group, and a 2-naphthylethyl group. The number of carbon atoms of the alkyl chain in the arylalkyl group is preferably 1 to 4, more preferably 1 or 2, and still more preferably 1.

The aromatic hydrocarbon group may contain a substituent group. For example, a part of the carbon atoms which constitutes an aromatic ring included in the aromatic hydrocarbon group may be substituted with a hetero atom, or a part of the hydrogen atoms bonded to an aromatic ring included in the aromatic hydrocarbon group may be substituted with a substituent group.

Examples of the former case include a heteroaryl group in which a part of the carbon atoms which constitutes the ring of the aryl group described above is substituted with a hetero atom such as an oxygen atom, a sulfur atom, and a nitrogen atom; and a heteroarylalkyl group in which a part of the carbon atoms which constitutes the aromatic hydrocarbon ring of the arylalkyl group described above is substituted with the hetero atom.

On the other hand, examples of the substituent groups of the aromatic hydrocarbon group in the latter case include an alkyl group, an alkoxy group, a halogen atom, a halogenated alkyl group, a hydroxyl group, and an oxygen atom (=O).

The alkyl group for the substituent group in the aforementioned aromatic hydrocarbon group is preferably an alkyl group of 1 to 5 carbon atoms, and most preferably a methyl group, an ethyl group, a propyl group, an n-butyl group, or a tert-butyl group.

The alkoxy group for the substituent group in the aforementioned aromatic hydrocarbon group is preferably an alkoxy group of 1 to 5 carbon atoms, and more preferably a methoxy group, an ethoxy group, an n-propoxy group, an iso-propoxy group, an n-butoxy group, or a tert-butoxy group, and most preferably a methoxy group or an ethoxy group.

Examples of the halogen atom for the substituent group in the aforementioned aromatic hydrocarbon group include a fluorine atom, a chlorine atom, a bromine atom, and an iodine atom. Of these, a fluorine atom is preferable.

Examples of the halogenated alkyl group for the substituent group in the aforementioned aromatic hydrocarbon group include groups in which a part of or all of the hydrogen atoms of the above alkyl group are substituted with the halogen atoms.

The aliphatic hydrocarbon group for X may be a saturated aliphatic hydrocarbon group, or an unsaturated aliphatic hydrocarbon group. Also, the aliphatic hydrocarbon group may be linear, branched, or cyclic.

In the aliphatic hydrocarbon group for X, a part of the carbon atoms which constitute the aliphatic hydrocarbon group may be substituted with a substituent group containing a hetero atom, or a part or all of the hydrogen atoms which constitute the aliphatic hydrocarbon group may be substituted with a substituent group containing a hetero atom.

There is no particular restriction on the "hetero atom" in X, as long as it is an atom other than a carbon atom and a hydrogen atom. Examples thereof include a halogen atom, an oxygen atom, a sulfur atom, and a nitrogen atom. Examples of the halogen atom include a fluorine atom, a chlorine atom, an iodine atom, and a bromine atom.

The substituent group containing a hetero atom may be an atom/group consisting of the hetero atom, or a group containing a group or an atom other than the hetero atom.

As the substituent group which may be substituted for a part of the carbon atoms constituting the aforementioned aliphatic hydrocarbon group for X, for example, groups of —O—, —C(=O)—O—, —C(=O)—, —O—C(=O)—O—, —C(=O)—NH—, —NH— (wherein H may be substituted with a substituent group such as an alkyl group or an acyl group), —S—, —S(=O)$_2$—, or —S(=O)$_2$—O— can be used. If the aliphatic hydrocarbon group for X is cyclic, these substituent groups may be included in the ring structure.

As the substituent group which may be substituted for a part or all of the hydrogen atoms constituting the aforementioned aliphatic hydrocarbon group for X, for example, an alkoxy group, a halogen atom, a halogenated alkyl group, a hydroxyl group, an oxygen atom (=O), or a cyano group can be used.

The alkoxy group is preferably an alkoxy group of 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

Examples of the halogen atom include a fluorine atom, a chlorine atom, a bromine atom, and an iodine atom. Of these, a fluorine atom is preferable.

Examples of the halogenated alkyl group include a group in which a part or all of the hydrogen atoms in an alkyl group of 1 to 5 carbon atoms, such as a methyl group, an ethyl group, a propyl group, an n-butyl group, or a tert-butyl group, are substituted with the halogen atoms.

The aliphatic hydrocarbon group for X is preferably a linear or branched saturated hydrocarbon group, a linear or branched monounsaturated hydrocarbon group, or a cyclic aliphatic hydrocarbon group (aliphatic cyclic group).

The linear saturated hydrocarbon group (alkyl group) preferably has 1 to 20 carbon atoms, more preferably 1 to 15 carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, and a docosyl group.

The branched saturated hydrocarbon group (alkyl group) has preferably 3 to 20 carbon atoms, more preferably 3 to 15 carbon atoms, and most preferably 3 to 10 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

The monounsaturated hydrocarbon group has preferably 2 to 10 carbon atoms, more preferably 2 to 5 carbon atoms, still more preferably 2 to 4 carbon atoms, and most preferably 3 carbon atoms. Examples of the linear monounsaturated hydrocarbon group include a vinyl group, a propenyl group (allyl group) and a butynyl group. Examples of the branched monounsaturated hydrocarbon group include a 1-methylpropenyl group and a 2-methylpropenyl group.

Of these, the monounsaturated hydrocarbon group is particularly preferably a propenyl group.

The aliphatic cyclic group may be a monocyclic group or a polycyclic group. The aliphatic cyclic group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples thereof include groups in which one or more of the hydrogen atoms have been removed from a monocycloalkane; and groups in which one or more of the hydrogen atoms have been removed from a polycycloalkane such as a bicycloalkane, a tricycloalkane, or a tetracycloalkane. Specific examples include groups in which at least one hydrogen atom has been removed from a monocycloalkane such as cyclopentane or cyclohexane; and groups in which at least one hydrogen atom has been removed from a polycycloalkane such as adamantane, norbornane, isobornane, tricyclodecane or tetracyclododecane.

If the aliphatic cyclic group does not contain a substituent group containing a hetero atom in the ring structure, the aliphatic cyclic group is preferably a polycyclic group, more preferably a group in which one or more hydrogen atoms have been removed from a polycycloalkane, and most preferably a group in which one or more hydrogen atoms have been removed from an adamantane.

If the aliphatic cyclic group contains a substituent group containing a hetero atom in the ring structure, the substituent group containing a hetero atom is preferably —O—, —C(=O)—O—, —S—, —S(=O)$_2$—, or —S(=O)$_2$—O—. Specific examples of such aliphatic cyclic groups include groups represented by the formulae (L1) to (L5), and (S1) to (S4) shown below.

[Chemical Formula 39]

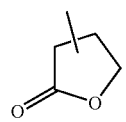

(L1)

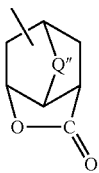
(L2)

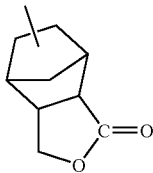
(L3)

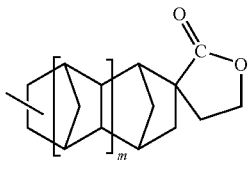
(L4)

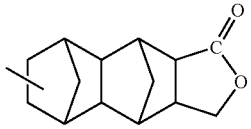
(L5)

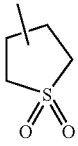
(S1)

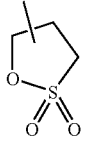
(S2)

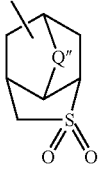
(S3)

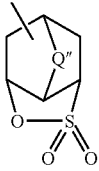
(S4)

(In the formulae, Q" represents an alkylene group of 1 to 5 carbon atoms, —O—, —S—, —O—$R^{94}$—, or —S—$R^{95}$—, wherein $R^{94}$ and $R^{95}$ each independently represents an alkylene group of 1 to 5 carbon atoms; and m represents an integer of 0 or 1.)

In the formulae, as the alkylene group for Q", $R^{94}$, and $R^{95}$, the same alkylene groups as those described above for $R^{91}$ to $R^{93}$ can be used.

These aliphatic cyclic groups may be a group in which a part of the hydrogen atoms bonded to the carbon atoms constituting the ring structure are substituted with substituent groups. Examples of the substituent group include an alkyl group, an alkoxy group, a halogen atom, a halogenated alkyl group, a hydroxyl group, and an oxygen atom (═O).

The aforementioned alkyl group is preferably an alkyl group of 1 to 5 carbon atoms, and particularly preferably a methyl group, an ethyl group, a propyl group, an n-butyl group, or a tert-butyl group.

Examples of the aforementioned alkoxy group and halogen atoms, respectively, include the same as those described above as the substituent groups which are substituted for a part or all of the hydrogen atoms.

In the present invention, X is preferably a cyclic group which may contain a substituent group. The cyclic group may be an aromatic hydrocarbon group which may contain a substituent group or an aliphatic cyclic group which may contain a substituent group, and is preferably an aliphatic cyclic group which may contain a substituent group.

The aforementioned aromatic hydrocarbon group is preferably a naphthyl group which may contain a substituent group or a phenyl group which may contain a substituent group.

The aliphatic cyclic group which may contain a substituent group is preferably a polycyclic aliphatic cyclic group which may contain a substituent group. The polycyclic aliphatic cyclic group is preferably a group in which one or more hydrogen atoms have been removed from a polycycloalkane, or a group represented by the above formulae (L2) to (L5), and (S3) to (S4).

In the general formula (b-2), $R^{5'''}$ and $R^{6'''}$ each independently represents an aryl group or an alkyl group. At least one of $R^{5'''}$ and $R^{6'''}$ represents an aryl group. Both of $R^{5'''}$ and $R^{6'''}$ are preferably aryl groups.

As the aryl groups for $R^{5'''}$ and $R^{6'''}$, the same aryl groups as those for $R^{1'''}$ to $R^{3'''}$ above can be used.

As the alkyl groups for $R^{5'''}$ and $R^{6'''}$, the same alkyl groups as those for $R^{1'''}$ to $R^{3'''}$ above can be used.

Of these, it is most preferable that both of $R^{5'''}$ and $R^{6'''}$ be phenyl groups.

As $R^{4'''}$ in the general formula (b-2), the same as those described above for $R^{4'''}$ in the general formula (b-1) can be used.

Specific examples of onium salt-based acid generators represented by formula (b-1) or (b-2) include diphenyliodonium trifluoromethanesulfonate or nonafluorobutanesulfonate; bis (4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl) sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl) phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

Also, onium salts whose anion moiety is substituted with an alkylsulfonate such as a methanesulfonate, an n-propanesulfonate, an n-butanesulfonate, and an n-octanesulfonate can be used.

Also, onium salts whose anion moiety is substituted with one of the anion moieties represented by the formulae (b1) to (b7) shown below can be used.

[Chemical Formula 40]

(b1)
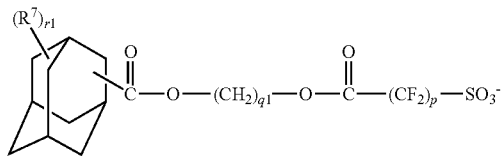

(b2)
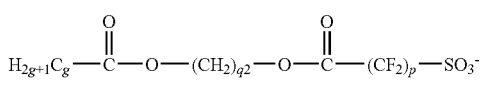

(b3)
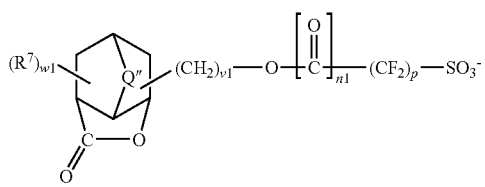

(b4)
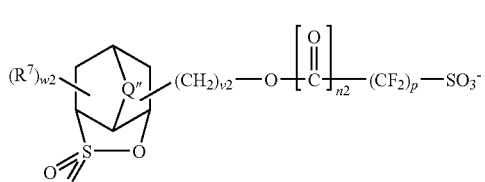

(b5)
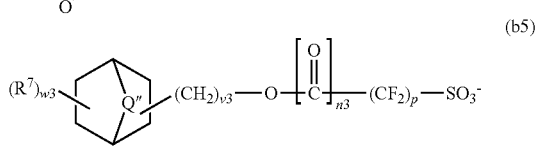

-continued (b6)
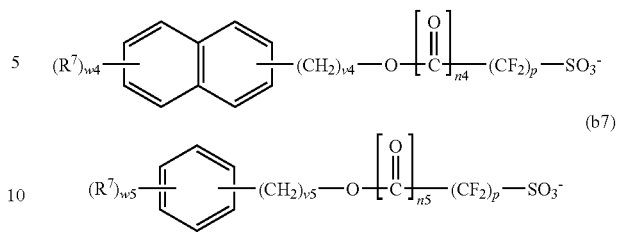

(b7)

(In the formulae, p represents an integer of 1 to 3; q1 and q2 each independently represents an integer of 1 to 5; r1 represents an integer of 0 to 3; g represents an integer of 1 to 20; $R^7$ represents a substituent group; n1 to n5 each independently represents an integer of 0 or 1; v1 to v5 each independently represents an integer of 0 to 3; w1 to w5 each independently represents an integer of 0 to 3; and Q" is as defined above.)

Examples of the substituent group for $R^7$ include the same as those described above as the substituent group which the aliphatic hydrocarbon group may contain, and the substituent group which the aromatic hydrocarbon group may contain in X.

If each of the symbols (r1, and w1 to w5) attached at the bottom right of $R^7$ is an integer of 2 or more, then the plurality of $R^7$ in the compound may be the same, or different from one another.

Further, onium salt-based acid generators in which the anion moiety in general formula (b-1) or (b-2) is replaced by an anion moiety represented by the general formula (b-3) or (b-4) shown below (the cation moiety is the same as (b-1) or (b-2)) may be used.

[Chemical Formula 41]

(b-3)
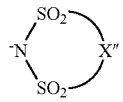

(b-4)
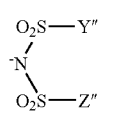

(In the formulae, X" represents an alkylene group of 2 to 6 carbon atoms in which at least one hydrogen atom is substituted with a fluorine atom; and Y" and Z" each independently represents an alkyl group of 1 to 10 carbon atoms in which at least one hydrogen atom is substituted with a fluorine atom.)

X" represents a linear or branched alkylene group in which at least one hydrogen atom is substituted with a fluorine atom. The number of carbon atoms in the alkylene group for X" is 2 to 6, preferably 3 to 5, and most preferably 3.

Y" and Z" each independently represents a linear or branched alkyl group in which at least one hydrogen atom is substituted with a fluorine atom. The number of carbon atoms in the alkyl group for Y" and Z" is 1 to 10, preferably 1 to 7, and more preferably 1 to 3.

The smaller the number of carbon atoms of the alkylene group for X" or those of the alkyl group for Y" and Z" within the above-mentioned range of the number of carbon atoms, the more the solubility in a resist solvent is improved, and consequently, it is preferable.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or an electron beam is improved. The proportion of fluorine atoms in the alkylene group or alkyl group, that is, the fluorination rate, is preferably within the range of 70 to 100%, and more preferably 90 to 100%. A perfluoroalkylene group or a perfluoroalkyl group wherein all the hydrogen atoms are substituted with fluorine atoms is most preferable.

Furthermore, a sulfonium salt that contains a cation moiety represented by the general formula (b-5) or (b-6) shown below can be used as an onium salt-based acid generator.

[Chemical Formula 42]

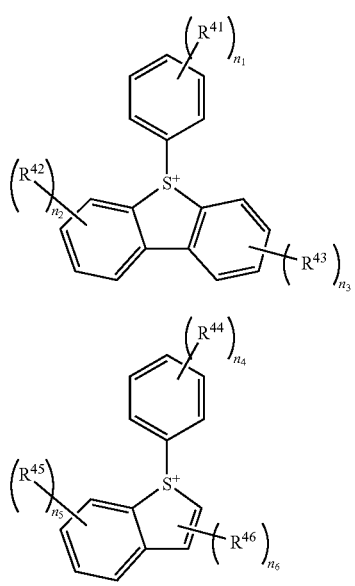

(In the formulae, $R^{41}$ to $R^{46}$ each independently represents an alkyl group, an acetyl group, an alkoxy group, a carboxyl group, a hydroxyl group or a hydroxyalkyl group; $n_1$ to $n_5$ each independently represents an integer of 0 to 3; and $n_6$ represents an integer of 0 to 2.)

The alkyl group for $R^{41}$ to $R^{46}$ is preferably an alkyl group of 1 to 5 carbon atoms, more preferably a linear or branched alkyl group, and particularly preferably a methyl group, an ethyl group, a propyl group, an isopropyl group, an n-butyl group, or a tert-butyl group.

The alkoxy group for $R^{41}$ to $R^{46}$ is preferably an alkoxy group of 1 to 5 carbon atoms, more preferably a linear or branched alkoxy group, and particularly preferably a methoxy group or an ethoxy group.

The hydroxyalkyl group for $R^{41}$ to $R^{46}$ in the formulae (b-5) and (b-6) is preferably a group in which one or more hydrogen atoms in the aforementioned alkyl group for $R^{41}$ to $R^{46}$ are substituted with hydroxy groups, and examples thereof include a hydroxymethyl group, a hydroxyethyl group, and a hydroxypropyl group.

When the subscripts $n_1$ to $n_6$ of $R^{41}$ to $R^{46}$ represent an integer of 2 or more, the plurality of $R^{41}$ to $R^{46}$ may be the same or different.

$n_1$ is preferably 0 to 2, more preferably 0 or 1, and still more preferably 0.

It is preferable that $n_2$ and $n_3$ each be independently 0 or 1, and it is more preferable that they be 0.

$n_4$ is preferably 0 to 2, and more preferably 0 or 1.
$n_5$ is preferably 0 or 1, and more preferably 0.
$n_6$ is preferably 0 or 1, and more preferably 1.

There is no particular restriction on the anion moiety of the sulfonium salt that contains the cation moiety represented by the general formula (b-5) or (b-6), and anion moieties for onium salt-based acid generators which have been proposed may be used as the anion moieties. Examples of the anion moieties include a fluorinated alkylsulfonate ion such as the anion moiety ($R^{4"}SO_3^-$) of the onium salt-based acid generator represented by the above general formula (b-1) or (b-2); and an anion moiety represented by the above general formula (b-3) or (b-4).

In the present specification, the term "oxime sulfonate-based acid generator" means a compound which has at least one of the groups represented by the general formula (B-1) shown below, and has a property that generates an acid upon exposure to radiation. These kinds of oxime sulfonate-based acid generators are widely used for a chemically-amplified resist composition, so any oxime sulfonate-based acid generator, arbitrarily selected from these, can be used.

[Chemical Formula 43]

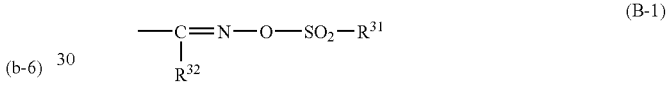

(B-1)

(In the general formula (B-1), $R^{31}$ and $R^{32}$ each independently represents an organic group.)

The organic group for $R^{31}$ or $R^{32}$ is a group containing carbon atoms, and may further contain atoms other than carbon atoms (for example, a hydrogen atom, an oxygen atom, a nitrogen atom, a sulfur atom and a halogen atom (a fluorine atom, a chlorine atom and the like)).

The organic group for $R^{31}$ is preferably a linear, branched or cyclic alkyl group or an aryl group. The alkyl group or aryl group may contain a substituent group. There is no particular restriction on the substituent group, and examples thereof include a fluorine atom, and a linear, branched or cyclic alkyl group of 1 to 6 carbon atoms. Here, the expression "containing a substituent group" means that a part or all of the hydrogen atoms in the alkyl group or aryl group are substituted with substituent groups.

The alkyl group as the organic group for $R^{31}$ preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. The alkyl group as the organic group for $R^{31}$ is particularly preferably an alkyl group which is partially or completely halogenated (hereinafter, sometimes referred to as a halogenated alkyl group). Here, a partially halogenated alkyl group means an alkyl group in which a part of the hydrogen atoms are substituted with halogen atoms, and a completely halogenated alkyl group means an alkyl group in which all of the hydrogen atoms are substituted with halogen atoms. Examples of the halogen atom include a fluorine atom, a chlorine atom, a bromine atom and an iodine atom. Of these, a fluorine atom is preferable. That is, the halogenated alkyl group is preferably a fluorinated alkyl group.

The aryl group as the organic group for $R^{31}$ preferably has 4 to 20 carbon atoms, more preferably 4 to 10 carbon atoms, and most preferably 6 to 10 carbon atoms. The aryl group is particularly preferably an aryl group which is partially or completely halogenated. Here, a partially halogenated aryl group means an aryl group in which a part of the hydrogen atoms are substituted with halogen atoms, and a completely halogenated aryl group means an aryl group in which all of the hydrogen atoms are substituted with halogen atoms.

$R^{31}$ is particularly preferably an alkyl group of 1 to 4 carbon atoms containing no substituent group, or a fluorinated alkyl group of 1 to 4 carbon atoms.

The organic group for $R^{32}$ is preferably a linear, branched or cyclic alkyl group, an aryl group, or a cyano group. As the alkyl group or the aryl group for $R^{32}$, the same alkyl groups or aryl groups as those described above for $R^{31}$ can be used.

$R^{32}$ is particularly preferably a cyano group, an alkyl group of 1 to 8 carbon atoms containing no substituent group, or a fluorinated alkyl group of 1 to 8 carbon atoms.

Preferred examples of the oxime sulfonate-based acid generator include compounds represented by general formula (B-2) or (B-3) shown below.

[Chemical Formula 44]

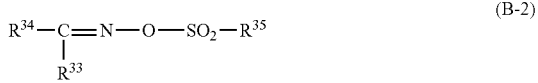

(B-2)

(In the general formula (B-2), $R^{33}$ represents a cyano group, an alkyl group containing no substituent group, or a halogenated alkyl group; and $R^{34}$ represents an aryl group; and $R^{35}$ represents an alkyl group containing no substituent group or a halogenated alkyl group.)

[Chemical Formula 45]

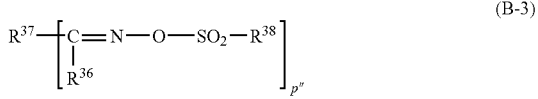

(B-3)

(In the general formula (B-3), $R^{36}$ represents a cyano group, an alkyl group containing no substituent group, or a halogenated alkyl group; $R^{37}$ represents a bivalent or trivalent aromatic hydrocarbon group; $R^{38}$ represents an alkyl group containing no substituent group, or a halogenated alkyl group; and p" represents an integer of 2 or 3.)

In the general formula (B-2), the number of carbon atoms in the alkyl group containing no substituent group or the halogenated alkyl group for $R^{33}$ is preferably 1 to 10, more preferably 1 to 8, and most preferably 1 to 6.

$R^{33}$ is preferably a halogenated alkyl group, and more preferably a fluorinated alkyl group.

The fluorinated alkyl group for $R^{33}$ is preferably a group in which 50% or more of the hydrogen atoms in the alkyl group are fluorinated, more preferably a group in which 70% or more of the hydrogen atoms in the alkyl group are fluorinated, and still more preferably a group in which 90% or more of the hydrogen atoms in the alkyl group are fluorinated.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group; and heteroaryl groups in which a part of the carbon atoms which constitute the rings of these groups are substituted with hetero atoms such as an oxygen atom, a sulfur atom, or a nitrogen atom. Of these, a fluorenyl group is preferable.

The aryl group for $R^{34}$ may contain a substituent group such as an alkyl group of 1 to 10 carbon atoms, a halogenated alkyl group of 1 to 10 carbon atoms, and an alkoxy group of 1 to 10 carbon atoms. The alkyl group or halogenated alkyl group for the aforementioned substituent group preferably has 1 to 8 carbon atoms, and more preferably 1 to 4 carbon atoms. Also, the halogenated alkyl group for the substituent group is preferably a fluorinated alkyl group.

The alkyl group containing no substituent group or the halogenated alkyl group for $R^{35}$ preferably has 1 to 10 carbon atoms, more preferably 1 to 8 carbon atoms, and most preferably 1 to 6 carbon atoms.

$R^{35}$ is preferably a halogenated alkyl group, and more preferably a fluorinated alkyl group.

The fluorinated alkyl group for $R^{35}$ is preferably a group in which 50% or more of the hydrogen atoms in the alkyl group are fluorinated, more preferably a group in which 70% or more of the hydrogen atoms in the alkyl group are fluorinated, and still more preferably a group in which 90% or more of the hydrogen atoms in the alkyl group are fluorinated, because the strength of the generated acid increases. The fluorinated alkyl group for $R^{35}$ is most preferably a completely fluorinated alkyl group in which 100% of the hydrogen atoms are substituted with fluorine atoms.

In the general formula (B-3), as the alkyl group containing no substituent group or the halogenated alkyl group for $R^{36}$, the same alkyl groups containing no substituent group or halogenated alkyl groups as those described above for $R^{33}$ can be used.

Examples of the bivalent or trivalent aromatic hydrocarbon group for $R^{37}$ include aryl groups for $R^{34}$ in which one or two hydrogen atoms are further removed.

As the alkyl group containing no substituent group or the halogenated alkyl group for $R^{38}$, the same alkyl groups containing no substituent group or halogenated alkyl groups as those described above for $R^{35}$ can be used.

p" is preferably 2.

Specific examples of the oxime sulfonate-based acid generator include
α-(p-toluenesulfonyloxyimino)-benzylcyanide,
α-(p-chlorobenzenesulfonyloxyimino)-benzylcyanide,
α-(4-nitrobenzenesulfonyloxyimino)-benzylcyanide,
α-(4-nitro-2-trifluoromethylbenzenesulfonyloxyimino)-benzylcyanide,
α-(benzenesulfonyloxyimino)-4-chlorobenzylcyanide,
α-(benzenesulfonyloxyimino)-2,4-dichlorobenzylcyanide,
α-(benzenesulfonyloxyimino)-2,6-dichlorobenzylcyanide,
α-(benzenesulfonyloxyimino)-4-methoxybenzylcyanide,
α-(2-chlorobenzenesulfonyloxyimino)-4-methoxybenzylcyanide,
α-(benzenesulfonyloxyimino)-thien-2-ylacetonitrile,
α-(4-dodecylbenzenesulfonyloxyimino)-benzylcyanide,
α-[(p-toluenesulfonyloxyimino)-4-methoxyphenyl]acetonitrile,
α-[(dodecylbenzenesulfonyloxyimino)-4-methoxyphenyl]acetonitrile,
α-(tosyloxyimino)-4-thienylcyanide,
α-(methylsulfonyloxyimino)-1-cyclopentenylacetonitrile,
α-(methylsulfonyloxyimino)-1-cyclohexenylacetonitrile,
α-(methylsulfonyloxyimino)-1-cycloheptenylacetonitrile,
α-(methylsulfonyloxyimino)-1-cyclooctenylacetonitrile,
α-(trifluoromethylsulfonyloxyimino)-1-cyclopentenylacetonitrile, α-(trifluoromethylsulfonyloxyimino)-cyclohexylacetonitrile,
α-(ethylsulfonyloxyimino)-ethylacetonitrile,
α-(propylsulfonyloxyimino)-propylacetonitrile,
α-(cyclohexylsulfonyloxyimino)-cyclopentylacetonitrile,
α-(cyclohexylsulfonyloxyimino)-cyclohexylacetonitrile,
α-(cyclohexylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile,
α-(n-butylsulfonyloxyimino)-1-cyclohexenylacetonitrile,
α-(methylsulfonyloxyimino)-phenylacetonitrile,
α-(methylsulfonyloxyimino)-p-methoxyphenylacetonitrile,
α-(trifluoromethylsulfonyloxyimino)-phenylacetonitrile,
α-(trifluoromethylsulfonyloxyimino)-p-methoxyphenylacetonitrile,
α-(ethylsulfonyloxyimino)-p-methoxyphenylacetonitrile,
α-(propylsulfonyloxyimino)-p-methylphenylacetonitrile, and
α-(methylsulfonyloxyimino)-p-bromophenylacetonitrile.

Also, oxime sulfonate-based acid generators disclosed in Japanese Unexamined Patent Application, First Publication No. Hei9-208554 ([Formula 18] and [Formula 19] in paragraphs [0012] to [0014]), and International Publication WO 2004/074242A2 (Examples 1 to 40 on pages 65 to 85) can be preferably used.

Further, suitable examples thereof include the following.

[Chemical Formula 46]

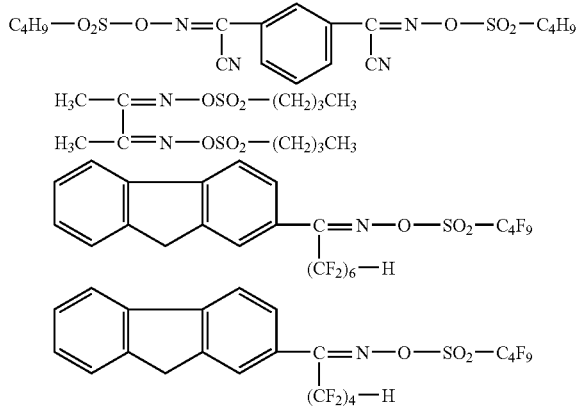

Among the diazomethane-based acid generators, specific examples of bisalkyl- or bisarylsulfonyldiazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Also, diazomethane-based acid generators disclosed in Japanese Unexamined Patent Application, First Publication No. Hei 1'-035551, Japanese Unexamined Patent Application, First Publication No. Hei11-035552, and Japanese Unexamined Patent Application, First Publication No. Hei11-035573 can be preferably used.

Examples of the poly(bissulfonyl)diazomethanes include 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, which are disclosed in Japanese Unexamined Patent Application, First Publication No. Hei11-322707.

As the component (B), either a single acid generator may be used alone, or a combination of two or more different acid generators may be used.

In the present invention, as the component (B), it is preferable to use an onium salt-based acid generator in which the anion moiety is a fluorinated alkylsulfonate ion which may contain a substituent group.

The total amount of the component (B) within the positive resist composition of the present invention is preferably 0.5 to 50 parts by weight, more preferably 1 to 30 parts by weight, and most preferably 2 to 20 parts by weight, relative to 100 parts by weight of the component (A). When the amount is within the range, a pattern can be sufficiently formed. Also, a uniform solution and excellent storage stability can be obtained. Therefore, an amount within the above range is preferable.

<Optional Components>

In the positive resist composition of the present invention, for improving the resist pattern shape and the post exposure stability of the latent image formed by the pattern-wise exposure of the resist layer, it is possible to add a nitrogen-containing organic compound (D) (hereinafter, referred to as component (D)) as an optional component.

Since a multitude of these components (D) have already been proposed, any of these known compounds can be arbitrarily used. Of these, an aliphatic amine, particularly a secondary aliphatic amine or tertiary aliphatic amine is preferred. Here, the aliphatic amine means an amine containing at least one aliphatic group, and the aliphatic group preferably has 1 to 20 carbon atoms.

Examples of the aliphatic amine include an amine (alkylamine or alkylalcoholamine) wherein at least one of the hydrogen atoms of $NH_3$ is substituted with an alkyl or hydroxyalkyl group having 1 to 20 carbon atoms; and a cyclic amine.

Specific examples of the alkylamines or alkylalcoholamines include monoalkylamines such as n-hexylamine, n-heptylamine, n-octylamine, n-nonylamine, or n-decylamine; dialkylamines such as diethylamine, di-n-propylamine, di-n-heptylamine, di-n-octylamine, or dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, or tri-n-dodecylamine; and alkylalcoholamines such as diethanolamine, triethanolamine, diisopropanolamine, triisopropanolamine, di-n-octanolamine, tri-n-octanolamine, stearyl diethanolamine, or lauryl diethanolamine. Of these, trialkylamines of 5 to 10 carbon atoms or alkylalcoholamines are preferable, and tri-n-pentylamine, diethanolamine, or stearyl diethanolamine is particularly desirable.

Examples of the cyclic amine include a heterocyclic compound containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amines include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine and tris[2-{2-(2-hydroxyethoxy)ethoxy}ethylamine.

Also, as the component (D), an aromatic amine can be used. Examples of the aromatic amine include aniline, pyridine, 4-dimethylaminopyridine, pyrol, indole, pyrazole, and imidazole, and derivatives thereof, diphenylamine, triphenylamine, and tribenzylamine.

These may be used either alone, or in combination of two or more different compounds.

The component (D) is typically used in a quantity within the range of 0.01 to 5.0 parts by weight, relative to 100 parts by weight of the component (A).

In the positive resist composition of the present invention, in order to prevent any deterioration in sensitivity, and improve the resist pattern shape and the post exposure stability of the latent image formed by the pattern-wise exposure of the resist layer, at least one compound (E) (hereinafter, referred to as component (E)) selected from the group consisting of organic carboxylic acids and phosphorus oxo acids or derivatives thereof may also be added as an optional component.

Suitable examples of organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly preferable.

Examples of phosphorus oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphate esters such as di-n-butyl phosphate and diphenyl phosphate.

Examples of phosphonic acid derivatives include phosphonate esters such as dimethyl phosphonate, di-n-butyl phosphonate, phenylphosphonic acid, diphenyl phosphonate and dibenzyl phosphonate.

Examples of phosphinic acid derivatives include phosphinic esters such as phenylphosphinic acid.

As the component (E), one type may be used alone, or two or more types may be used in combination.

The component (E) is typically used in a quantity within the range of 0.01 to 5.0 parts by weight, relative to 100 parts by weight of the component (A).

In the positive resist composition of the present invention, if desired, additives having miscibility, for example, additive resins for improving performance of a resist film, surfactants for improving coatability, dissolution inhibitors, plasticizers, stabilizers, colorants, antihalation agents, and dyes can be appropriately added.

<Organic Solvent (S)>

The positive resist composition of the present invention can be prepared by dissolving materials in an organic solvent (hereinafter, sometimes referred to as component (S)).

The component (S) may be an organic solvent which can dissolve the respective components used in the present invention to give a uniform solution, and one or more kinds of organic solvents can be used, appropriately selected from those which have been conventionally known as a solvent for a chemically-amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols such as ethylene glycol, diethylene glycol, propylene glycol, dipropylene glycol; derivatives of the polyhydric alcohols, including compounds having ester bonds such as ethylene glycol monoacetate, diethylene glycol monoacetate, propylene glycol monoacetate and dipropylene glycol monoacetate, and compounds having ether bonds such as monoalkyl ethers (for example, monomethyl ether, monoethyl ether, monopropyl ether and monobutyl ether) or monophenyl ethers of the above polyhydric alcohols or the above compounds having ester bonds (of these, propylene glycol monomethyl ether acetate (PGMEA) or propylene glycol monomethyl ether (PGME) is preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, ethyl ethoxypropionate; and aromatic organic solvents such as anisole, ethylbenzyl ether, cresylmethyl ether, diphenyl ether, dibenzyl ether, phenetole, butylphenyl ether, ethylbenzene, diethylbenzene, pentylbenzene, isopropylbenzene, toluene, xylene, cymene, and mesitylene.

These organic solvents may be used either alone, or as a mixed solvent of two or more different solvents.

Of these, propylene glycol monomethyl ether acetate (PGMEA), propylene glycol monomethyl ether (PGME) or EL is preferable.

Also, a mixed solvent obtained by mixing PGMEA and a polar solvent is preferable. The mixing ratio (mass ratio) of PGMEA to the polar solvent may be appropriately decided taking account of compatibility, and is preferably adjusted within the range of 1:9 to 9:1, and more preferably 2:8 to 8:2.

More specifically, in the case of using EL as the polar solvent, the mass ratio PGMEA:EL is preferably within the range of 1:9 to 9:1, and more preferably 2:8 to 8:2. Furthermore, in those cases of using PGME as the polar solvent, the mass ratio PGMEA:PGME is preferably within the range of 1:9 to 9:1, more preferably 2:8 to 8:2, and still more preferably 3:7 to 7:3.

Furthermore, as the component (S), mixed solvents of at least one of PGMEA and EL with γ-butyrolactone are also preferred. In such cases, the mass ratio of the former and latter components in the mixed solvents is preferably within the range of 70:30 to 95:5.

There is no particular restriction on the quantity of the component (S), and the quantity should be set in accordance with the required coating film thickness within a concentration that enables favorable application of the solution to a substrate or the like. Typically, the quantity is set so that the solid fraction concentration within the resist composition falls within the range of 2 to 20% by weight, and still more preferably 5 to 15% by weight.

The positive resist composition of the present invention is a novel resist composition which has not been known conventionally.

Also, according to the positive resist composition of the present invention, a resist pattern with excellent resolution and a reduced level of line edge roughness (LER) can be formed on a substrate.

Here, the term "LER" means roughness on the side wall surface of a resist pattern. LER can cause deterioration of a resist pattern shape, such as distortions around the holes in hole patterns and fluctuations in the line width in line and space patterns, and consequently has the potential to adversely affect the formation of very fine semiconductor elements. Therefore, the improvement of LER has conventionally been demanded.

Although the reasons why the above effects can be achieved by the present invention are not clear, it can be presumed to be due to the fact that, since the side chain portion of the structural unit (a0) has a long structure, and the oxygen atom (—O—) and the carbonyl group, which are electron attracting groups, are introduced into the side chain, the acid dissociable, dissolution inhibiting group at the terminals of the side chain dissociates readily, the dissociation efficiency is improved, and dissolution contrast in the very fine pattern is improved.

<<Method of Forming Resist Pattern>>

A method of forming a resist pattern of the present invention includes: forming a resist film on a substrate using the positive resist composition of the present invention described above; exposing the resist film; and developing the resist film to form a resist pattern.

The method of forming a resist pattern of the present invention can be performed, for example, in the following manner.

Namely, the positive resist composition described above is first applied to a substrate using a spinner or the like, a prebake (post apply bake (PAB)) is then conducted under temperature conditions of 80 to 150° C. for 40 to 120 seconds, and preferably for 60 to 90 seconds, followed by selective exposure of the thus obtained film with an ArF exposure apparatus or the like, by irradiating ArF excimer laser light through a desired mask pattern, and then PEB (post exposure baking) is conducted under temperature conditions of 80 to 150° C. for 40 to 120 seconds, and preferably for 60 to 90 seconds. Subsequently, a developing treatment is conducted using an alkali developing solution such as a 0.1 to 10% by mass aqueous solution of tetramethylammonium hydroxide (TMAH), preferably followed by rinsing with pure water, and drying. Also, according to circumstances, a bake treatment (post bake) may be conducted after the above developing treatment. In this manner, a resist pattern that is faithful to the mask pattern can be obtained.

The substrate is not specifically limited and a conventionally known substrate can be used. For example, substrates for electronic components, and such substrates having prescribed wiring patterns formed thereon can be used. Specific examples thereof include a silicon wafer; a substrate made of a metal such as copper, chromium, iron and aluminum; and a substrate made of glass. As materials for the wiring pattern, for example, copper, aluminum, nickel and gold can be used.

Further, as the substrate, any one of the above-mentioned substrates provided with an inorganic and/or organic film on the surface thereof may be used. As the inorganic film, an inorganic anti-reflection film (inorganic BARC) can be used. As the organic film, an organic anti-reflection film (organic BARC) can be used.

There is no particular restriction on the wavelength used for the exposure, and the exposure can be conducted using radiation such as ArF excimer lasers, KrF excimer lasers, $F_2$ excimer lasers, extreme ultraviolet rays (EUV), vacuum ultraviolet rays (VUV), electron beams (EB), X-rays, and soft X-rays. The resist composition is effective for KrF excimer lasers, ArF excimer lasers, EB and EUV, and particularly effective for ArF excimer lasers.

The exposure of the resist film may be a usual exposure (dry exposure) conducted in air or an inactive gas such as nitrogen gas, or may be an immersion exposure (liquid immersion lithography).

As described above, the immersion exposure is conducted under the condition where the region between a lens and a resist film on a wafer, conventionally filled with air or an inactive gas such as nitrogen gas in the usual exposure, is filled with a solvent (immersion solvent) that has a larger refractive index than the refractive index of air.

More specifically, the immersion exposure is performed in the following manner. First, the region between the resist film obtained in the above manner and the lens at the lowermost point of the exposure apparatus is pre-filled with a solvent (immersion solvent) that has a larger refractive index than the refractive index of air, and then, while maintaining such a condition, the exposure (immersion exposure) is conducted through the desired mask pattern.

The immersion solvent is preferably a solvent that has a refractive index larger than the refractive index of air but smaller than the refractive index of the resist film exposed by the immersion exposure. There is no particular restriction on the refractive index of the immersion solvent, as long as the solvent has a refractive index within the above range.

Examples of the solvent which has a refractive index larger than that of air but smaller than that of a resist film include water, a fluorine-based inactive liquid, a silicon-based solvent, and a hydrocarbon-based solvent.

Specific examples of the fluorine-based inactive liquid include a liquid which has a fluorine-based compound as a main component, such as $C_3HCl_2F_5$, $C_4F_9OCH_3$, $C_4F_9OC_2H_5$, and $C_5H_3F_7$. The fluorine-based inactive liquid preferably has a boiling point within the range of 70 to 180° C., and more preferably 80 to 160° C. If the fluorine-based inactive liquid has a boiling point within the above range, the solvent used for the immersion lithography can be removed by a convenient method after exposure, and consequently it is preferable.

The fluorine-based inactive liquid is particularly preferably a perfluoroalkyl compound in which all the hydrogen atoms of the alkyl groups are substituted with fluorine atoms. Examples of the perfluoroalkyl compounds include perfluoroalkylether compounds and perfluoroalkylamine compounds.

Specific examples of the perfluoroalkylether compounds include a perfluoro(2-butyl-tetrahydrofuran) (boiling point: 102° C.), and specific examples of the perfluoroalkylamine compounds include a perfluorotributylamine (boiling point: 174° C.).

The positive resist composition of the present invention can also be used in a double exposure method, and a double patterning method.

<<Polymeric Compound>>

The polymeric compound of the present invention contains a structural unit (a0) represented by the aforementioned general formula (a0-1).

The explanation of the polymeric compound of the present invention is the same as the explanation of the polymeric compound (A1) which is mentioned as the component (A) of the positive resist composition of the present invention.

As described above, the polymer compound (A1) can be obtained, for example, by a conventional radical polymerization or the like of the monomers corresponding with each of the intended structural units, using a radical polymerization initiator such as azobisisobutyronitrile (AIBN) and dimethyl-2,2'-diazobis(2-methylpropionate).

For example, as a monomer which derives the structural unit (a0), a compound (I) represented by the general formula (I) shown below can be used.

[Chemical Formula 47]

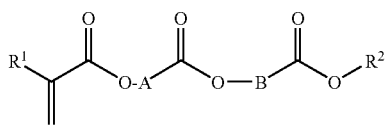

(In the Formula, $R^1$, A, B, and $R^2$ are as defined above.)

There is no particular restriction on the compound (1), and it can be manufactured using conventional methods.

For example, the compound (I) can be manufactured by the manufacturing method (I) shown below.

Manufacturing method (1): a manufacturing method including the steps of: reacting a compound (hereinafter, referred to as compound (I-1)) represented by the general formula (I-1) shown below with a compound (hereinafter, referred to as compound (I-2)) represented by the general formula (I-2) shown below, thereby obtaining a compound (hereinafter, referred to as compound (I-3)) represented by the general formula (I-3) shown below (hereinafter, referred to as "first step"); and reacting the compound (I-3) with a compound (hereinafter, referred to as compound (I-4)) represented by the general formula (I-4) shown below, thereby obtaining the compound (I) (hereinafter, referred to as "second step").

[Chemical Formula 48]

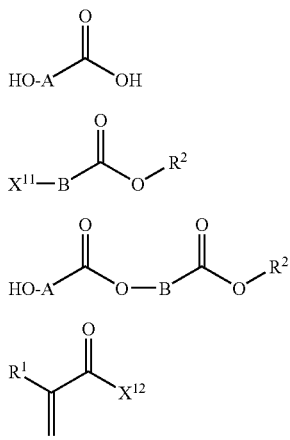

(In the formulae, $R^1$ represents a hydrogen atom, a lower alkyl group or a halogenated lower alkyl group; A represents a bivalent linking group; B represents a bivalent linking group; $R^2$ represents an acid dissociable, dissolution inhibiting group; and $X^{11}$ and $X^{12}$ each independently represents a halogen atom.)

$R^1$, A, B, and $R^2$ in the above formulae (1-1) to (1-4) are the same as $R^1$, A, B, and $R^2$ described above in the general formula (1).

$X^{11}$ and $X^{12}$ each independently represents a halogen atom. Examples of the halogen atom include a bromine atom, a chlorine atom, an iodine atom, and a fluorine atom.

The halogen atom for $X^1$ or $X^{12}$ is preferably a chlorine atom or a bromine atom, because it excels in reactivity.

[First Step]

The compounds (I-1) and (I-2) can be reacted by using conventional methods. Examples thereof include a method of contacting the compound (I-1) and (I-2) in the presence of a base in a reaction solvent. The method can be performed, for example, by adding the compound (I-2) to a solution in which the compound (I-1) is dissolved in the reaction solvent in the presence of a base.

As the compounds (I-1) and (I-2), a commercially available compound may be used, or a compound obtained by synthesis may be used.

Examples of the compound (I-2) include 2-methyl-2-adamantyloxycarbonylmethyl chloride, 2-ethyl-2-adamantyloxycarbonylmethyl chloride, 1-methyl-1-cyclohexyloxycarbonylmethyl chloride, 1-ethyl-1-cyclohexyloxycarbonylmethyl chloride, 1-methyl-1-cyclopentyloxycarbonylmethyl chloride, and 1-ethyl-1-cyclopentylcarbonylmethyl chloride.

There is no particular restriction on the reaction solvent as long as it can dissolve the compounds (I-1) and (I-2) as the materials, and examples of the reaction solvent include tetrahydrofuran (THF), acetone, dimethylformamide (DMF), dimethylacetoamide, dimethylsulfoxide (DMSO), and acetonitrile.

Examples of the base include inorganic bases such as sodium hydroxide and $K_2CO_3$; and organic bases such as triethylamine, 4-dimethylaminopyridine (DMAP), and pyridine.

In the first step, $K_2CO_3$ is particularly preferably used.

The amount of the compound (I-2) added is preferably within the range of 1 to 100 mol, and more preferably 1 to 50 mol, per 1 mol of the compound (I-1).

The reaction temperature is preferably within the range of 0 to 50° C., and more preferably 5 to 40° C.

The reaction time depends on the reactivity of the compounds (I-1) and (I-2), the reaction temperature or the like, but usually it is preferably 1 to 24 hours, and more preferably 3 to 12 hours.

After the reaction, the reaction solution may be used as it is in the following step, or the compound (I-3) in the reaction solution may be isolated and purified. Conventional methods can be used for the isolation and purification, and for example, concentration, solvent extraction, crystallization, recrystallization, chromatography, or the like can be used alone, or two or more types of these can be used in combination.

[Second Step]

There is no particular restriction on the method of reacting the compounds (I-3) and (I-4), and examples thereof include a method of adding the compound (I-4) to a solution in which the compound (I-3) obtained by the first step is dissolved in the presence of a base.

As the solution in which the compound (I-3) is dissolved, the reaction solution obtained by the first step may be used as it is, or a solution in which the compound (I-3) isolated and purified from the reaction solution is dissolved in a reaction solvent may be used.

There is no particular restriction on the reaction solvent as long as it can dissolve the compound (I-3) as the material, and examples thereof include the same reaction solvents as those described above in the first step.

As the base, the same bases as those described above in the first step can be used. In the second step, triethylamine is particularly preferably used.

The amount of the compound (I-4) added is preferably within the range of 1 to 2 mol, and more preferably 1 to 1.5 mol, per 1 mol of the compound (I-3).

The reaction temperature is preferably within the range of 0 to 50° C., more preferably 5 to 40° C., and it is most preferable to be reacted at room temperature.

The reaction time depends on the reactivity of the compounds (I-3) and (I-4), the reaction temperature or the like, but usually it is preferably 1 to 24 hours, and more preferably 3 to 12 hours.

After the reaction, the compound (I) in the reaction solution may be isolated and purified. Conventional methods can be used for the isolation and purification, and for example, concentration, solvent extraction, crystallization, recrystallization, chromatography, or the like can be used alone, or two or more types of these can be used in combination.

The structure of the compound obtained through the above steps can be confirmed by a general organic analysis method such as a $^1$H-NMR (nuclear magnetic resonance) spectrum method, a $^{13}$C-NMR spectrum method, a $^{19}$F-NMR spectrum method, an IR (infrared resonance) spectrum method, a MS (mass spectrometry) method, an element analysis, and an X-ray crystallographic analysis.

The polymeric compound (A1) of the present invention is a novel compound which has not been known conventionally If the polymeric compound (A1) is blended, for example, in a positive resist composition together with an acid generator component (B) which generates an acid upon exposure, the bond between $R^2$ in the structural unit (a0) and the oxygen atom bonded thereto is cleaved when an acid is generated from the acid generator component (B) upon exposure, and consequently $R^2$ dissociates. As a result, the solubility of the polymeric compound (A1) in an alkali developing solution is increased.

Therefore, the polymeric compound (A1) is useful as a base resin in a chemically-amplified positive resist composition, and can be suitably used as the base component (A) in the positive resist composition of the present invention.

EXAMPLES

Next, the present invention will be described in more detail with reference to examples, but the scope of the present invention is not limited to the following examples.

Synthesis Example 1

Synthesis of 2-(2-(2-methyl-2-adamantyloxy)-2-oxoethoxy)-2-oxoethanol 37.6 g (494 mmol) of glycolic acid, 700 mL of DMF, 86.5 g (626 mmol) of potassium carbonate, and 28.3 g (170 mmol) of potassium iodide were added to a 2 L three-neck flask equipped with a thermometer, a cooling pipe, and a stirring apparatus, and then stirred for 30 minutes at room temperature. Subsequently, a solution of 300 mL of dimethylformaldehyde with 100 g (412 mmol) of 2-methyl-2-adamantyl chloroacetate was gradually added thereto. Then, the resultant was heated at 40° C., and stirred for 4 hours. After the reaction, 2,000 mL of diethylether was added thereto and filtrated, thereby obtaining the solution (filtrate). The solution thus obtained was washed three times using 500 mL of distilled water. Thereafter, crystallization was conducted using a mixture solvent of 300 mL of toluene and 200 mL of heptane, thereby obtaining 78 g of the intended compound in the form of a colorless solid (yield: 67%, GC purity: 99%).

The results of instrumental analysis of the compound thus obtained are as described below.

$^1$H-NMR: 1.59 (d, 2H, J=12.5 Hz), 1.64 (s, 3H), 1.71-1.99 (m, 10H), 2.29 (m, 2H), 2.63 (t, 1H, J=5.2 Hz), 4.29 (d, 2H, J=5.2 Hz), 4.67 (s, 2H).

$^{13}$C-NMR: 22.35, 26.56, 27.26, 32.97, 34.54, 36.29, 38.05, 60.54, 61.50, 89.87, 165.97, 172.81.

GC-MS: 282 (M$^+$, 0.02%), 165 (0.09%), 149 (40%), 148 (100%), 133 (22%), 117 (2.57%), 89 (0.40%).

From the above results, it was confirmed that the compound thus obtained was 2-(2-(2-methyl-2-adamantyloxy)-2-oxoethoxy)-2-oxoethanol.

Synthesis Example 2

Synthesis of 2-(2-(2-methyl-2-adamantyloxy)-2-oxoethoxy)-2-oxoethyl methacrylate (compound 3)

165 g (584 mmol) of 2-(2-(2-methyl-2-adamantyloxy)-2-oxoethoxy)-2-oxoethanol, 2,000 mL of THF, 105 mL (754 mmol) of triethylamine, and 0.165 g (1,000 ppm) of p-methoxyphenol were added to and dissolved in a 2 L three-neck flask equipped with a thermometer, a cooling pipe, and a stirring apparatus. After the dissolution, 62.7 mL (648 mmol) of methacryloyl chloride was gradually added thereto in an ice bath. Then, the resultant was heated at room temperature, and stirred for 3 hours. After the reaction, 1,000 mL of diethylether was added thereto, and then washed 5 times using 200 mL of distilled water. The extraction liquid was concentrated, thereby obtaining 198 g of the intended compound in the form of a colorless liquid (yield: 97%, GC purity: 99%).

The results of instrumental analysis of the compound 3 thus obtained are as described below.

$^1$H-NMR: 1.58 (d, J=12.5 Hz, 2H), 1.63 (s, 3H), 1.71-1.89 (m, 8H), 1.98 (s, 3H), 2.00 (m, 2H), 2.30 (m, 2H), 4.62 (s, 2H), 4.80 (s, 2H), 5.66 (m, 1H), 6.23 (m, 1H).

$^{13}$C-NMR: 18.04, 22.15, 26.42, 27.14, 32.82, 34.38, 36.11, 37.92, 60.44, 61.28, 89.42, 126.79, 135.18, 165.61, 166.30, 167.20.

GC-MS: 350 (M$^+$, 1.4%), 206 (0.13%), 149 (47%), 148 (100%), 133 (20%), 69 (37%).

Manufacturing Example 1

Synthesis of Polymeric Compound (1)

21.49 g (126.41 mmol) of the [compound 1] shown below, 14.76 g (50.56 mmol) of the [compound 2] shown below, 17.70 g (50.56 mmol) of the [compound 3] shown below which was obtained by the aforementioned Synthesis Example 2, and 5.97 g (25.28 mmol) of the [compound 4] shown below were added to a 500 mL beaker, and then they were dissolved in 239.68 g of methyl ethyl ketone. 12.6 mmol of dimethyl azobisisobutyrate (V-601) was added as a radical polymerization initiator to the resulting solution, and was dissolved. The reaction solution was dropwise added to 99.87 g of methyl ethyl ketone heated at 75° C. in a separable flask for 6 hours under a nitrogen atmosphere. After the dropwise adding treatment, the reaction solution was stirred on heating for 1 hour, and then cooled to room temperature. The reaction polymerization solution thus obtained was concentrated under reduced pressure, and dropwise added to a large amount of a mixed solution of methanol and water. Then, the operation of precipitating the reaction product (copolymer) was conducted, and the precipitated reaction product was separated by filtration, washed, and then dried, thereby obtaining 35 g of the intended polymeric compound (1).

[Chemical Formula 49]

[compount 1]
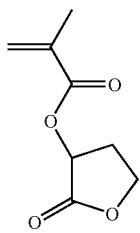

[compound 2]
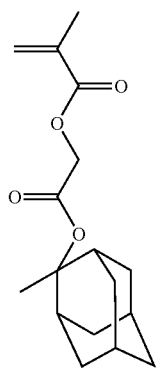

[compound 3]
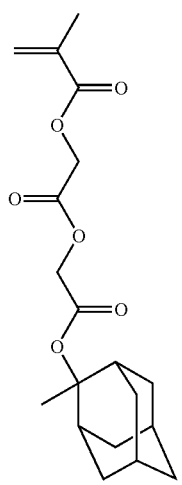

[compound 4]
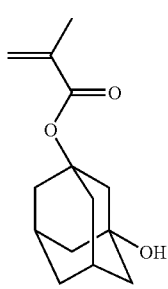

polymeric compound (1)
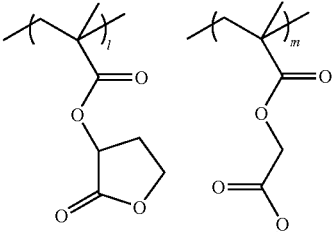
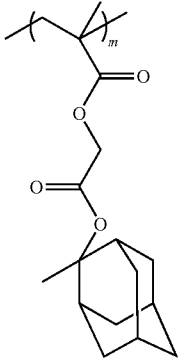
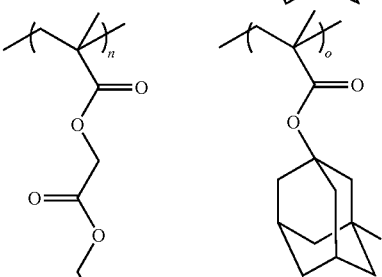
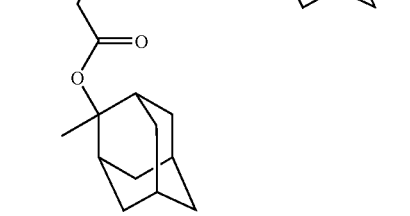

With respect to the polymeric compound (1), the polystyrene equivalent weight average molecular weight (Mw) measured by gel permeation chromatography (GPC) was 13,200, and the dispersity (Mw/Mn) was 2.29.

As a result of measuring the carbon 13 nuclear magnetic resonance spectrum at 600 MHz (600 MHz $^{13}$C-NMR), the formulation of the copolymer (the proportion (molar ratio) of each structural unit in the aforementioned formula) was l/m/n/o=50.7/21.5/18.1/9.7.

Manufacturing Example 2

Synthesis of Polymeric Compound (2)

18.05 g (106.17 mmol) of the [compound 1] shown above, 20.06 g (80.89 mmol) of the [compound 5] shown below, 15.04 g (42.97 mmol) of the [compound 3] shown above, and 5.37 g (22.75 mmol) of the [compound 4] shown above were added to a 500 mL beaker, and then dissolved in 234.08 g of methyl ethyl ketone. 17.7 mmol of dimethyl azobisisobutyrate (V-601) was added as a radical polymerization initiator to the resulting solution, and was dissolved. The reaction solution was dropwise added to 97.53 g of methyl ethyl ketone heated at 75° C. in a separable flask for 6 hours under a nitrogen atmosphere. After the dropwise adding treatment, the reaction solution was stirred on heating for 1 hour, and then cooled to room temperature. The reaction polymerization solution thus obtained was concentrated under reduced pressure, and dropwise added to a large amount of a mixed solution of methanol and water. Then, the operation of precipitating the reaction product (copolymer) was conducted, and the precipitated reaction product was separated by filtration, washed, and then dried, thereby obtaining 35 g of the intended polymeric compound (2).

[Chemical Formula 50]

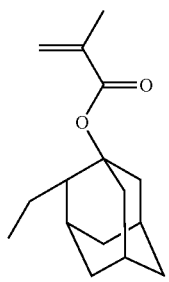

[compound 5]

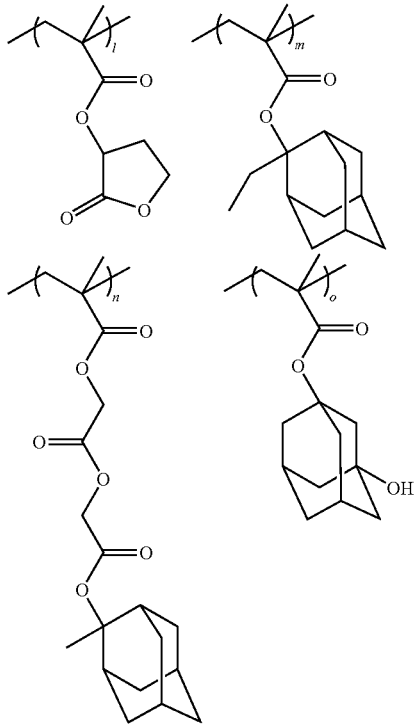

polymeric compound (2)

With respect to the polymeric compound (2), the polystyrene equivalent weight average molecular weight (Mw) measured by gel permeation chromatography (GPC) was 8,900, and the dispersity (Mw/Mn) was 1.95.

As a result of measuring the carbon 13 nuclear magnetic resonance spectrum at 600 MHz (600 MHz_$^{13}$C-NMR), the formulation of the copolymer (the proportion (molar ratio) of each structural unit in the aforementioned formula) was l/m/n/o=52.4/19.6/18.7/9.4.

Manufacturing Example 3

Synthesis of Polymeric Compound (3)

18.05 g (106.17 mmol) of the [compound 1] shown above, 20.06 g (80.89 mmol) of the [compound 5] shown above, 15.04 g (42.97 mmol) of the [compound 3] shown above, and 5.37 g (22.75 mmol) of the [compound 4] shown above were added to 500 mL beaker, and then dissolved in 234.08 g of methyl ethyl ketone. 41.7 mmol of dimethyl azobisisobutyrate (V-601) was added as a radical polymerization initiator to the resulting solution, and was dissolved. The reaction solution was dropwise added to 97.53 g of methyl ethyl ketone heated at 75° C. in a separable flask for 6 hours under a nitrogen atmosphere. After the dropwise adding treatment, the reaction solution was stirred on heating for 1 hour, and then cooled to room temperature. The reaction polymerization solution thus obtained was concentrated under reduced pressure, and dropwise added to a large amount of a mixed solution of methanol and water. Then, the operation of precipitating the reaction product (copolymer) was conducted, and the precipitated reaction product was separated by filtration, washed, and then dried, thereby obtaining 30 g of the intended polymeric compound (3).

[Chemical Formula 51]

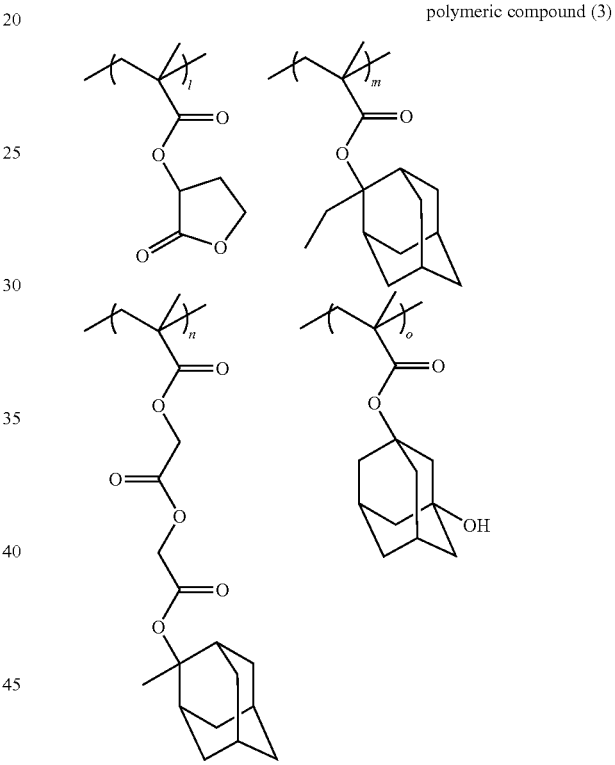

polymeric compound (3)

With respect to the polymeric compound (3), the polystyrene equivalent weight average molecular weight (Mw) measured by gel permeation chromatography (GPC) was 4,200, and the dispersity (Mw/Mn) was 1.31.

As a result of measuring the carbon 13 nuclear magnetic resonance spectrum at 600 MHz (600 MHz_$^{13}$C-NMR), the formulation of the copolymer (the proportion (molar ratio) of each structural unit in the aforementioned formula) was l/m/n/o=50.5/17.7/21.4/10.4.

Manufacturing Example 4

Synthesis of Polymeric Compound (4)

13.29 g (78.18 mmol) of the [compound 1] shown above, 21.89 g (62.54 mmol) of the [compound 3] shown above, and 3.69 g (15.64 mmol) of the [compound 4] shown above were added to 500 mL beaker, and then dissolved in 58.31 g of methyl ethyl ketone. 17.0 mmol of dimethyl azobisisobutyrate (V-601) was added as a radical polymerization initiator to the resulting solution, and was dissolved. The reaction solution was dropwise added to 32.39 g of methyl ethyl ketone heated at 80° C. in a separable flask for 3 hours under a nitrogen atmosphere. After the dropwise adding treatment, the reaction solution was stirred on heating for 4 hour, and then cooled to room temperature. The reaction polymerization solution thus obtained was concentrated under reduced pressure, and dropwise added to a large amount of a mixed solution of methanol and water. Then, the operation of precipitating the reaction product (copolymer) was conducted, and the precipitated reaction product was separated by filtration, washed, and then dried, thereby obtaining 30 g of the intended polymeric compound (4).

[Chemical Formula 52]

polymeric compound (4)

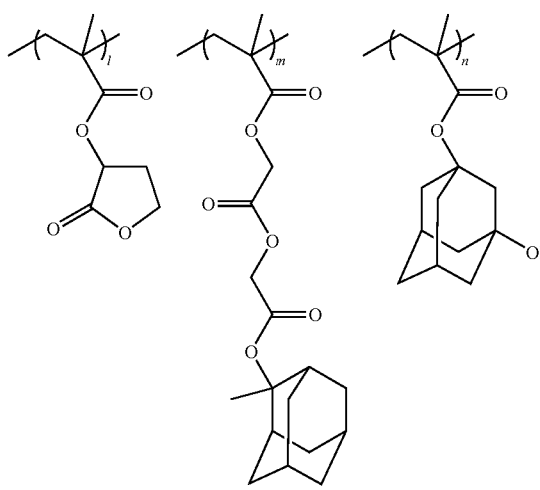

With respect to the polymeric compound (4), the polystyrene equivalent weight average molecular weight (Mw) measured by gel permeation chromatography (GPC) was 8,200, and the dispersity (Mw/Mn) was 1.68.

As a result of measuring the carbon 13 nuclear magnetic resonance spectrum at 600 MHz (600 MHz_$^{13}$C-NMR), the formulation of the copolymer (the proportion (molar ratio) of each structural unit in the aforementioned formula) was l/m/n=50.9/39.1/10.0.

Synthesis Example 3

Synthesis of Compound (II)

(i)

150 g of methyl fluorosulfonyl(difluoro)acetate and 375 g of pure water were maintained at 10° C. or lower in an ice bath, and 343.6 g of a 30% aqueous solution of sodium hydroxide was dropwise added thereto. Then, the resultant was refluxed at 100° C. for 3 hours, followed by cooling and neutralizing with concentrated hydrochloric acid. The resulting solution was dropwise added to 8,888 g of acetone, and the precipitate was collected by filtration and dried, thereby obtaining 184.5 g of the compound (I) shown below in the form of a white solid (purity: 88.9%, yield: 95.5%).

[Chemical Formula 53]

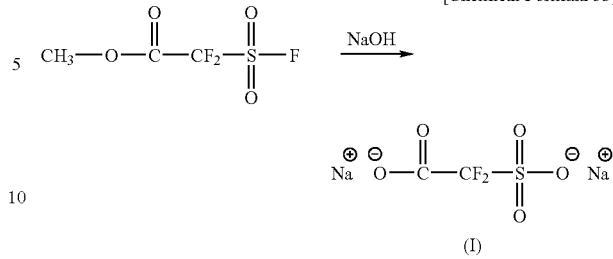

(ii)

56.2 g of the compound (1) and 562.2 g of acetonitrile were prepared, and 77.4 g of p-toluenesulfonic acid monohydrate was added thereto. The resultant was refluxed at 110° C. for 3 hours. Then, the reaction solution was filtered, and the filtrate was concentrated and dried to obtain a solid. 900 g of t-butyl methyl ether was added to the obtained solid and stirred.

Thereafter, the resultant was filtered, and the residue was dried, thereby obtaining 22.2 g of a compound (II) shown below in the form of a white solid (purity: 91.0%, yield: 44.9%).

[Chemical Formula 54]

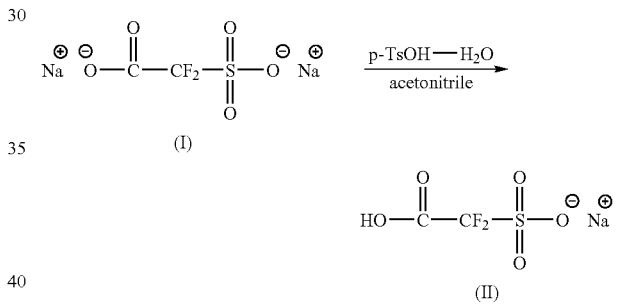

Synthesis Example 4

Synthesis of Compound (VI)

(i)

4.34 g of the aforementioned compound (II) (purity: 94.1%), 3.14 g of 2-benzyloxyethanol, and 43.4 g of toluene were prepared, and 0.47 g of p-toluenesulfonic acid monohydrate was added thereto. Then, the resultant was refluxed at 105° C. for 20 hours. The reaction solution was filtrated, and 20 g of hexane was added to the residue. Then, the resultant was stirred. The resultant was filtrated once more, and then the residue thus obtained was dried, thereby obtaining 1.41 g of the compound (III) shown below (yield: 43.1%).

[Chemical Formula 55]

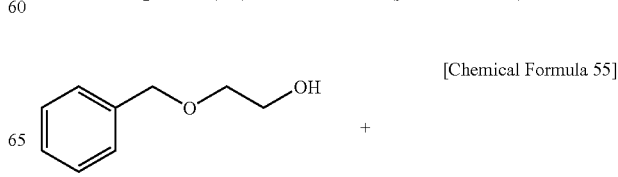

-continued

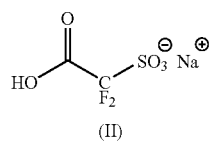
(II)

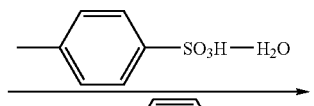

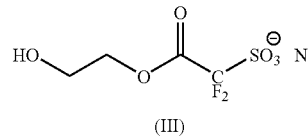
(III)

(ii)

0.82 g of 1-adamantanecarbonyl chloride and 0.397 g of triethylamine were dropwise added to 1.00 g of the aforementioned compound (III) and 3.00 g of acetonitrile in an ice bath. After the dropwise addition, the solution was stirred for 20 hours at room temperature, and then filtrated. The filtrate was concentrated and dried, then dissolved in 30 g of dichloromethane, and washed with water three times. The organic layer was concentrated and dried, thereby obtaining 0.82 g of the compound (IV) shown below (yield: 41%).

[Chemical Formula 56]

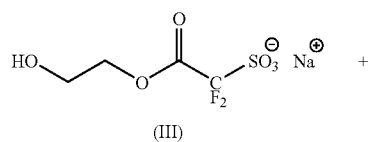
(III)

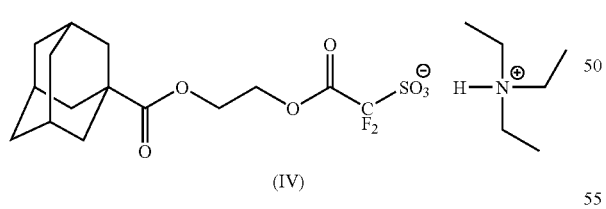
(IV)

(iii)

0.384 g of the compound (V) shown below was dissolved in 3.84 g of dichloromethane and 3.84 g of water, and then 0.40 g of the aforementioned compound (IV) was added thereto. The resultant was stirred for 1 hour, and then the organic layer was collected by fractionation. The organic layer was washed three times with 3.84 g of water. The organic layer thus obtained was concentrated and dried, thereby obtaining 0.44 g of the compound (VI) shown below (yield: 81.5%).

[Chemical Formula 57]

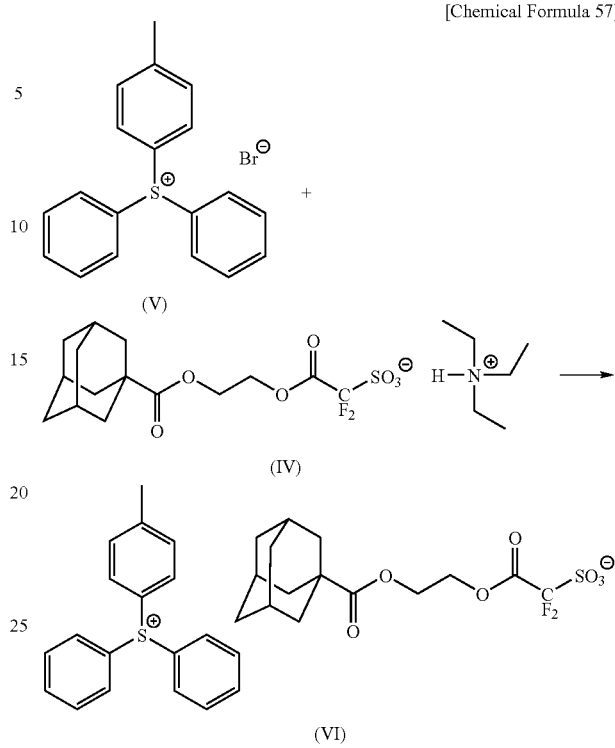

Synthesis Example 5

Synthesis of Compound (IX)

(i)

17.7 g of the aforementioned compound (II) (purity: 91.0%), 13 g of the compound (VII) shown below, and 88.3 g of toluene were prepared, and then 5.85 g of p-toluenesulfonic acid monohydrate was added thereto. The resultant was refluxed at 130° C. for 26 hours. Thereafter, the resultant was filtrated, and then 279.9 g of methyl ethyl ketone was added to the residue and stirred. Subsequently, the resultant was filtrated, and then 84.0 g of methanol was added the residue and stirred. The resultant was filtrated once more, and the residue was dried, thereby obtaining 20.2 g of the compound (VIII) shown below in the form of a white solid (purity: 99.9%, yield: 72.1%).

[Chemical Formula 58]

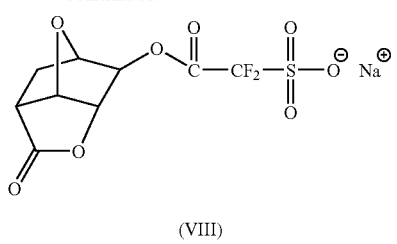

(VIII)

(ii)

15.0 g of the compound (VIII) obtained in the aforementioned step (i) (purity: 99.9%) was dissolved in 66.4 g of pure water. 13.3 g of 4-methyltriphenylsulfonium bromide dissolved in 132.8 g of dichloromethane was added to the above solution, and stirred for 3 hours at room temperature. The organic layer was then collected by fractionation. The organic layer was washed with 66.4 g of pure water, and then concentrated and dried, thereby obtaining 20.2 g of the intended compound (IX) in the form of a colorless viscous liquid (yield: 88.1%).

[Chemical Formula 59]

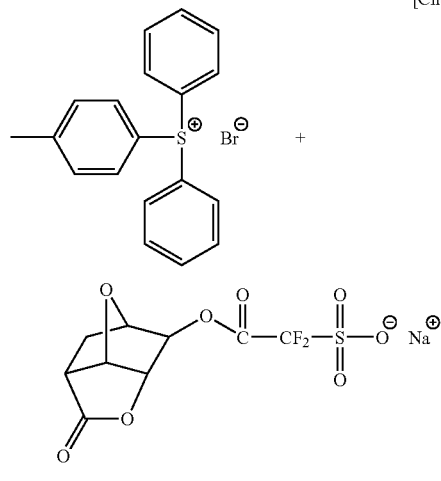

Synthesis Example 6

Synthesis of Compound (XII)

(i)

5.00 g of the aforementioned compound (II) (purity: 91.0%), 4.80 g of the compound (X) shown below, and 25.0 g of toluene were prepared, and then 0.935 g of p-toluenesulfonic acid monohydrate was added thereto. The resultant was refluxed at 110° C. for 26 hours. Then, the steps of filtering the resultant, adding 25.0 g of toluene to the residue, stirring the solution thus obtained at room temperature for 10 minutes, and filtering the solution were conducted twice, thereby obtaining a white powder. The white powder was dried under diminished pressure overnight. The next day, 5 g of acetone was added to the white powder, stirred for 15 minutes at room temperature, and then filtrated to obtain a filtrate. The filtrate thus obtained was gradually dropwise added to 25.0 g of t-butyl ethyl ether (TBME) and 25.0 g of dichloromethane. The precipitated solid was collected by filtration and then dried, thereby obtaining 5.89 g of the compound (XI) shown below in the form of a white powder (purity: 98.4%, yield: 68.1%).

[Chemical Formula 60]

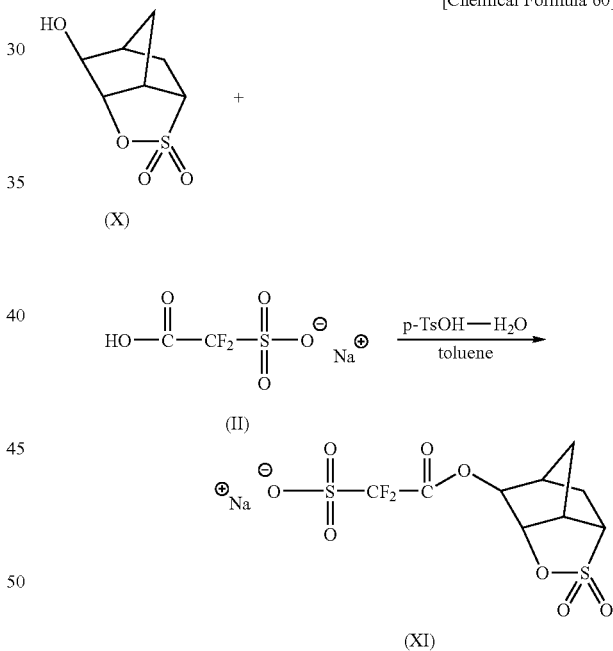

(ii)

3.21 g of the aforementioned compound (XI) was dissolved in 32.1 g of pure water, 3.72 g of 4-methyltriphenylsulfonium bromide was added thereto, and then 32.1 g of methylene chloride was added thereto. The resultant was stirred for 1 hour at room temperature. Thereafter, the organic layer was collected by fractionation. The organic layer was washed three times with a 1% by weight aqueous solution of HCl, and then washed four times with pure water. Thereafter, the organic layer was concentrated, thereby obtaining 4.94 g of the compound (XII) shown below in the form of a white solid (purity: 98.8%, yield: 86.8%).

[Chemical Formula 61]

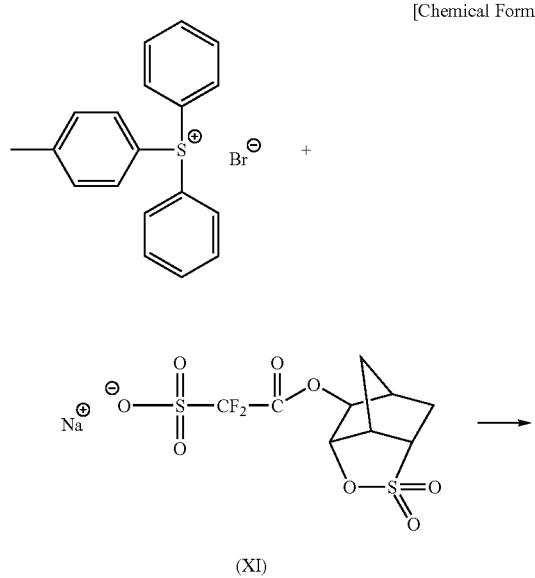

(XI)

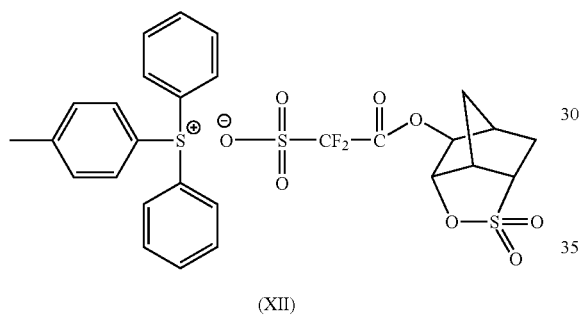

(XII)

Synthesis Example 7

Synthesis of Compound (XVI)

(i)

8.53 g of phosphorus oxide, 8.81 g of 2,5-dimethylphenol, and 12.2 g of diphenylsulfoxide were gradually added to 60.75 g of methanesulfonic acid which is controlled at 20° C. or lower. While the temperature was controlled at 15° C. to 20° C., the solution obtained above was matured for 30 minutes. Then, the temperature was raised to 40° C., and the solution was matured for 2 hours. Thereafter, the reaction solution was dropwise added to 109.35 g of pure water cooled at 15° C. or lower. After the dropwise addition, 54.68 g of dichloromethane was added to the solution. Then, the solution obtained was stirred, and the dichloromethane layer was collected.

386.86 g of hexane at 20° C. to 25° C. was prepared in another container, and the dichloromethane layer collected above was dropwise added thereto. After the dropwise addition, the solution was matured for 30 minutes at 20 to 25° C., and then filtration was conducted, thereby obtaining 17.14 g of the intended compound (XIII) (yield: 70.9%).

[Chemical Formula 62]

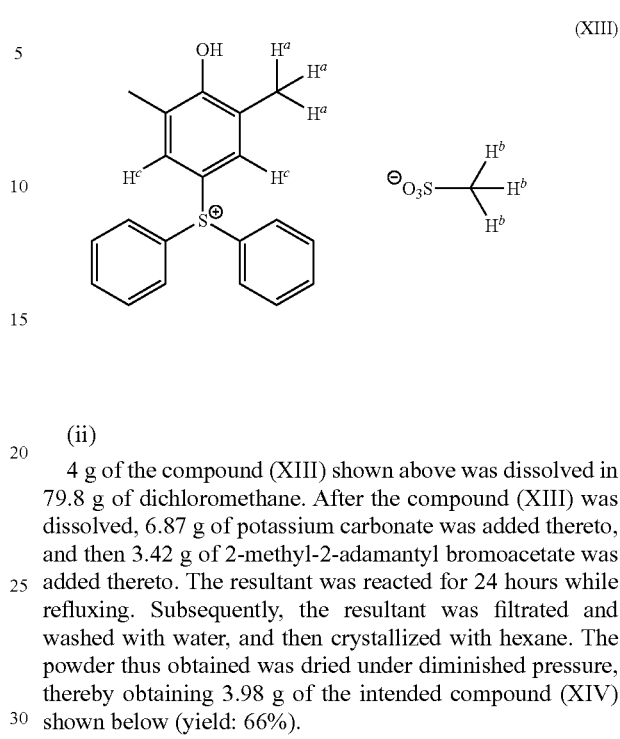

(XIII)

(ii)

4 g of the compound (XIII) shown above was dissolved in 79.8 g of dichloromethane. After the compound (XIII) was dissolved, 6.87 g of potassium carbonate was added thereto, and then 3.42 g of 2-methyl-2-adamantyl bromoacetate was added thereto. The resultant was reacted for 24 hours while refluxing. Subsequently, the resultant was filtrated and washed with water, and then crystallized with hexane. The powder thus obtained was dried under diminished pressure, thereby obtaining 3.98 g of the intended compound (XIV) shown below (yield: 66%).

[Chemical Formula 63]

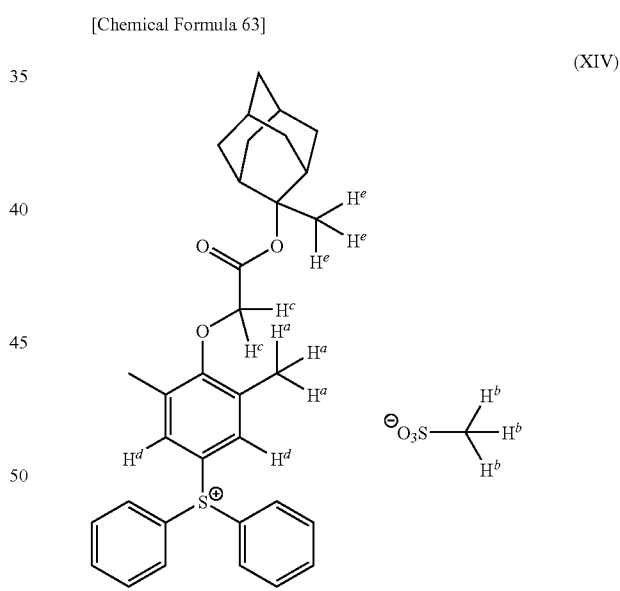

(XIV)

(iii)

4.77 g of the aforementioned compound (XIV) was dissolved in 23.83 g of dichloromethane and 23.83 g of water, and then 3.22 g of the compound (XV) was added thereto. The resultant was stirred for 1 hour, and then the organic layer was collected by fractionation. The organic layer was washed three times with 3.84 g of water. The organic layer thus obtained was concentrated and dried, thereby obtaining 4.98 g of the compound (XVI) shown below (yield: 87%).

[Chemical Formula 64]

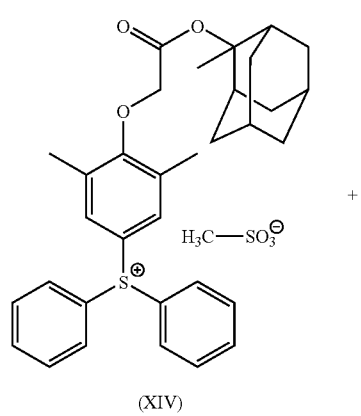

(XIV)

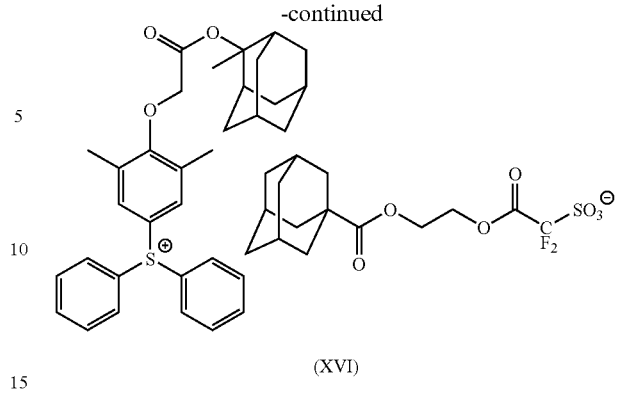

(XVI)

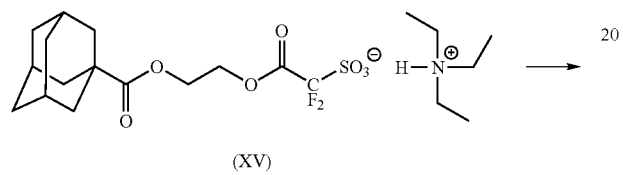

(XV)

Examples 1 to 18, and Comparative Examples 1 to 3

The components shown in Table 1 were mixed and dissolved, thereby providing positive resist compositions.

TABLE 1

|  | Formulation (parts by weight) | | | | Target size (nm) | Sensitivity | |
| --- | --- | --- | --- | --- | --- | --- | --- |
|  | Component (A) | Component (B) | Component (D) | Component (S) | (hole diameter/pitch) | (mJ/cm$^2$) | Shape |
| Example 1 | (A)-1 [100] | (B)-1 [3] | (D)-1 [0.3] | (S)-1 [2200] | 70/131 | 63 | A |
| Example 2 | (A)-1 [100] | (B)-1 [5] | (D)-1 [0.3] | (S)-1 [2200] | 70/131 | 34 | A |
| Example 3 | (A)-1 [100] | (B)-1 [8] | (D)-1 [0.3] | (S)-1 [2200] | 70/131 | 21 | A |
| Example 4 | (A)-1 [100] | (B)-2 [4.48] | (D)-1 [0.3] | (S)-1 [2200] | 70/131 | 49 | A |
| Example 5 | (A)-1 [100] | (B)-3 [4.74] | (D)-1 [0.3] | (S)-1 [2200] | 70/131 | 53 | A |
| Example 6 | (A)-1 [100] | (B)-1 [3] | (D)-1 [0.3] | (S)-1 [2200] | 70/113 | 45 | A |
| Example 7 | (A)-1 [100] | (B)-1 [5] | (D)-1 [0.3] | (S)-1 [2200] | 70/113 | 22 | A |
| Example 8 | (A)-1 [100] | (B)-1 [8] | (D)-1 [0.3] | (S)-1 [2200] | 70/113 | 14 | A |
| Example 9 | (A)-2 [100] | (B)-1 [11] | (D)-1 [0.3] | (S)-1 [2200] | 70/131 | 16 | A |
| Example 10 | (A)-2 [100] | (B)-1 [11] | (D)-1 [0.5] | (S)-1 [2200] | 70/131 | 20 | A |
| Example 11 | (A)-2 [100] | (B)-1 [8] | (D)-1 [0.5] | (S)-1 [2200] | 70/131 | 28 | A |
| Example 12 | (A)-2 [100] | (B)-1 [11] | (D)-1 [0.5] | (S)-1 [2200] | 70/113 | 13 | A |
| Example 13 | (A)-2 [100] | (B)-1 [8] | (D)-1 [0.5] | (S)-1 [2200] | 70/113 | 18 | A |
| Example 14 | (A)-2 [100] | (B)-1 [8] | (D)-1 [0.5] | (S)-1 [2200] | 70/113 | 18 | A |
| Example 15 | (A)-3 [100] | (B)-4 [11] | (D)-1 [0.5] | (S)-2 [2200] | 70/113 | 25 | A |
| Example 16 | (A)-2 [100] | (B)-4 [15] | (D)-1 [0.5] | (S)-1 [2200] | 70/113 | 18 | A |
| Example 17 | (A)-2 [100] | (B)-4 [15] | (D)-1 [0.7] | (S)-1 [2200] | 70/113 | 23 | A |
| Example 18 | (A)-2 [100] | (B)-5 [4.67] | — | (S)-1 [2200] | 130/260 | 7 | A |
| Comparative Example 1 | (A')-1 [100] | (B)-2 [10] | (D)-1 [0.24] | (S)-1 [2200] | 70/131 | 40 | B |
| Comparative Example 2 | (A')-1 [100] | (B)-2 [10] | (D)-1 [0.24] | (S)-1 [2200] | 70/113 | 27 | C |
| Comparative Example 3 | (A')-2 [100] | (B)-5 [4.67] | — | (S)-1 [2200] | 130/260 | 30 | B |

In Table 1, the values within the brackets [ ] mean the blending amount (parts by weight). Also, the meanings of the abbreviations in Table 1 are described below. Here, the term "–" in Table 1 means that nothing was blended.

(A)-1: the polymeric compound (1)

(A)-2: the polymeric compound (2)

(A)-3: the polymeric compound (3)

(A')-1: a copolymer represented by the formula (A)-4 shown below (in the formula, l/m/n=40/40/20 (molar ratio)) (weight average molecular weight (Mw)=10,000, dispersity (Mw/Mn)=2.0)

(A')-2: a copolymer represented by the formula (A)-5 shown below (in the formula, l/m/n=40/40/20 (molar ratio)) (weight average molecular weight (Mw)=10,000, dispersity (Mw/Mn)=2.0)

(B)-1: the aforementioned compound (VI)

(B)-2: the aforementioned compound (IX)

(B)-3: the aforementioned compound (XII)

(B)-4: the aforementioned compound (XVI)

(B)-5: 4-methylphenyldiphenylsulfonium nonafluoro-n-butanesulfonate (D)-1: stearyl diethanolamine (S)-1: a mixture solvent of PGMEA/PGME=6/4 (mass ratio)

(S)-2: PGMEA

[Chemical Formula 65]

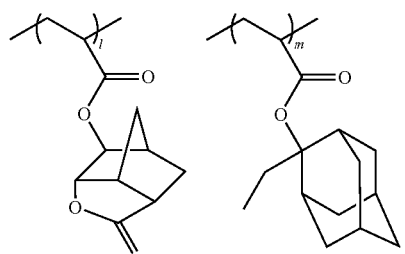

(A)-4

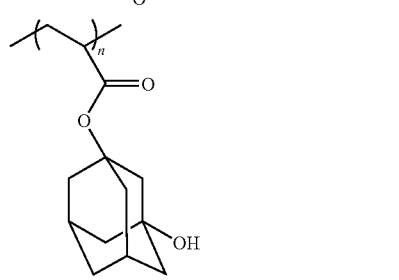

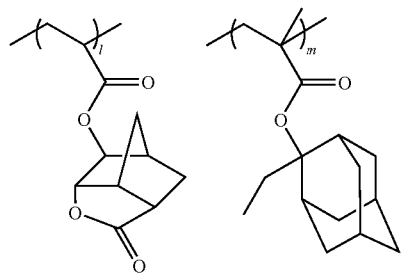

(A)-5

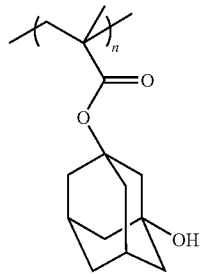

-continued

Resist patterns were formed by the following procedure using the resist composition solutions thus obtained, and lithography properties were evaluated.

[Resolution and Sensitivity (1)]

An organic anti-reflection film composition (product name: ARC-29, manufactured by Brewer Science Ltd.) was applied onto a 12-inch silicon wafer using a spinner, and the composition was then baked at 205° C. for 60 seconds, thereby forming an organic anti-reflection film having a film thickness of 89 nm. Then, each of the positive resist composition solutions of Examples 1 to 17 and Comparative Examples 1 and 2 obtained above was applied onto the anti-reflection film using a spinner, and was then prebaked (PAB) on a hotplate at 90° C. for 60 seconds and dried, thereby forming a resist film having a film thickness of 120 nm.

Subsequently, a coating solution for forming a protection film (product name: TSRC-002; manufactured by Tokyo Ohka Kogyo Co., Ltd.) was applied onto the resist film using a spinner, and then heated at 90° C. for 60 seconds, thereby forming a top coat with a film thickness of 28 nm.

Thereafter, using an ArF exposure apparatus for immersion lithography (product name: NSR-S609B, manufactured by Nikon Corporation, NA (numerical aperture)=1.07, ⅔ annular illumination, reduction ratio: 1/4, immersion medium: water), the resist film having a top coat formed thereon was selectively irradiated with an ArF excimer laser (193 nm) through a mask pattern (6% half tone) which targeted a contact hole pattern with a target size (hole diameter (nm)/pitch (nm)) shown in Table 1.

Next, the top coat was removed using a protection-film removing solution (product name: TS-Rememover-S; manufactured by Tokyo Ohka Kogyo Co., Ltd.). Then, a post exposure bake (PEB) treatment was conducted at 90° C. for 60 seconds, followed by development for 30 seconds at 23° C. in a 2.38% by weight aqueous solution of tetramethylammonium hydroxide (TMAH) (product name: NMD-W; manufactured by Tokyo Ohka Kogyo Co., Ltd.). Then, the resist film was rinsed for 25 seconds with pure water, followed by drying by shaking.

As a result, in each example, a contact hole pattern was formed with the target size. The optimum exposure dose Eop (mJ/cm²) for formation of the above contact hole pattern, that is, sensitivity is shown in Table 1.

[Resolution and Sensitivity (2)]

An organic anti-reflection film composition (product name: "ARC29", manufactured by Brewer Science Ltd.) was applied onto an 8-inch silicon wafer using a spinner, and the composition was then baked at 205° C. for 60 seconds to be dried, thereby forming an organic anti-reflection film having a film thickness of 82 nm. Then, each of the positive resist composition solutions of Example 18 and Comparative Example 3 obtained above was applied onto the anti-reflection film using a spinner, and was then prebaked (PAB) on a hotplate at 90° C. for 60 seconds and dried, thereby forming a resist film having a film thickness of 120 nm.

Subsequently, the obtained resist film was selectively exposed by an ArF excimer laser (193 nm), using an ArF exposure apparatus "NSR-S302" (manufactured by Nikon; numerical aperture (NA)=0.60, ⅔ annual illumination) through a mask pattern (6% half tone).

Thereafter, a post exposure baking (PEB) treatment was conducted at 90° C. for 60 seconds, followed by a developing treatment for 30 seconds at 23° C. in a 2.38% by weight aqueous solution of tetramethylammonium hydroxide (TMAH) (product name: "NMD-3", manufactured by Tokyo Ohka Kogyo Co., Ltd.). Then, the resist film was rinsed with pure water for 30 seconds, and dried by shaking.

As a result, in each example, a resist pattern was formed in the resist film having a contact hole pattern in which holes with a hole diameter of 130 nm were positioned with equal spacing (pitch: 260 nm).

Here, an optimum exposure "Eop" (mJ/cm$^2$; sensitivity) for forming a contact hole pattern with a diameter of 130 nm and a pitch of 260 nm was determined. The results are shown in Table 1.

[Shape]

Each of the contact hole patterns formed was observed from above using a scanning electron microscope (SEM), and the circularity of the hole pattern was evaluated against the following criteria. The results are shown in Table 1.

A: the hole pattern had a high degree of circularity as a whole, and excellent shape.

B: the hole pattern had distortion partially, and the circularity was a little inferior.

C: the pattern collapsed.

From the results described above, it could be confirmed that the positive resist composition of the present invention had excellent lithography properties.

INDUSTRIAL APPLICABILITY

According to the present invention, there can be provided a novel polymeric compound which can be used as a base component of a positive resist composition, a positive resist composition containing the polymeric compound, and a method of forming a resist pattern using the positive resist composition. Therefore, the present invention is extremely useful industrially.

The invention claimed is:

1. A positive resist composition, comprising a base component (A) which exhibits increased solubility in an alkali developing solution under action of an acid, and an acid generator component (B) which generates an acid upon exposure, wherein the base component (A) comprises a polymeric compound (A1) containing a structural unit (a0) represented by the general formula (a0-1) shown below

[Chemical Formula 2]

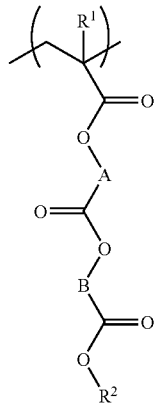

(a0-1)

(wherein, $R^1$ represents a hydrogen atom, an alkyl group of 1 to 5 carbon atoms or a halogenated alkyl group of 1 to 5 carbon atoms; A represents a bivalent hydrocarbon group which may contain a substituent group, or a bivalent group which contains a hetero atom; B represents a bivalent hydrocarbon group which may contain a substituent group, and a bivalent group which contains a hetero atom; and $R^2$ represents an acid dissociable, dissolution inhibiting group), wherein the acid generator component (B) comprises an onium salt having a following cation moiety represented by the following formula:

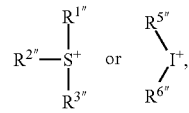

wherein $R^{1'''}$ to $R^{3'''}$, $R^{5'''}$ and $R^{6'''}$ each independently represents an aryl group or an alkyl group; two of $R^{1'''}$ to $R^{3'''}$ may mutually be bonded to form a ring together with the sulfur atom; at least one of $R^{1'''}$ to $R^{3'''}$ represents an aryl group; and at least one of $R^{5'''}$ and $R^{6'''}$ represents an aryl group, and an anion moiety represented by a compound selected from the group consisting of:

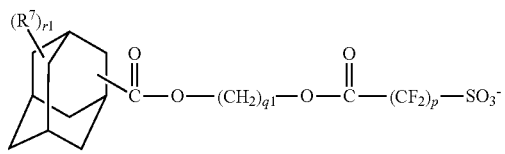

(b1)

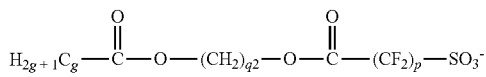

(b2)

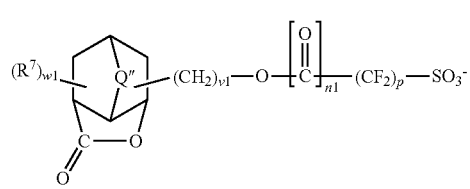

(b3)

-continued

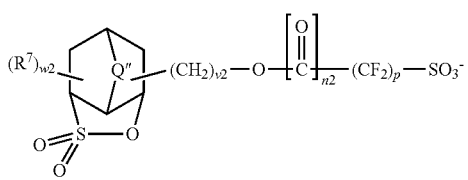
(b4)

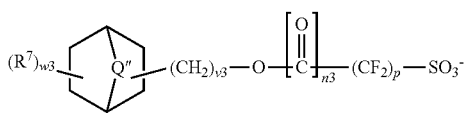
(b5)

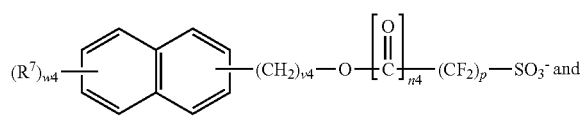
and (b6)

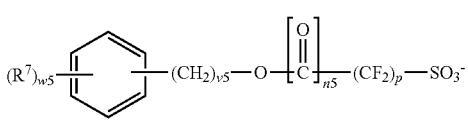
(b7)

wherein p represents an integer of 1 to 3; q1 and q2 each independently represents an integer of 1 to 5; $r^1$ represents an integer of 0 to 3; g represents an integer of 1 to 20; $R^7$ represents a substituent group; n1 to n5 each independently represents an integer of 0 or 1; v1 to v5 each independently represents an integer of 0 to 3; w1 to w5 each independently represents an integer of 0 to 3; and Q" represents an alkylene group of 1 to 5 carbon atoms, —O—, —S—, —O—$R^{94}$—, or —S—$R^{95}$—, wherein $R^{94}$ and $R^{95}$ each independently represents an alkylene group of 1 to 5 carbon atoms.

2. The positive resist composition according to claim 1, wherein the polymeric compound (A1) further comprises a structural unit (a2) derived from an acrylate ester which has a lactone-containing cyclic group.

3. The positive resist composition according to claim 2, wherein the polymeric compound (A1) further comprises a structural unit (a3) derived from an acrylate ester which has a polar group-containing aliphatic hydrocarbon group.

4. The positive resist composition according to claim 1, wherein the polymeric compound (A1) further comprises a structural unit (a3) derived from an acrylate ester which has a polar group-containing aliphatic hydrocarbon group.

5. The positive resist composition according to claim 1, further comprising a nitrogen-containing organic compound (D).

6. A method of forming a resist pattern, comprising: forming a resist film on a substrate using the positive resist composition described in any one of claims 1 to 5; exposing the resist film; and alkali-developing the resist film to form a resist pattern.

* * * * *

UNITED STATES PATENT AND TRADEMARK OFFICE
CERTIFICATE OF CORRECTION

PATENT NO. : 8,021,823 B2
APPLICATION NO. : 12/372964
DATED : September 20, 2011
INVENTOR(S) : Hiroaki Shimizu et al.

It is certified that error appears in the above-identified patent and that said Letters Patent is hereby corrected as shown below:

At Column 6, Line 62, Change "($R^{73}$)"," to --($R^{73}$)"--.

At Column 6, Line 65, Change "($R^{73}$)"," to --($R^{73}$)"--.

At Column 7, Line 15 (Approx.), Change "polycylic" to --polycyclic--.

At Column 10, Line 20, Change "N," to --n,--.

At Column 12, Line 43, Change "(a0-1-1-2)" to --(a0-1-2)--.

At Column 26, Line 1, Change "1 is" to --l is--.

At Column 26, Line 3, Change "2-norbonyl" to --2-norbornyl--.

At Column 26, Line 3, Change "3-norbonyl" to --3-norbornyl--.

At Column 65, Lines 38-39, Change "(a1-0-25)" to --(a1-3-25)--.

At Column 65, Lines 41 (Approx.), Change "(a1-0-01)" to --(a1-1-01)--.

At Column 65, Lines 44, (Approx.), Change "(a1-0-02)" to --(a1-1-02)--.

At Column 65, Line 45 (Approx.), Change "(a1-0-35)" to --(a1-1-35)--.

At Column 65, Line 46 (Approx.), Change "(a1-0-01)" to --(a1-3-01)--.

At Column 65, Line 48 (Approx.), Change "(a1-0-25)" to --(a1-3-25)--.

At Column 66, Line 39, Change "(a1-0-01)," to --(a1-1-01),--.

Signed and Sealed this
Third Day of April, 2012

David J. Kappos
*Director of the United States Patent and Trademark Office*

At Column 66, Line 43, Change "(a1-0-02)," to --(a1-1-02),--.

At Column 66, Line 48, Change "(a1-0-01)," to --(a1-1-01),--.

At Column 69, Line 54, Change "(1)" to --(I)--.

At Column 73, Lines 30-33, Delete "$Q^1$ is.......... — C(=O)—O—$R^{93}$—O—C(=O)—." and insert the same on Col. 73, Line 31 as a new Paragraph.

At Column 85, Line 60, Change "Hei 1'-035551," to --Hei1-035551,--.

At Column 87, Line 14, Change "thereof," to --thereof;--.

At Column 91, Line 14, Change "(I)" to --(1)--.

At Column 93, Line 20, After "conventionally" insert --.--.

At Column 100, Line 16, Change "(1)" to --(I)--.

At Column 101, Line 26, Change "(1V)" to --(IV)--.